(12) United States Patent
Deng et al.

(10) Patent No.: US 12,379,657 B2
(45) Date of Patent: Aug. 5, 2025

(54) HIGHLY SEQUENCED COPOLYMER FOR DUAL-TONE PHOTORESISTS, RESIST COMPOSITION AND PATTERNING PROCESS THEREOF

(71) Applicant: Canton Litho Material Technology Inc., Guangzhou (CN)

(72) Inventors: Hai Deng, Guangzhou (CN); Min Cao, Guangzhou (CN)

(73) Assignee: CANTON LITHO MATERIAL TECHNOLOGY INC., Guangzhou (CN)

( * ) Notice: Subject to any disclaimer, the term of this patent is extended or adjusted under 35 U.S.C. 154(b) by 657 days.

(21) Appl. No.: 17/589,124

(22) Filed: Jan. 31, 2022

(65) Prior Publication Data
US 2022/0252981 A1  Aug. 11, 2022

(30) Foreign Application Priority Data
Jan. 29, 2021 (CN) .......................... 202110130429.2

(51) Int. Cl.
| | |
|---|---|
| G03F 7/038 | (2006.01) |
| C08F 20/18 | (2006.01) |
| C08F 30/08 | (2006.01) |
| G03F 7/004 | (2006.01) |
| G03F 7/039 | (2006.01) |
| G03F 7/075 | (2006.01) |

(52) U.S. Cl.
CPC .............. *G03F 7/038* (2013.01); *C08F 20/18* (2013.01); *C08F 30/08* (2013.01); *G03F 7/004* (2013.01); *G03F 7/0045* (2013.01); *G03F 7/0388* (2013.01); *G03F 7/0392* (2013.01); *G03F 7/0397* (2013.01); *G03F 7/0758* (2013.01)

(58) Field of Classification Search
None
See application file for complete search history.

(56) References Cited

U.S. PATENT DOCUMENTS

| | | | |
|---|---|---|---|
| 2005/0074690 A1* | 4/2005 | Liu ....................... | G03F 7/0397 |
| | | | 430/270.1 |
| 2016/0187782 A1* | 6/2016 | Hustad ................... | G03F 7/405 |
| | | | 438/703 |
| 2017/0176856 A1* | 6/2017 | Chen ...................... | G03F 7/0048 |

FOREIGN PATENT DOCUMENTS

| | | | |
|---|---|---|---|
| CN | 109929070 A | * | 6/2019 |
| CN | 110283271 A | | 9/2019 |
| CN | 110554565 A | * | 12/2019 |

OTHER PUBLICATIONS

Terashima et al., Polymeric pseudo-crown ether for cation recognition via cation template-assisted cyclopolymerization, (2013), Nature Communications, 4, 2321, pp. 1-8 (Year: 2013).*

(Continued)

*Primary Examiner* — Mark F. Huff
*Assistant Examiner* — Kevin J Drummey
(74) *Attorney, Agent, or Firm* — Panitch Schwarze Belisario & Nadel LLP

(57) ABSTRACT

A resin including a highly sequenced copolymer is presented, and the preparation and application of its resist composition is presented. The resist has excellent performance and can promote the development of integrated circuits.

20 Claims, 16 Drawing Sheets

(56) References Cited

OTHER PUBLICATIONS

English Translation of CN109929070A (Year: 2013).*
English Translation of CN110554565A (Year: 2018).*
English Translation of CN110554565A (Year: 2019).*
Terashima et al. Nature Communications 2013.*
Office Action and Search Report issued Nov. 19, 2024 in CN Application No. 202110130429.

* cited by examiner

HIGHLY SEQUENCED COPOLYMER FOR DUAL-TONE PHOTORESISTS, RESIST COMPOSITION AND PATTERNING PROCESS THEREOF

CROSS-REFERENCE TO RELATED APPLICATIONS

This application claims priority under 35 U.S.C. § 119 (b) to Chinese Application No. 2021101304292, filed on Jan. 29, 2021, the disclosures of which are incorporated herein by reference in their entireties.

TECHNICAL FIELD

This invention relates to a resist composition and a resist pattern forming process, and more particularly to a dual-tone resist composition comprising a highly sequenced copolymer containing precisely arranged photoreaction sites. Dual-tone resist refers to chemically amplified resist (positive-tone) and easily strippable cross-linked resist (negative tone). The dual-tone resist composition is sensitive to high-energy radiation such as UV, deep UV, EUV, X-ray, γ-ray, synchrotron radiation and e-beam, and especially suited for use in the exposure step of irradiating high-energy radiation, typically deep-UV, EUV or e-beam to form high-contrast patterns.

BACKGROUND

Integrated circuit (IC) is one of the most critical technologies in the information age. From daily life to industrial production, all electronic computing devices are dependent on chips. Thanks to the increasingly powerful chips, personal computers could integrate more and more powerful functions and mobile phones could enter the era of 3G and 4G. Photolithography is the key technology in the manufacture of integrated circuits. The continuous improvement of chip function is inseparable from the development of lithography materials and technology.

Photoresist can be divided into positive-tone and negative-tone according to the change of solubility before and after exposure. Lithography is the process of transferring patterns on a mask to substrate via photochemical reaction in photoresist. Photoresist is the most critical material in the lithography process. The incident light passes through the mask, so that the pattern on the mask is projected onto the photoresist film coated on the substrate, which stimulates the photochemical reaction, and forms the expected patterns after baking and development. The lithographic pattern then acts as a barrier layer to selectively block subsequent etch or implantation, etc.

Conventional positive-tone chemically amplified photoresist resins contain a variety of protected carboxyl groups or other acidic groups (also known as photo-acid sensitive groups) on the main chain, and the photo-acid generator (PAG) produces acid ($H^+$) under radiation to make these protected structure acidolysis, and the acid groups such as carboxyl group were exposed, so that the resin can be dissolved in an alkaline environment while the unexposed area is remained on the substrate to form pattern. The cross-linked negative-tone photoresist resin is completely the opposite. Under the radiation, the exposed photoresist resin will become cross-linked, then its solubility will decrease and will be insoluble in the developer. After development, the exposed region will be remained on the substrate to form patterns.

The technical parameters of photoresist mainly include sensitivity, resolution, contrast and etching resistance, etc. Traditionally, in order to obtain high-sensitive and high-contrast positive-tone photoresists, various photo-acid sensitive monomers are introduced into the resin backbone to ensure the complete dissolution of the resin in the exposed region, but the distribution of these photo-acid sensitive monomers is unknown.

This means that the distribution of photo-acid sensitive monomers on the backbone of polymerization cannot be precisely controlled, in other words, the photoreaction sites are uncertain and chaotic. Thus, the reliability of the photoresist and the stability of the final lithographic patterns cannot be guaranteed. In addition, although compared with positive-tone photoresist, negative-tone photoresists have the advantages of low outgassing, intrinsic diffusion control and improved pattern collapse performance due to higher modulus of cross-linked network, they also suffer the problem of difficult to strip.

Therefore, the sequence distribution of monomer units in photoresist resins has a profound influence on their final properties. The precise incorporation and fixed-point distribution of photoreaction sites (protected acid groups/cross-linked sites) will improve the sensitivity and stability, and reduce the line width roughness of the photoresist. In addition, rapid and complete stripping of negative-tone photoresist can be achieved if the cross-linked chemical bonds are easily broken under certain conditions. In addition, in the lithography process, the etching resistance of the photoresist is also very important, and will directly affect the subsequent selective etching and pattern transfer process. The etching resistance can usually be improved by introducing metal-containing, silicon-containing, or high-carbon density groups into the photoresist resins.

SUMMARY OF THE INVENTION

This invention is intended for providing a kind of dual-tone photoresist comprising a highly sequenced copolymer with precisely arranged photoreaction sites, and its preparation and application methods. The highly sensitive dual-tone resist composition could be applied to deep-UV (KrF and ArF), EUV or e-beam to form high-contrast patterns.

In the first aspect of the invention, it provides an ordered photolithographic resin, wherein the photolithographic resin is a copolymer comprising structure 1 and structure 2,

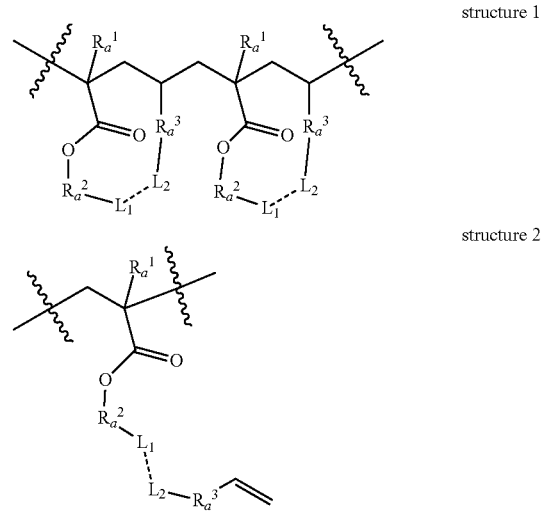

structure 1 structure 2 wherein, the number of structure 1 is m, m is selected from the group consisting of 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5 and 20;

1) the copolymer has a molecular weight of 3000-50000, preferably 8000-30000, more preferably 11000-20000;
2) the copolymer has a PDI of 1.1-4, preferably 1.2-2, more preferably 1.3-1.6.

In another preferred embodiment, the copolymer has the following repeating structural units:

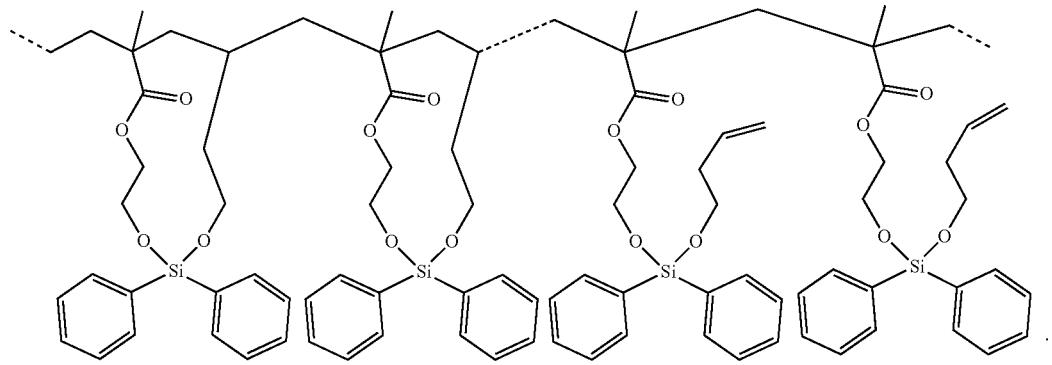

the number of structure 2 is n, n is an integer selected from 1 to 20;

each $R_a^1$ is independently selected from the group consisting of H, C1-C6 alkyl and halogenated C1-C6 alkyl;

each $R_a^2$ is independently selected from the group consisting of C1-C6 alkylene and C3-C8 cycloalkylene;

each $R_a^3$ is independently selected from the group consisting of C1-C6 alkylene;

each $L_1$—$L_2$ is independently selected from the group consisting of

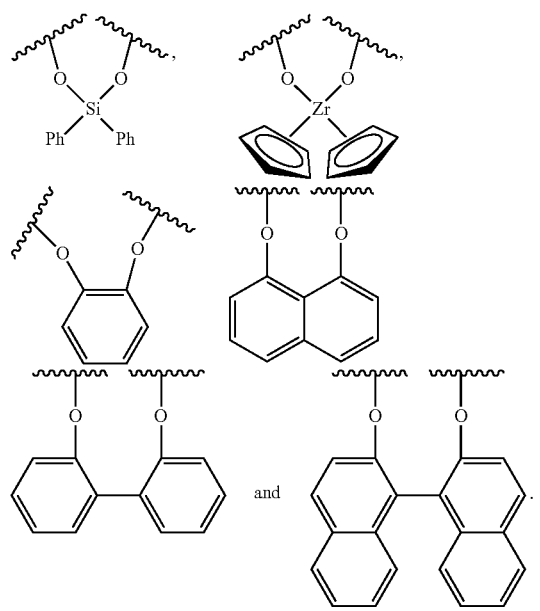

and

In another preferred embodiment, m:n is 0.5-1.5, preferably 0.9-1.1, more preferably 1.

In another preferred embodiment, m=n.

In another preferred embodiment, the copolymer has one or more features selected from the group consisting of:

In another preferred embodiment, the copolymer is consisting of structure 1 and structure 2.

In another preferred embodiment, the copolymer has a structure shown in formula C1:

-(structure 1)$_{m1}$-(structure 2)$_{n1}$-(structure 1)$_{m2}$-(structure 2)$_{n2}$-   formula C1

$m=m1+m2$;

$n=n1+n2$;

m1 is selected from the group consisting of 0, 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5, and 20;

m2 is selected from the group consisting of 0, 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5, and 20;

n1 is an integer selected from 0-20;

n2 is an integer selected from 0-20.

In another preferred embodiment, each $R_a^1$ is independently selected from the group consisting of H and C1-C3 alkyl;

each $R_a^2$ is independently selected from the group consisting of C1-C3 alkylene;

each $R_a^1$ is independently selected from the group consisting of —(C1-C3 alkylene)-;

each $L_1$—$L_2$ is independently selected from the group consisting of

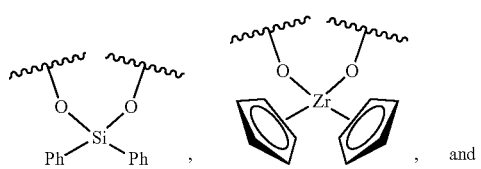

and

-continued

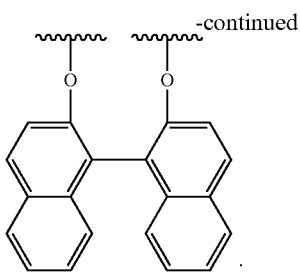

In another preferred embodiment, L₁—L₂ is

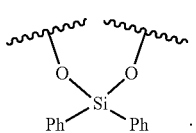

In the second aspect of the invention, it provides an ordered photolithographic resin, wherein the photolithographic resin is a copolymer comprising structure 1, structure 2 and structure 3,

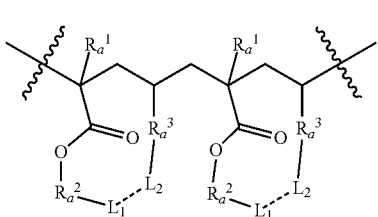
structure 1

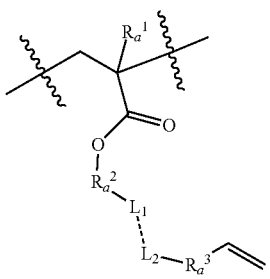
structure 2

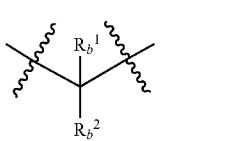
structure 3 wherein,
the number of structure 1 is m, m is selected from the group consisting of 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5 and 20;
the number of structure 2 is p, p is an integer selected from 0 to 30;
the number of structure 3 is x, x is an integer selected from 1 to 30;
$R_a^1$ and $R_b^1$ are each independently selected from the group consisting of H, C1-C6 alkyl, and halogenated C1-C6 alkyl;
each $R_a^2$ is independently selected from the group consisting of C1-C6 alkylene and C3-C8 cycloalkylene;
each $R_a^3$ is independently selected from the group consisting of C1-C6 alkylene, —(C1-C6 alkylene)-O—, and —(C1-C6 alkylene)-O—(C=O)—;
each $R_b^2$ is independently selected from the group consisting of

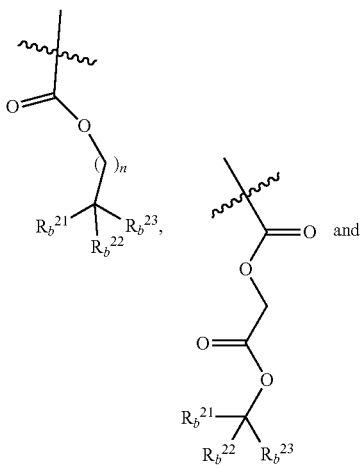

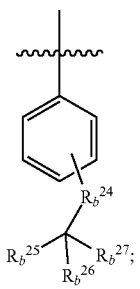

$R_b^{21}$, $R_b^{22}$, and $R_b^{23}$ are each independently selected from the group consisting of none, H, C1-C6 alkyl, adamantyl, OH-substituted adamantyl, and C3-C8 cycloalkyl, or $R_b^{21}$, $R_b^{22}$, and $R_b^{23}$ together form a structure selected from the group consisting of

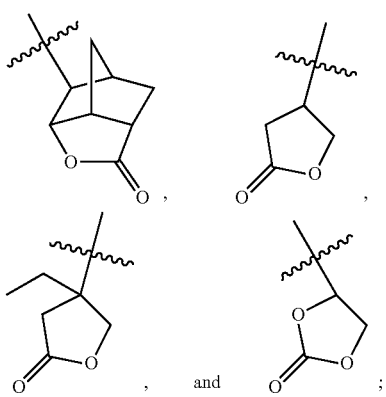

n is 0, 1, 2, 3, 4 or 5;
$R_b^{24}$ is selected from the group consisting of —O— and —(C=O)—;
$R_b^{25}$, $R_b^{26}$, and $R_b^{27}$ are each independently selected from the group consisting of none, hydrogen, =O, C1-C6 alkyl, C1-C6 alkoxy, —(C═O)—O—C(C1-C6 alkyl)$_2$-adamantyl, —O—(C3-C8 cycloalkyl), —O—(C1-C6 alkylene)-(C6-C10 aryl), C6-C10 aryl, and —O—(C1-C6 alkylene)-O—(C═O)—(C6-C10 aryl);

each $L_1$—$L_2$ is independently selected from the group consisting of

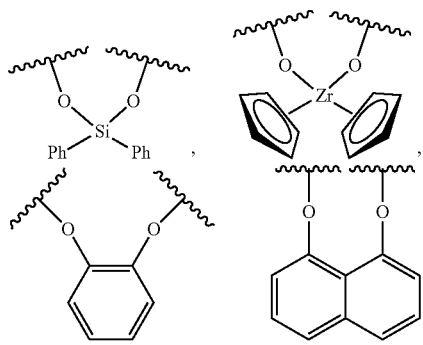

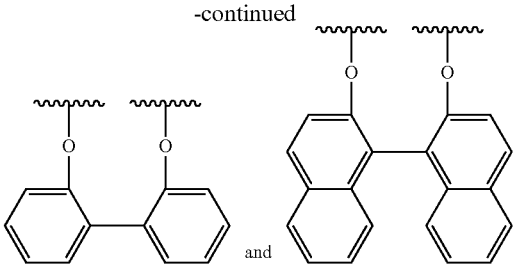

In another preferred embodiment, the copolymer has one or more features selected from the group consisting of:
1) the copolymer has a molecular weight of 5000-50000, preferably 7500-30000, more preferably 9000-12000;
2) the copolymer has a PDI of 1.1-5, preferably 1.3-2, more preferably 1.4-1.7;
3) the molar percentage of the structure 3 is 10-50%, preferably 15-40%, and more preferably 18-35%.

In another preferred embodiment, the copolymer has a repeating unit selected from the group consisting of:

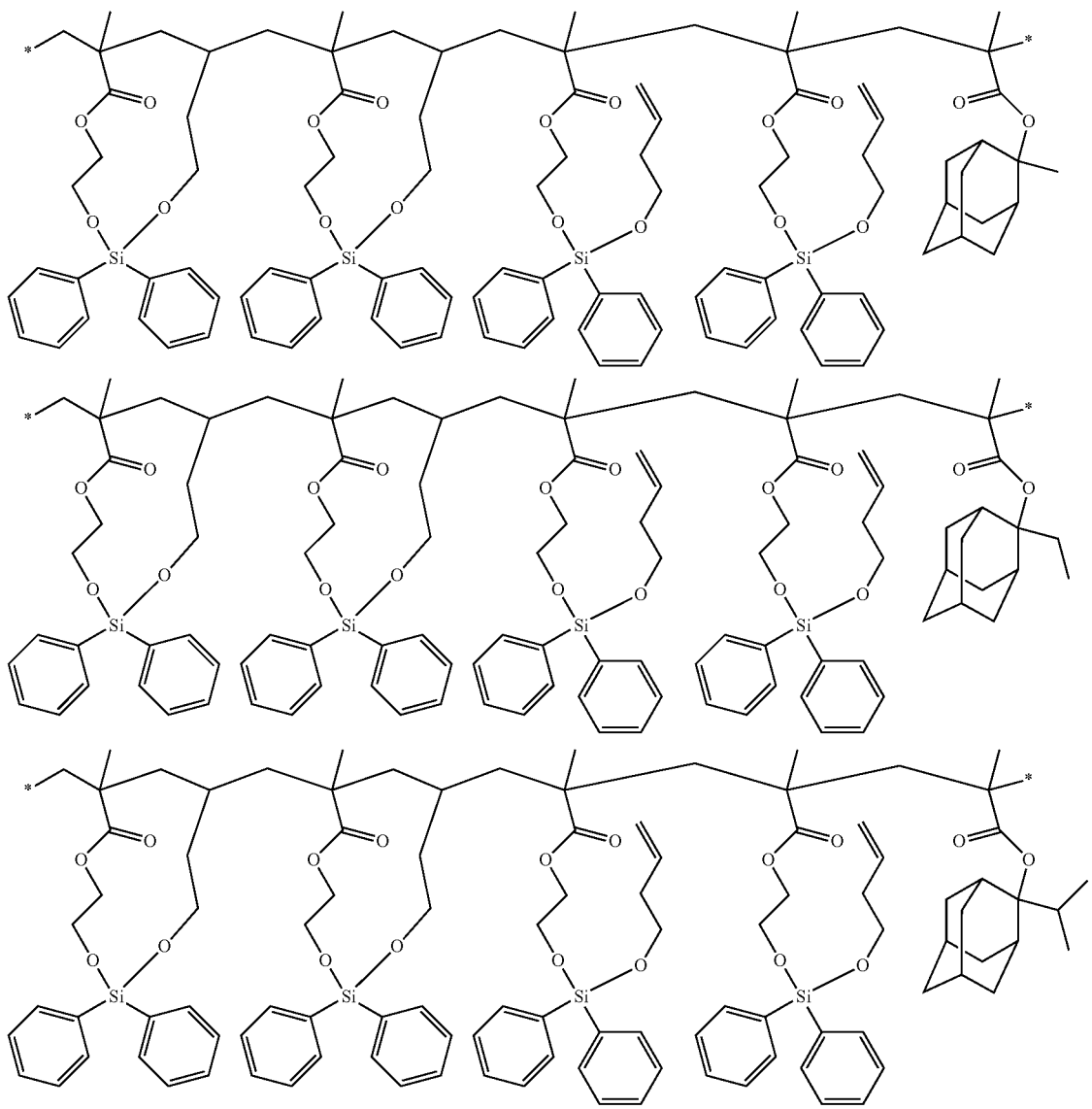

9
10
-continued
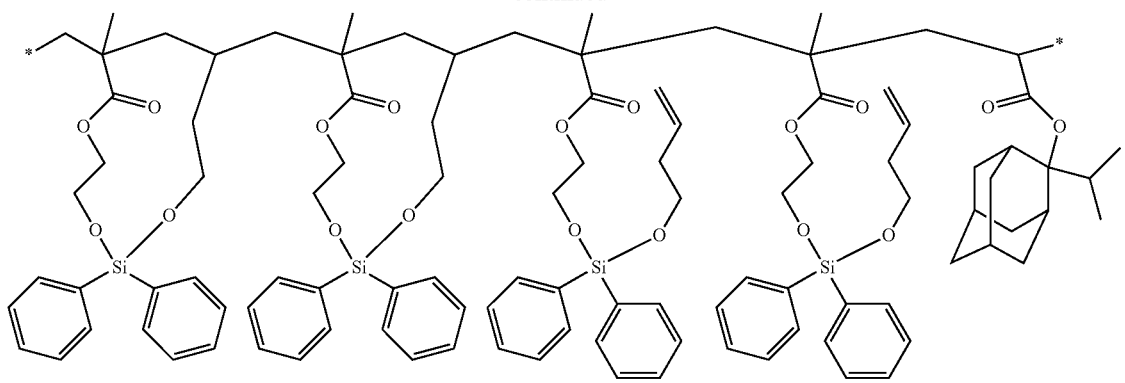
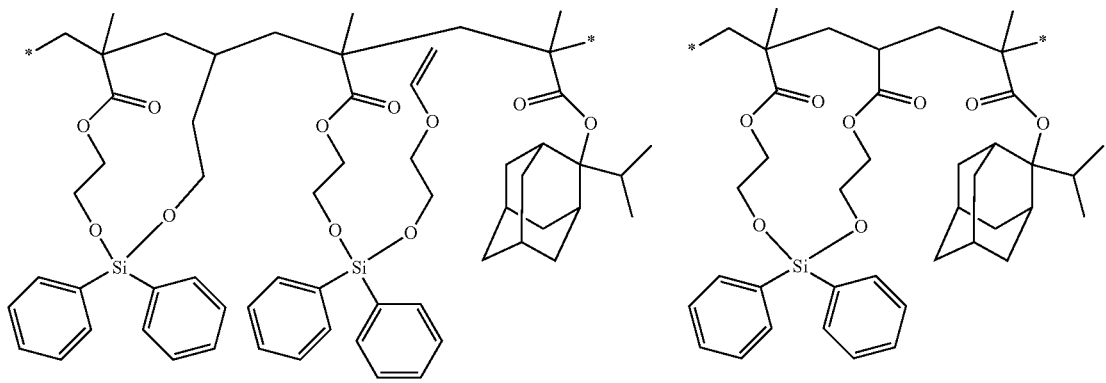
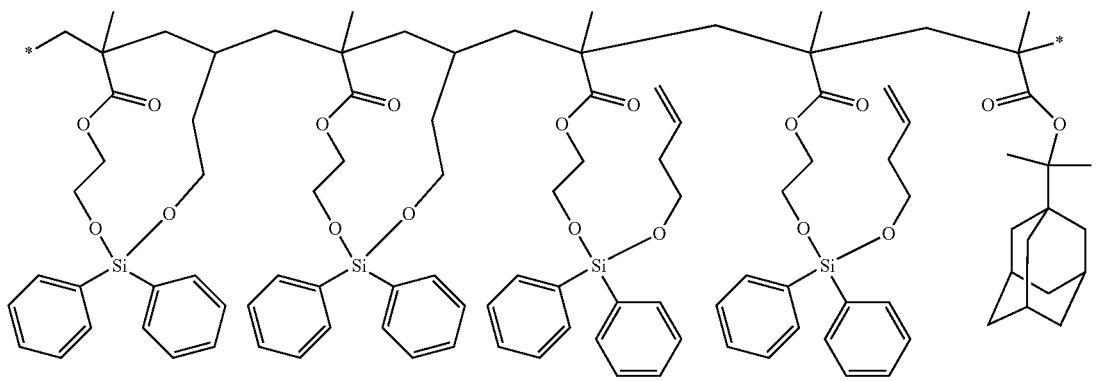
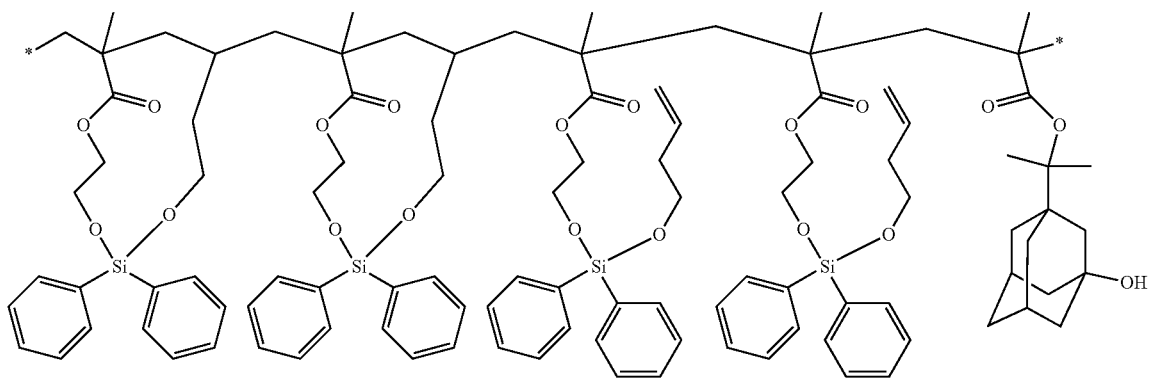

-continued
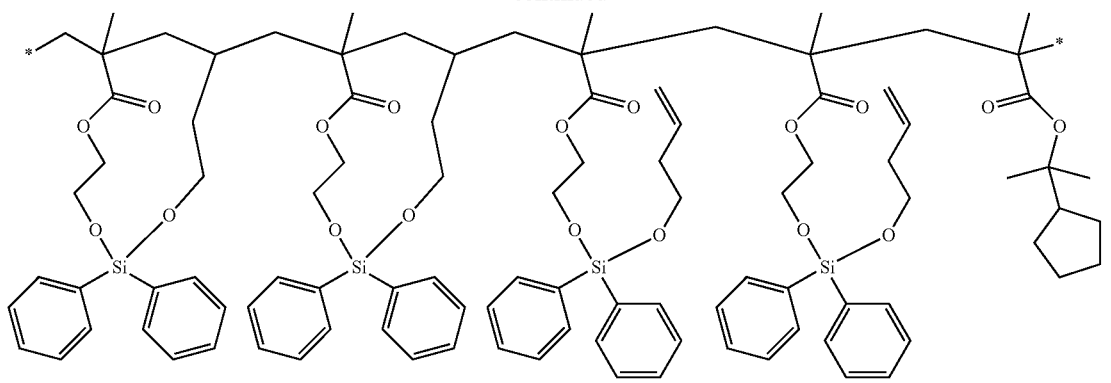
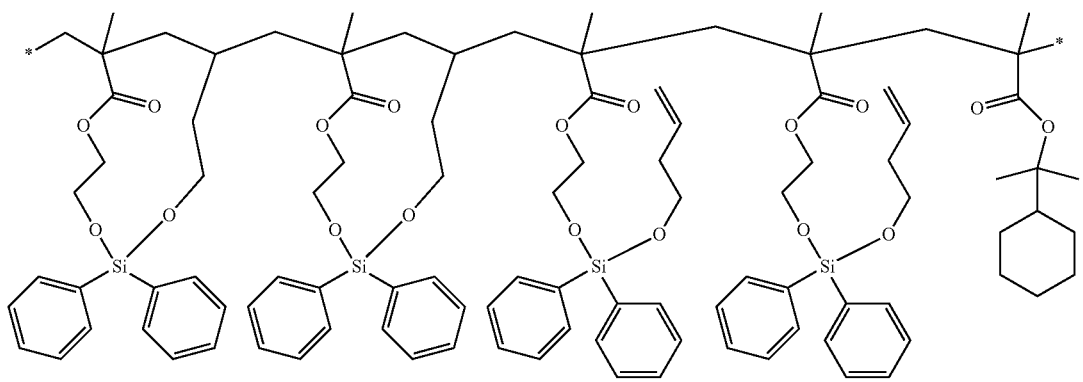
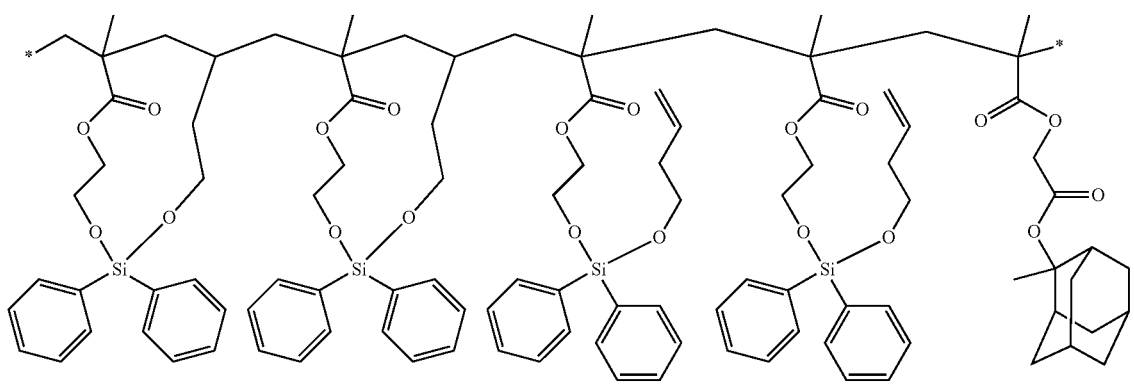
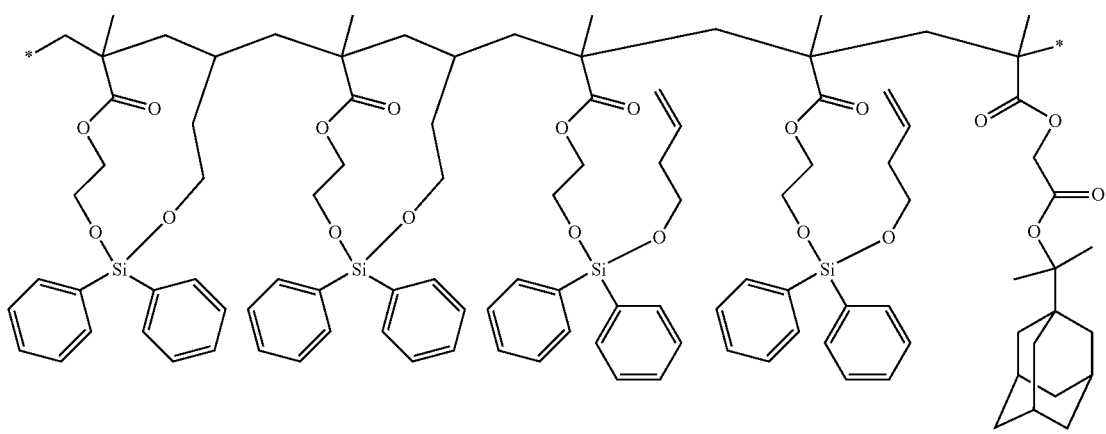

-continued
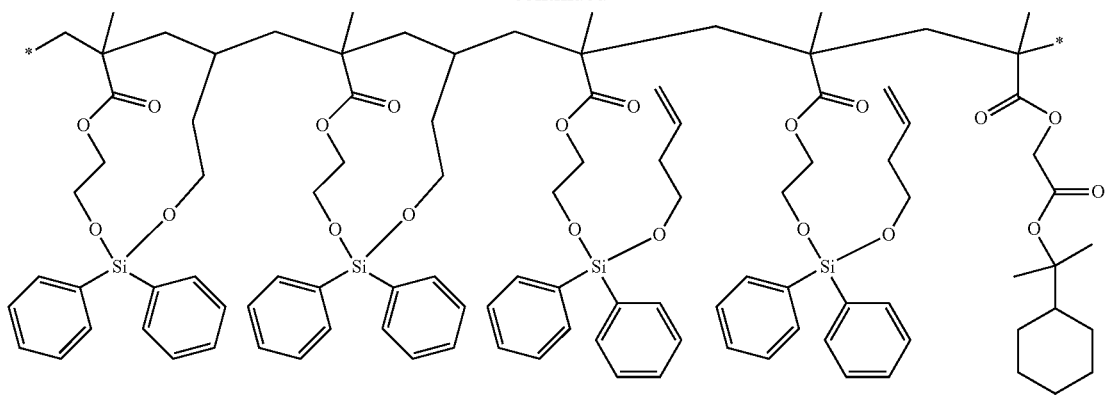
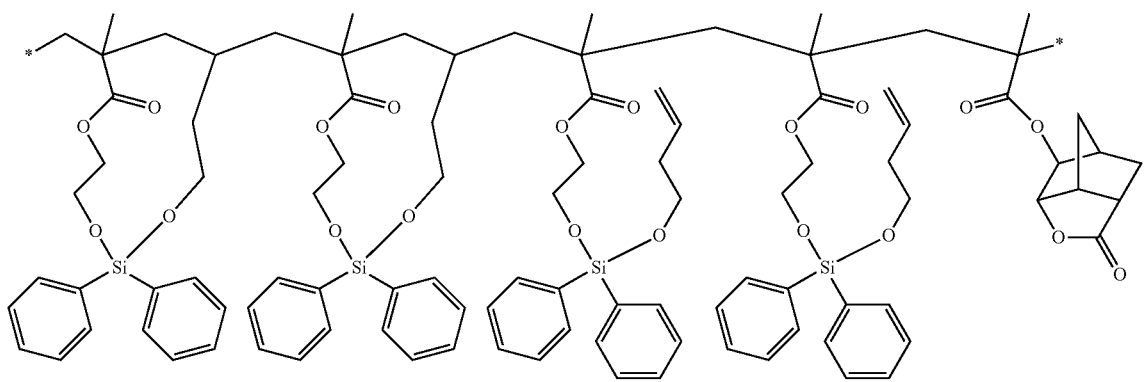
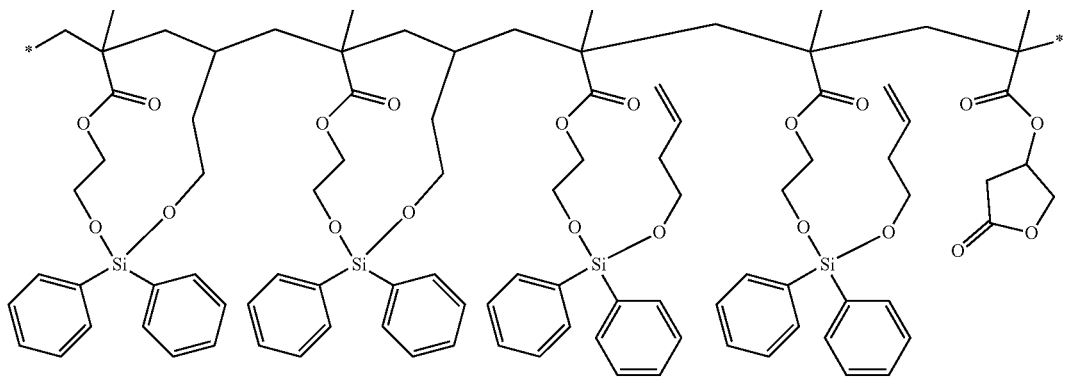
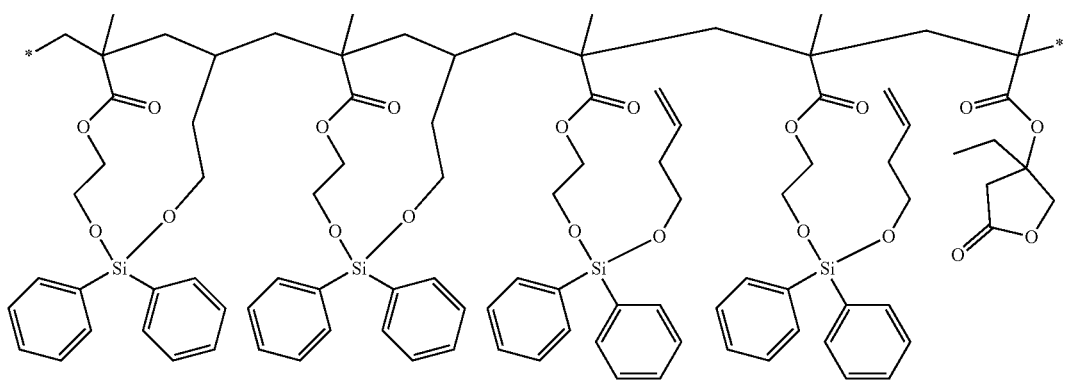

15
-continued
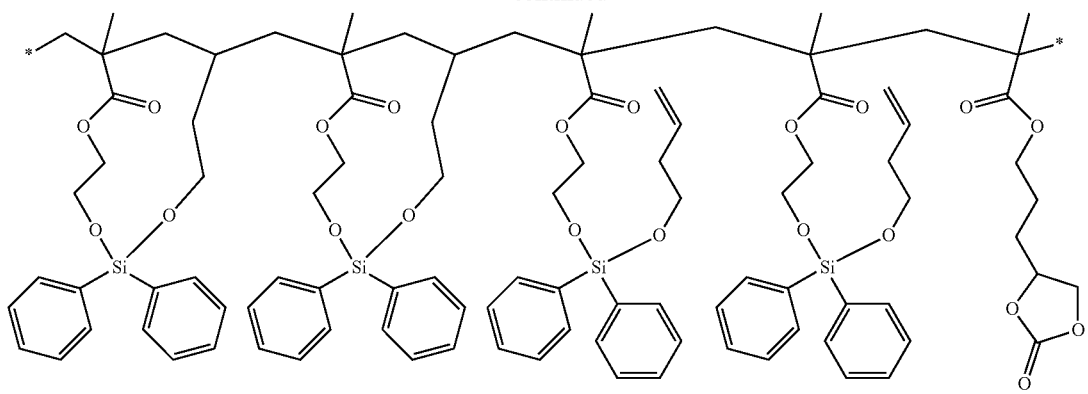
16
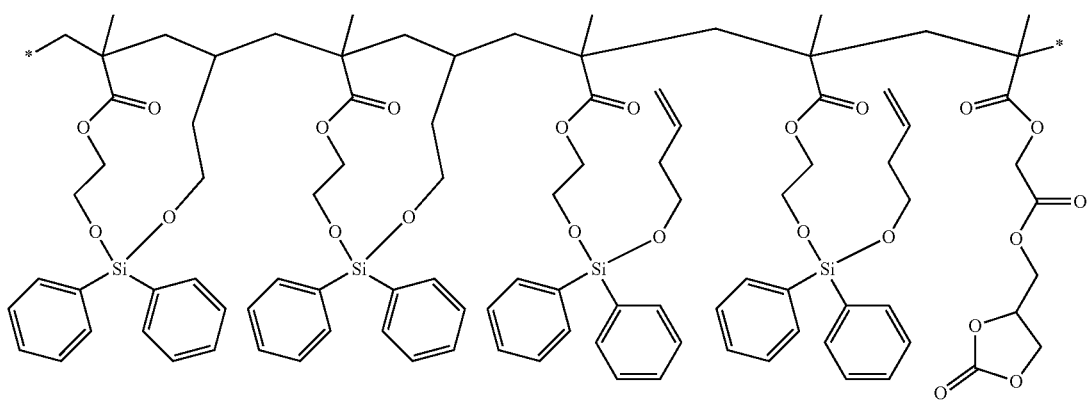
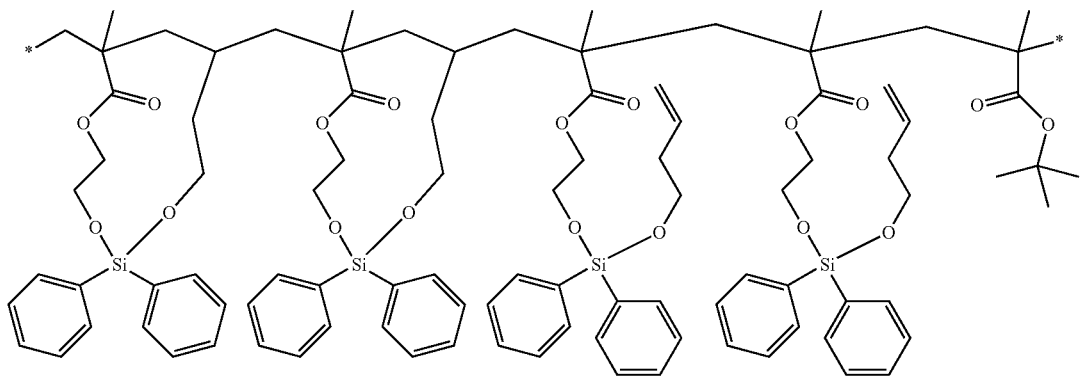
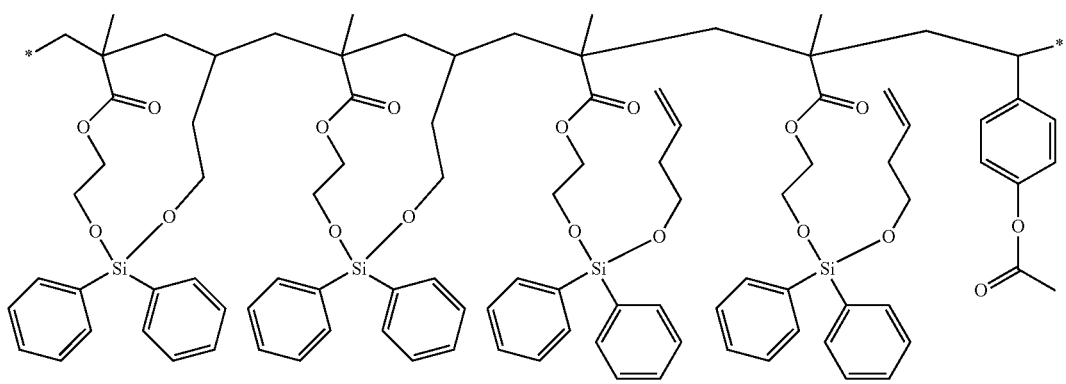

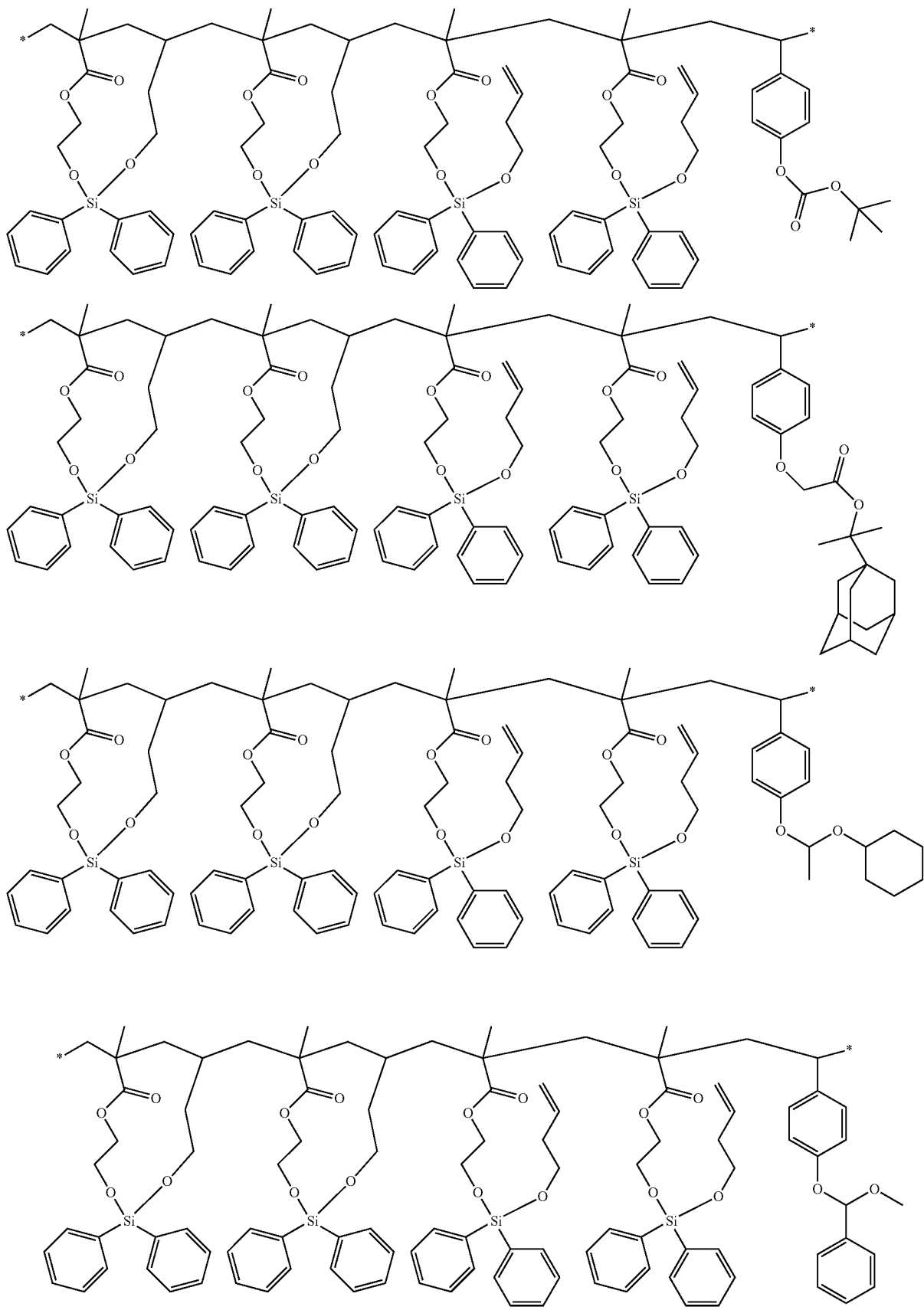

-continued

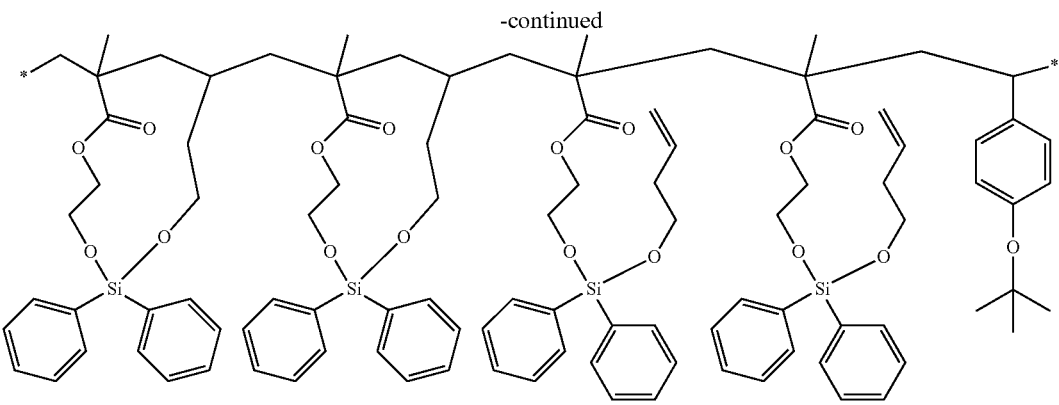

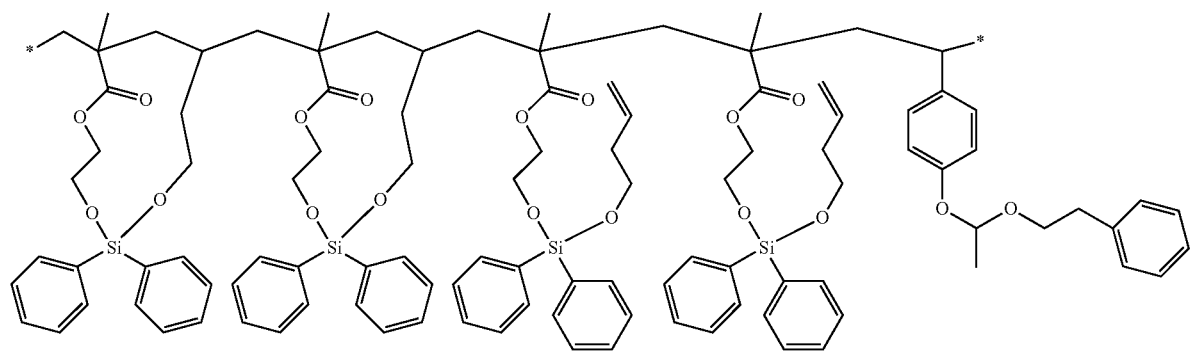

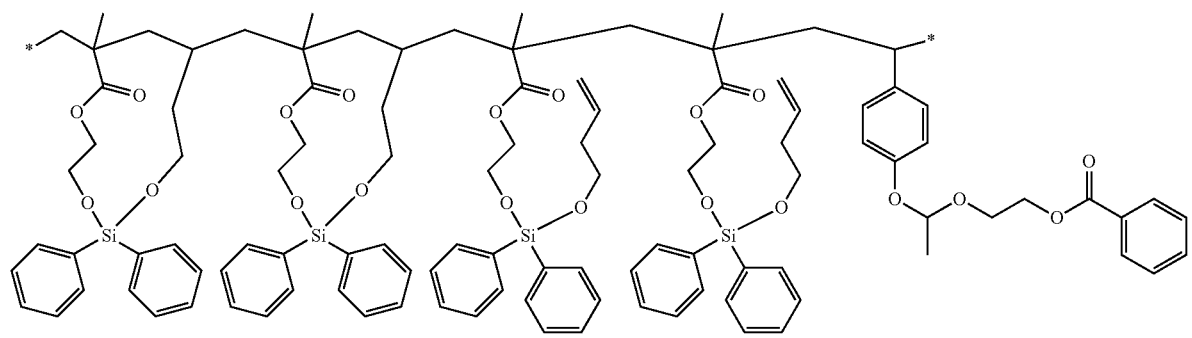

In another preferred embodiment, the photolithographic resin is consisting of structure 1, structure 2 and structure 3.

In another preferred embodiment, the photolithographic resin has a structure shown in formula C2:

-(structure 1)$_m$-(structure 2)$_{p1}$-(structure 3)$_x$-(structure 2)$_{p2}$-  formula C2

$p = p1 + p2$;

p1 and p2 are integers independently selected from 0-20.

In another preferred embodiment, for the structure shown in formula C2, m:p is 2-25:10-98, preferably 3-20:12-95, more preferably 4-20:15-90.

In another preferred embodiment, the photolithographic resin has a structure shown in formula C4:

-(structure 1)$_m$-(structure 2)$_p$-(structure 3)$_x$-  formula C4.

In another preferred embodiment, for the structure shown in formula C4, m:p is 30-80:20-70, preferably 40-75:25-60, more preferably 50-70:30-50.

In another preferred embodiment, the photolithographic resin has the following structural units:

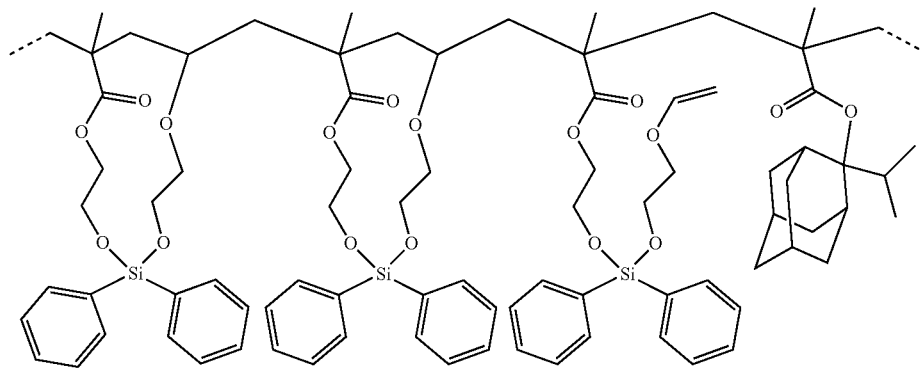

In another preferred embodiment, the photolithographic resin has a structure shown in formula C5:

-(structure 1)$_m$-(structure 3)$_x$-     formula C5.

In another preferred embodiment, for the structure shown in formula C5, m:p is 90-100:0-10, preferably 95-100:0-5, more preferably 98-100:0-2.

In another preferred embodiment, the photolithographic resin has the following structural units:

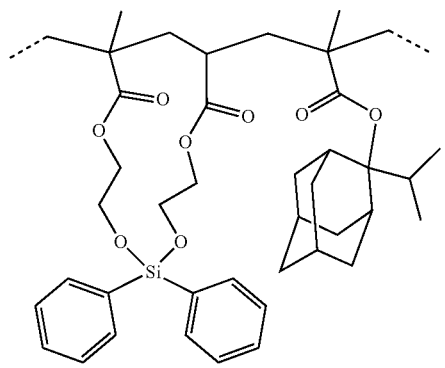

In another preferred embodiment, $R_a^1$ and $R_b^1$ are each independently selected from the group consisting of H and C1-C3 alkyl;
   each $R_a^2$ is independently selected from the group consisting of C1-C3 alkylene;
   each $R_a^1$ is independently selected from the group consisting of —(C1-C3 alkylene)-;
   each $R_b^2$ is independently selected from the group consisting of

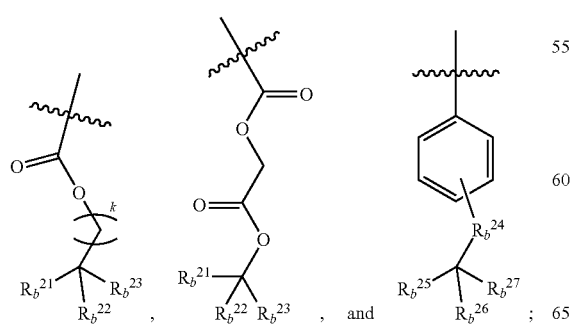

$R_b^{21}$, $R_b^{22}$, and $R_b^{23}$ are each independently selected from the group consisting of none, H, C1-C3 alkyl, adamantyl, OH-substituted adamantyl, and C3-C6 cycloalkyl;
   or $R_b^{21}$, $R_b^{22}$, and $R_b^{23}$ together form a structure selected from the group consisting of

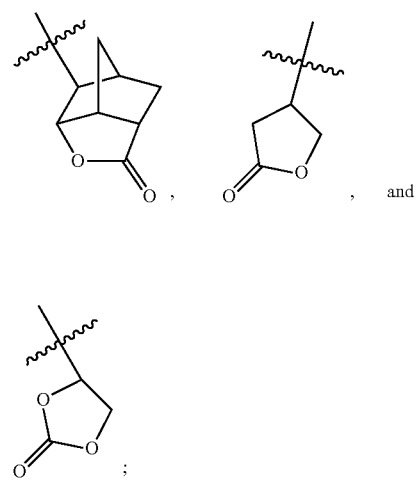

k is 0, 1 or 2;
$R_b^{24}$ is —O—;
$R_b^{25}$, $R_b^{26}$, and $R_b^{27}$ are each independently selected from the group consisting of none, hydrogen, =O, C1-C4 alkyl, C1-C3 alkoxy, —(C=O)—O—C(C1-C3 alkyl)$_2$-adamantyl, —O—(C3-C6 cycloalkyl), —O—(C1-C3 alkylene)-phenyl, phenyl, and —O—(C1-C3 alkylene)-O—(C=O)-phenyl;
each $L_1$—$L_2$ is independently selected from the group consisting of

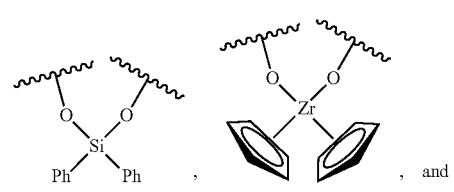

-continued

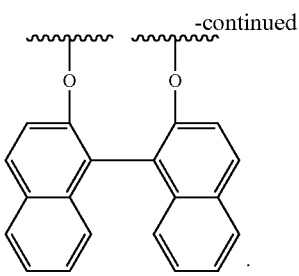

In another preferred embodiment, L₁—L₂ is

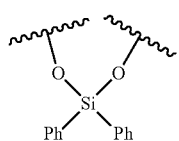

In the third aspect of the invention, it provides an ordered photolithographic resin, wherein the photolithographic resin is a copolymer comprising structure 1, structure 2, structure 3 and structure 4,

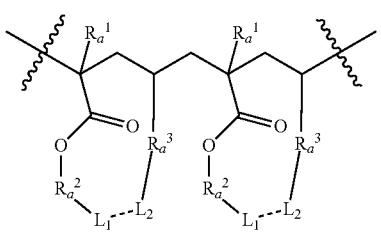
structure 1

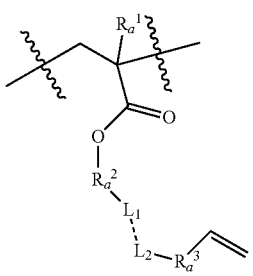
structure 2 structure 3

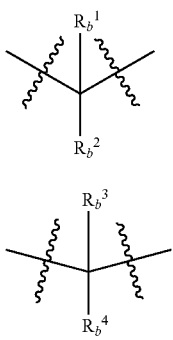
structure 4 wherein,
the number of structure 1 is m, m is selected from the group consisting of 0.5, 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5, and 20;

the number of structure 2 is p, p is an integer selected from 0 to 20;

the number of structure 3 is x, x is an integer selected from 1 to 15;

the number of structure 4 is y, y is an integer selected from 1 to 15;

$R_a^1$, $R_b^1$ and $R_b^3$ are each independently selected from the group consisting of H, C1-C6 alkyl, and halogenated C1-C6 alkyl;

each $R_a^2$ is independently selected from the group consisting of C1-C6 alkylene and C3-C8 cycloalkylene;

each $R_a^3$ is independently selected from the group consisting of C1-C6 alkylene;

each $R_b^3$ is independently selected from the group consisting of

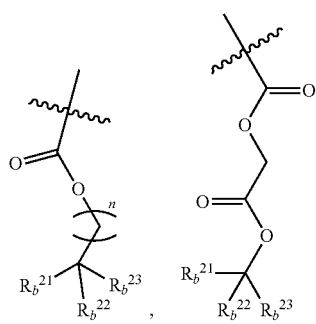

$R_b^{21}$, $R_b^{22}$, and $R_b^{23}$ are each independently selected from the group consisting of none, H, C1-C6 alkyl, adamantyl, OH-substituted adamantyl, and C3-C8 cycloalkyl, or $R_b^{21}$, $R_b^{22}$ and $R_b^{23}$ together form a structure selected from the group consisting of

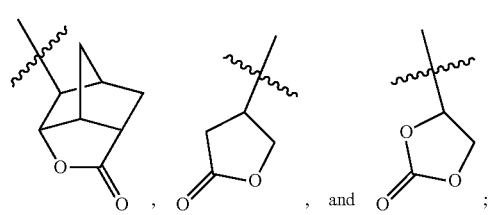 [SMILES: *C1C2CC3C(=O)OC1C3C2 ; *C1COC(=O)C1 ; *C1COC(=O)O1]

n is 0, 1, 2, 3, 4 or 5;

$R_b^{24}$ is selected from the group consisting of —O— and —(C=O)—;

$R_b^{25}$, $R_b^{26}$, and $R_b^{27}$ are each independently selected from the group consisting of none, hydrogen, =O, C1-C6 alkyl, C1-C6 alkoxy, —(C=O)—O—C(C1-C6 alkyl)₂-adamantyl, —O—(C3-C8 cycloalkyl), —O—(C1-C6 alkylene)-(C6-C10 aryl), C6-C10 aryl, and —O—(C1-C6 alkylene)-O—(C=O)—(C6-C10 aryl);

$R_b^4$ is a combination of anions and cations, where the anion is selected from the group consisting of

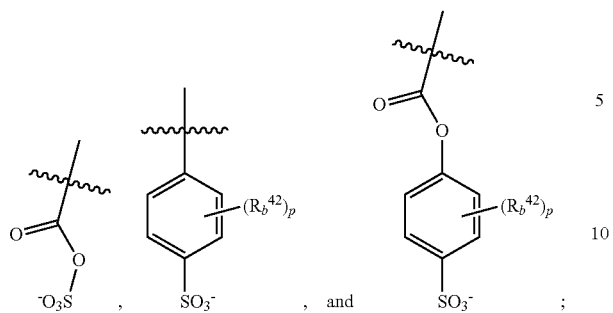

$R_b^{41}$ and $R_b^{42}$ are each independently selected from the group consisting of hydrogen, halogenated or unsubstituted C1-C15 straight-chain or branched-chain alkyl, substituted or unsubstituted C1-C15 straight-chain or branched-chain alkoxy; the substituted means being substituted by a substitutent selected from the group consisting of halogen, hydroxyl, carbonyl, amino, amide, ether bonded oxygen atom, and lactone structure; p is an integer from 0 to 5;

the cation is selected from the group consisting of iodonium salts (B1) and sulfonium salts (B2) shown as follows:

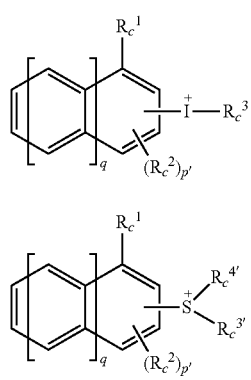

in formulas (B1) and (B2), $R_c^1$, $R_c^2$, $R_c^3$, $R_c^{1'}$, $R_c^{2'}$, $R_c^{3'}$, and $R_c^{4'}$ are each independently represent substituents;

$R_c^1$ and $R_c^{1'}$ are selected from the group consisting of hydrogen, halogen, unsubstituted or hydroxyl or halogen substituted $C_1$-$C_{10}$ straight-chain or branched-chain alkyl, unsubstituted or hydroxyl or halogen substituted $C_1$-$C_{10}$ straight-chain or branched-chain alkoxy, unsubstituted or hydroxyl or halogen substituted $C_1$-$C_{10}$ straight-chain or branched-chain alkoxy carbonyl; the halogen is selected from the group consisting of fluorine, chlorine, bromine and iodine;

$R_c^2$ and $R_c^{2'}$ are selected from the group consisting of hydrogen, halogenated or unsubstituted $C_1$-$C_{15}$ straight-chain or branched-chain alkyl, substituted or unsubstituted $C_1$-$C_{15}$ straight-chain or branched-chain alkoxy; the substituted means being substituted by a substitutent selected from the group consisting of halogen, hydroxyl, carbonyl, amino, amide, ether bonded oxygen atom, and lactone structure;

$R_c^3$, $R_c^{3'}$, and $R_c^{4'}$ are selected from the group consisting of substituted or unsubstituted $C_1$-$C_{11}$ straight-chain or branched-chain alkyl, substituted or unsubstituted phenyl, and substituted or unsubstituted naphthyl; the substituted means being substituted by a substitutent selected from the group consisting of halogen, hydroxyl, carbonyl, amino, amide, and lactone structure; $R_c^{3'}$ and $R_c^{4'}$ are optionally combined to form a divalent group;

q is 0, 1, 2 or 3;

p' is 0, 1, 2, 3, 4 or 5;

each $L_1$—$L_2$ is independently selected from the group consisting of

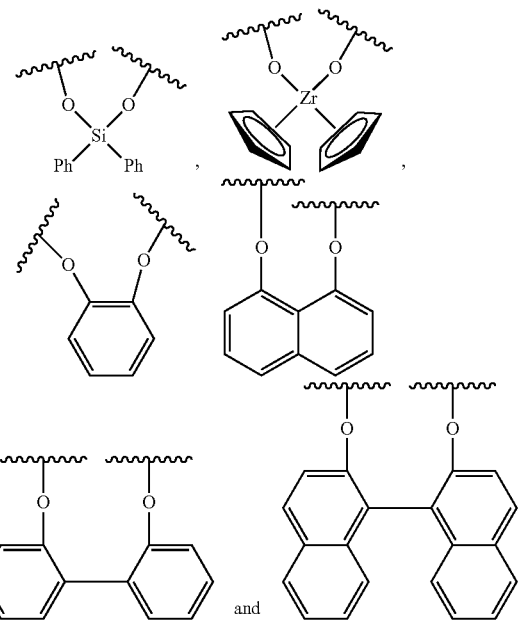

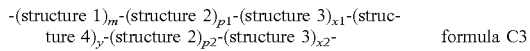

In another preferred embodiment, the copolymer has one or more features selected from the group consisting of:

1) the copolymer has a molecular weight of 2000-10000, preferably 2500-7000, more preferably 3000-5000;
2) the copolymer has a PDI of 1.1-2.5, preferably 1.3-2.2, more preferably 1.5-2;
3) the molar percentage of the structure 3 is 25-45%, preferably 30-42%, and more preferably 33-40%;
4) the molar percentage of the structure 4 is 3-20%, preferably 5-15%, and more preferably 8-12%;
5) m:p is 2-25:75-98, preferably 5-20:80-95, and preferably 10-20:80-90.

In another preferred embodiment, the photolithographic resin is a copolymer consisting of structure 1, structure 2, structure 3 and structure 4.

In another preferred embodiment, the photolithographic resin has a structure shown in formula C3:

-(structure 1)$_m$-(structure 2)$_{p1}$-(structure 3)$_{x1}$-(structure 4)$_y$-(structure 2)$_{p2}$-(structure 3)$_{x2}$-    formula C3

$p=p1+p2;$ $x=x1+x2;$ p1 and p2 are independently integers selected from 0-20;
x1 and x2 are independently integers selected from 0-15.

In another preferred embodiment, the copolymer has the following repeating structural units:

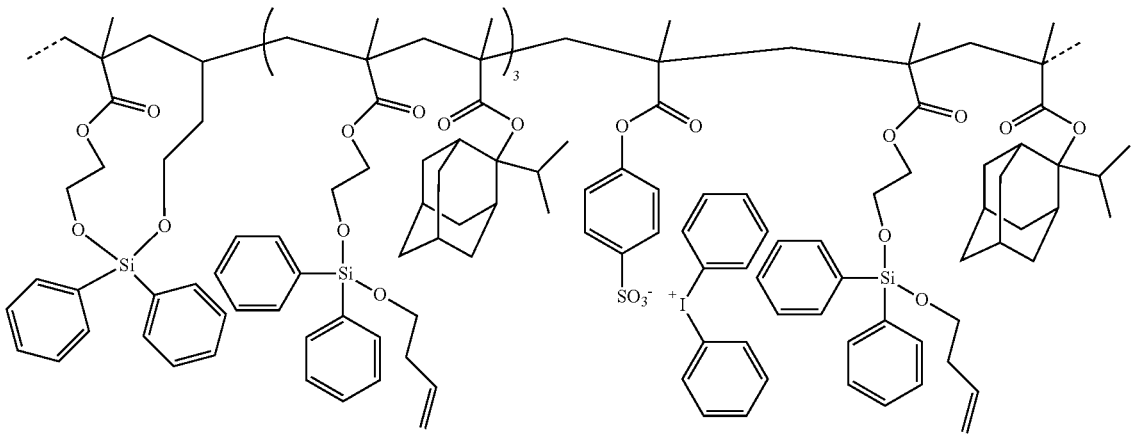

In another preferred embodiment, $R_a^1$, $R_b^1$ and $R_b^3$ are each independently selected from the group consisting of H and C1-C3 alkyl;

each $R_a^2$ is independently selected from the group consisting of C1-C3 alkylene;

each $R_a^3$ is independently selected from the group consisting of —(C1-C3 alkylene)-;

each $R_b^2$ is independently selected from the group consisting of

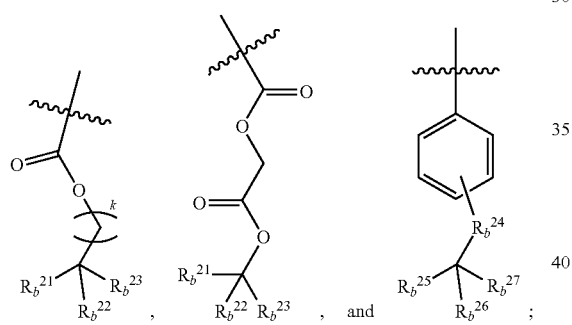

$R_b^{21}$, $R_b^{22}$, and $R_b^{23}$ are each independently selected from the group consisting of none, H, C1-C3 alkyl, adamantyl, OH-substituted adamantyl, and C3-C6 cycloalkyl; or $R_b^{21}$, $R_b^{22}$ and $R_b^{23}$ together form a structure selected from the group consisting of

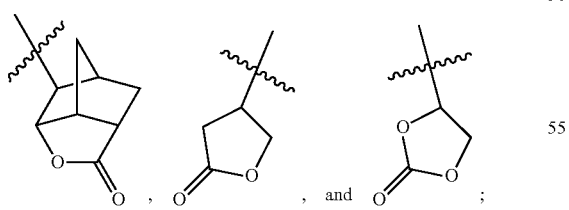

k is 0, 1 or 2;
$R_b^{24}$ is —O—;
$R_b^{25}$, $R_b^{26}$, and $R_b^{27}$ are each independently selected from the group consisting of none, hydrogen, =O, C1-C4 alkyl, C1-C3 alkoxy, —(C=O)—O—C(C1-C3 alkyl)$_2$-adamantyl, —O—(C3-C6 cycloalkyl), —O—(C1-C3 alkylene)-phenyl, phenyl, and —O—(C1-C3 alkylene)-O—(C=O)-phenyl;

$R_b^4$ is a combination of anions and cations, wherein the anion is selected from the group consisting of

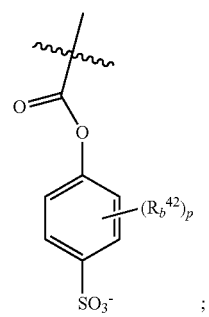

each $R_b^{42}$ is independently selected from the group consisting of hydrogen, halogenated or unsubstituted $C_1$-$C_{15}$ straight-chain or branched-chain alkyl, and substituted or unsubstituted $C_1$-$C_{15}$ straight-chain or branched-chain alkoxy; the substituted means being substituted by a substitutent selected from the group consisting of halogen, hydroxyl, carbonyl, amino, amide, ether-bonded oxygen atom, and lactone structure; p is an integer from 0 to 5;
the cation is selected from the iodonium salt (B1) represented by the following formula:

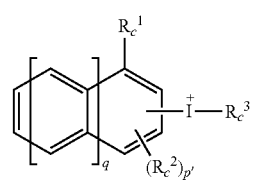

(B1)

in formula (B1), $R_c^1$, $R_c^2$, and $R_c^3$ each independently represent a substituent;
$R_c^1$ is hydrogen;
$R_c^2$ is hydrogen;
$R_c^3$ is phenyl;
q is 0, 1, 2 or 3;
p' is 0, 1, 2, 3, 4 or 5;
each $L_1$—$L_2$ is independently selected from the group consisting of

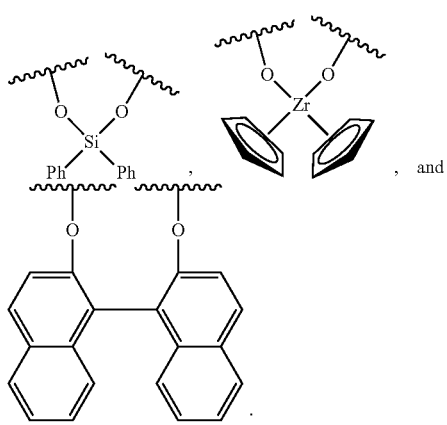, and

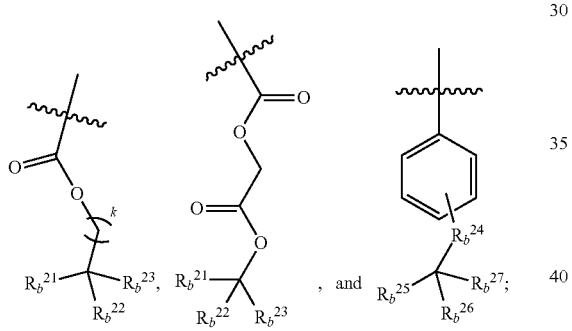.

In another preferred embodiment,
$R_a^1$ and $R_b^1$ are each independently selected from the group consisting of H and C1-C3 alkyl;
each $R_a^2$ is independently selected from the group consisting of C1-C3 alkylene;
each $R_a^1$ is independently selected from the group consisting of —(C1-C3 alkylene)-O—, and —(C1-C3 alkylene)-O—(C=O)—;
each $R_b^2$ is independently selected from the group consisting of

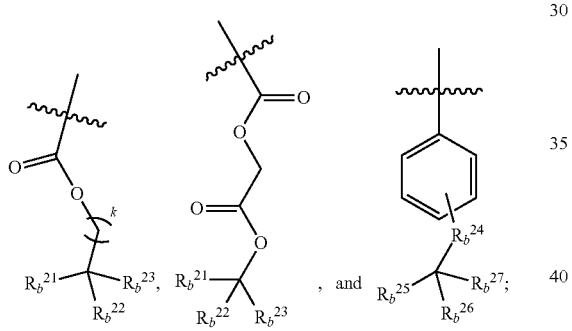

$R_b^{21}$, $R_b^{22}$, and $R_b^{23}$ are each independently selected from the group consisting of none, H, C1-C3 alkyl, adamantyl, OH-substituted adamantyl, and C3-C6 cycloalkyl; or $R_b^{21}$, $R_b^{22}$ and $R_b^{23}$ together form a structure selected from the group consisting of

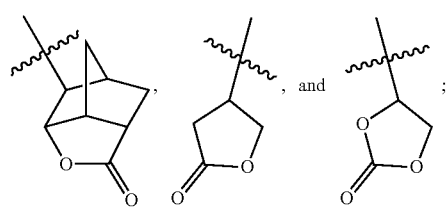;

k is 0, 1 or 2;
$R_b^{24}$ is —O—;
$R_b^{25}$, $R_b^{26}$, and $R_b^{27}$ are each independently selected from the group consisting of none, hydrogen, =O, C1-C4 alkyl, C1-C3 alkoxy, —(C=O)—O—C(C1-C3 alkyl)$_2$-adamantyl, —O—(C3-C6 cycloalkyl), —O—(C1-C3 alkylene)-phenyl, phenyl, and —O—(C1-C3 alkylene)-O—(C=O)-phenyl;

each $L_1$—$L_2$ is independently selected from the group consisting of

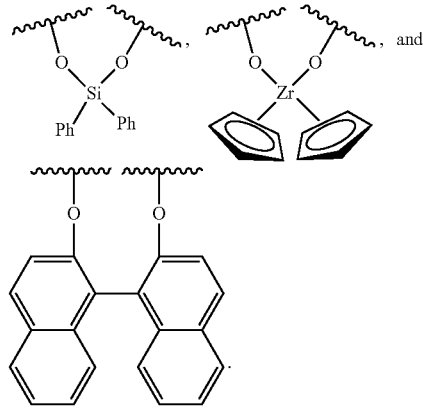, and

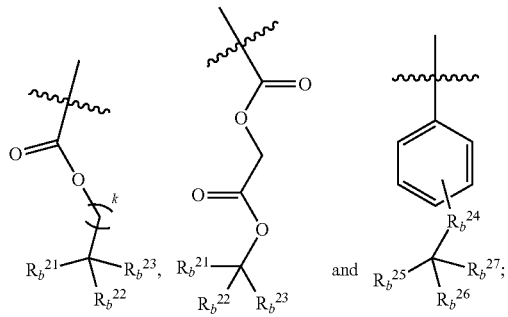.

In another preferred embodiment,
$R_a^1$, $R_b^1$ and $R_b^3$ are each independently selected from the group consisting of H and C1-C3 alkyl;
each $R_a^2$ is independently selected from the group consisting of none and C1-C3 alkylene;
each $R_a^1$ is independently selected from the group consisting of —(C1-C3 alkylene)-, —(C1-C3 alkylene)-O—, and —(C1-C3 alkylene)-O—(C=O)—;
$R_b^2$ and $R_b^4$ are different and are each independently selected from the group consisting of

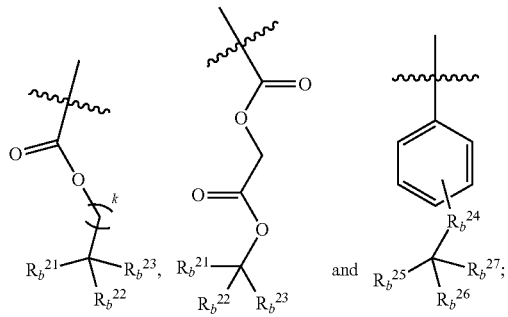

$R_b^{21}$, $R_b^{22}$, and $R_b^{23}$ are each independently selected from the group consisting of none, H, C1-C3 alkyl, adamantyl, OH-substituted adamantyl, and C3-C6 cycloalkyl; or $R_b^{21}$, $R_b^{22}$ and $R_b^{23}$ together form a structure selected from the group consisting of

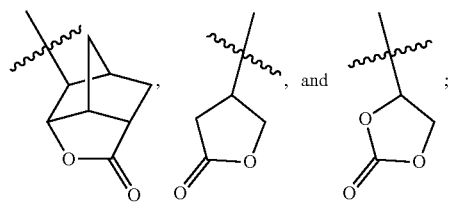;

k is 0, 1 or 2;
$R_b^{24}$ is —O—;
$R_b^{25}$, $R_b^{26}$, and $R_b^{27}$ are each independently selected from the group consisting of none, hydrogen, =O, C1-C4 alkyl, C1-C3 alkoxy, —(C=O)—O—C(C1-C3 alkyl)$_2$-adamantyl, —O—(C3-C6 cycloalkyl), —O—(C1-C3 alkylene)-phenyl, phenyl, and —O—(C1-C3 alkylene)-O—(C=O)-phenyl;

each $L_1—L_2$ is independently selected from the group consisting of

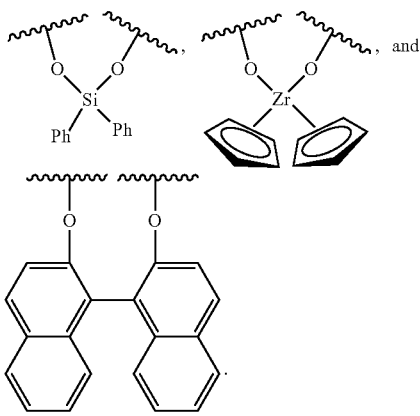

In another preferred embodiment, $L_1—L_2$ is

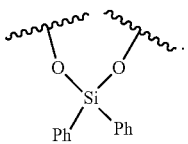 [SMILES: *O[Si](O*)(c1ccccc1)c1ccccc1]

In another preferred embodiment, at least one of $R_b^{21}$, $R_b^{22}$ and $R_b^{23}$ is a group selected from the group consisting of adamantyl, OH-substituted adamantyl and C3-C6 cycloalkyl;

or $R_b^{21}$, $R_b^{22}$ and $R_b^{23}$ together form a structure selected from the group consisting of

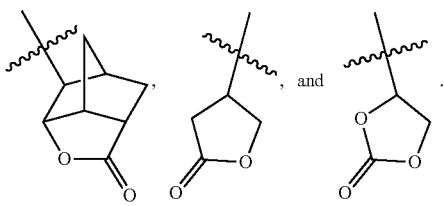

In the fourth aspect of the invention, it provides a chemically amplified photoresist comprising the photolithographic resin of the first aspect of the invention, a photo-acid generator, a quencher, a surfactant, and a solvent.

In the fifth aspect of the invention, it provides a chemically amplified photoresist comprising the photolithographic resin of the second aspect of the invention, a photo-acid generator, a quencher, a surfactant, and a solvent.

In the sixth aspect of the invention, it provides a chemically amplified photoresist comprising the photolithographic resin of the third aspect of the invention, a quencher, a surfactant, and a solvent.

In another preferred embodiment, the concentration of the photolithographic resin is 1-20 wt %, the concentration of the photo-acid generator is 0.02-1 wt %, the concentration of the quencher is 0.01-1 wt %, and the concentration of the surfactant is 0.01-0.05 wt %.

In another preferred embodiment, the chemically amplified photoresist comprises the following components:
photolithographic resin 1-20 parts by weight (preferably 1-10 parts by weight, more preferably 1-7 parts by weight)
photo-acid generator 0.02-1 parts by weight (preferably 0.05-0.6 parts by weight, more preferably 0.06-0.4 parts by weight)
quencher 0.001-1 parts by weight (preferably 0.002-0.5 parts by weight, more preferably 0.005-0.1 parts by weight)
surfactant 0.001-0.05 parts by weight (preferably 0.002-0.04 parts by weight, more preferably 0.005 parts by weight)
solvent 10-98 parts by weight (preferably 15-96 parts by weight, more preferably 18-95 parts by weight).

In another preferred embodiment, the photo-acid generator comprises an iodonium salt (B1) and/or a sulfonium salt (B2) represented by the following formulas:

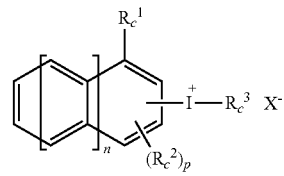

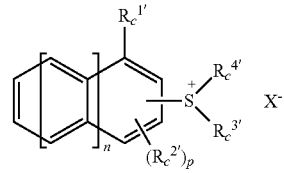

in formulas (B1) and (B2), $R_c^1$, $R_c^2$, $R_c^3$, $R_c^{1'}$, $R_c^{2'}$, $R_c^{3'}$, and $R_c^{4'}$ each independently represent a substituent;

$R_c^1$ and $R_c^{1'}$ include hydrogen atom, halogen atom, unsubstituted or hydroxyl or halogen substituted $C_1$-$C_{10}$ straight-chain or branched-chain alkyl, unsubstituted or hydroxyl or halogen substituted $C_1$-$C_{10}$ straight-chain or branched-chain alkoxy, unsubstituted or hydroxyl or halogen substituted $C_1$-$C_{10}$ straight-chain or branched-chain alkoxy carbonyl; the halogen comprises fluorine atom, chlorine atom, bromine atom and iodine atom;

$R_c^2$ and $R_c^{2'}$ include hydrogen atom, halogenated or unsubstituted C1-C15 straight-chain or branched-chain alkyl, and substituted or unsubstituted C1-C15 straight-chain or branched-chain alkoxy; the substituted means being substituted by halogen, hydroxyl, carbonyl, amino, amide, ether bonded oxygen atom or lactone structure; p is an integer from 0 to 5;

$R_c^3$, $R_c^{3'}$ and $R_c^{4'}$ include substituted or unsubstituted $C_1$-$C_{11}$ straight-chain or branched-chain alkyl, substituted or unsubstituted phenyl, and substituted or unsubstituted naphthyl; the substituted means being substituted by halogen, hydroxyl, carbonyl, amino, amide or lactone structure; $R_c^{3'}$ and $R_c^{4'}$ are optionally combined to form a divalent group;

n is an integer of 0-4;

X$^-$ represents a non-nucleophilic anion selected from a sulfonate anion or a bissulfonyl amide anion.

In another preferred embodiment, the photo-acid generator has the following structure:

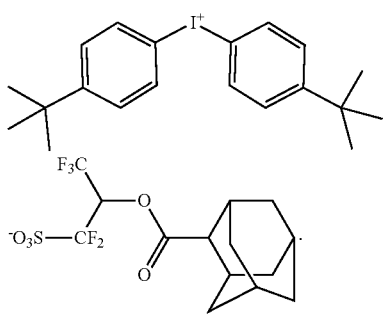

In another preferred embodiment, the non-nucleophilic anion includes an anion represented by the following formula:

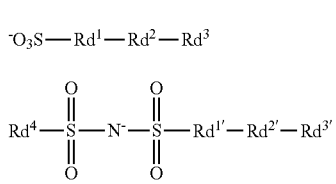

in formula (X1) and (X2), $R_a^1$ and $R_d^{1'}$ represent a substituted C1-C6 straight-chain alkyl, and the substituted means being substituted by fluorine or a perfluoro C1-C6 alkyl;

$R_a^2$ and $R_a^{2'}$ are linker selected from —COO—, —CO—, —O—, —S—, —SO—, —SO$_2$—, or —CONH—;

$R_a^3$ and $R_a^{3'}$ are cyclic groups including monocyclic aliphatic groups, specifically cyclopentyl, cyclohexyl, cycloheptyl and cyclooctyl; or polycyclic aliphatic groups, specifically adamantyl, norbornyl, tricyclodecyl, tetracyclodecyl and tetracyclododecyl; or aryl, specifically phenyl, naphthyl, phenanthryl and anthracenyl, preferably naphthyl;

$R_d^4$ represents a substituent being symmetric to $R_d^{1'}$, $R_d^{2'}$, and $R_d^{3'}$.

In another preferred embodiment, the quencher may be one or more of a tertiary amine compound, an amide compound, a quaternary ammonium hydroxide compound, and a nitrogen-containing heterocyclic compound.

In another preferred embodiment, the quencher has a structure selected from the group consisting of

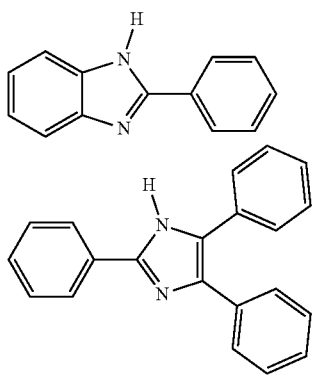

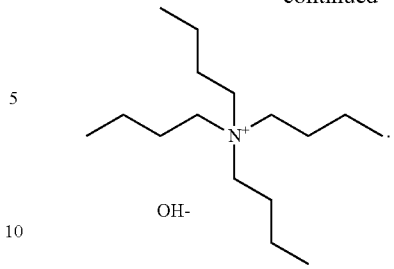

In another preferred embodiment, the surfactant comprises one or more of a polysiloxane and/or a polyacrylate surfactant.

In another preferred embodiment, the surfactant is represented by the following formula:

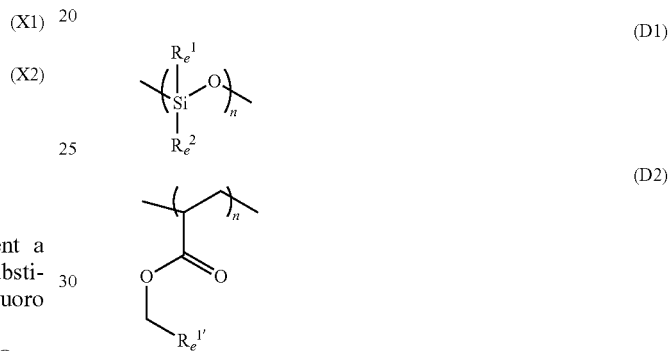

in formulas (D1) and (D2), $R_e^1$, $R_e^2$, and $R_e^{1'}$ each independently represent organic groups; wherein $R_e^1$ and $R_e^2$ are selected from C1-C8 straight-chain alkyl; $R_e^{1'}$ is selected from substituted or unsubstituted $C_1$-$C_{30}$ straight-chain or branched-chain alkyl, substituted or unsubstituted $C_1$-$C_{30}$ alkoxy and substituted or unsubstituted $C_6$-$C_{30}$ aryl, the substituent in the alkyl, alkoxy or aryl is selected from halogen atom; n represents the molecular number-average degree of polymerization and is selected from an integer of 5-200.

In another preferred embodiment, the surfactant has the following structure:

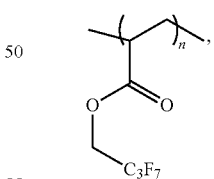

wherein n is 5-200 (preferably 10-100, more preferably 20-50).

In another preferred embodiment, the solvent may be ketones, including cyclohexanone, methyl n-pentanone; esters, including ethyl lactate, propylene glycol methyl ether acetate, propylene glycol ethyl ether acetate, butyl acetate; ethers, including ethylene glycol monomethyl ether, propylene glycol monomethyl ether, diethylene glycol dimethyl ether; lactones, including gamma-butyrolactone.

In another preferred embodiment, the solvent is propylene glycol monomethyl ether acetate.

In the seventh aspect of the invention, it provides a preparation method of the chemically amplified photoresist of the fourth aspect of the invention comprising the following steps:

1) adding the photolithographic resin, photo-acid generator, quencher and surfactant into the solvent;
2) mixing and stirring at 15-60° C. for 6-72 h to obtain the chemically amplified photoresist.

In the eighth aspect of the invention, it provides an application method for the chemically amplified photoresist of the fourth aspect of the invention comprising the following steps:

1) coating the chemically amplified photoresist on the substrate;
2) baking the coated photoresist once to remove the solvent;
3) exposing the photoresist removing the solvent;
4) baking the photoresist being exposed again;
5) developing the photoresist after post-exposure baking with an alkaline developer to obtain a photolithographic film.

In the ninth aspect of the invention, it provides a cross-linked negative photoresist, wherein the cross-linked negative photoresist comprises the photolithographic resin of the first aspect of the invention, a photoinitiator, a cross-linking agent, and a solvent.

In another preferred embodiment, the cross-linking agent is a thiol cross-linking agent.

In the tenth aspect of the invention, it provides a cross-linked negative photoresist, wherein the cross-linked negative photoresist comprises the photolithographic resin of the second aspect of the invention, a photoinitiator, a cross-linking agent, and a solvent.

In another preferred embodiment, the cross-linked negative photoresist comprises the following components:

photolithographic resin 1-20 parts by weight (preferably 2-10 parts by weight, more preferably 3-6 parts by weight)

photoinitiator 0.01-0.5 parts by weight (preferably 0.05-0.4 parts by weight, more preferably 0.15-0.35 parts by weight)

cross-linking agent 0.1-5 parts by weight (preferably 0.5-3 parts by weight, more preferably 0.8-1.5 parts by weight)

solvent 80-98 parts by weight (preferably 85-96 parts by weight, more preferably 90-95 parts by weight).

In another preferred embodiment, the photoinitiator has the following structure:

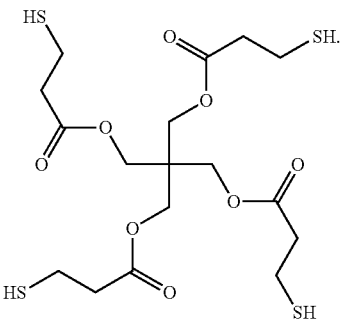

In another preferred embodiment, the cross-linking agent (thiol) has the following structure:

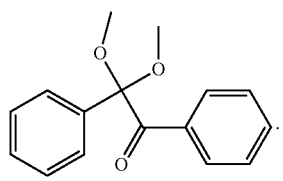 [SMILES: COC(OC)(C(=O)c1ccccc1)c1ccccc1]

In another preferred embodiment, the solvent is propylene glycol monomethyl ether acetate.

In the eleventh aspect of the invention, it provides a method for preparing the cross-linked negative photoresist of the ninth aspect of the invention comprising the following steps:

1) adding the photolithographic resin, the photoinitiator and the cross-linking agent into the solvent;
2) mixing and stirring at 15-50° C. for 6-72 h to obtain the cross-linked negative photoresist.

In the twelfth aspect of the invention, it provides a method for preparing the cross-linked negative photoresist of the tenth aspect of the invention comprising the following steps:

1) adding the photolithographic resin, the photoinitiator and the cross-linking agent into the solvent;
2) mixing and stirring at 15-50° C. for 6-72 h to obtain the cross-linked negative photoresist.

In the thirteenth aspect of the invention, it provides an application method for the cross-linked negative photoresist of the ninth aspect of the invention comprising the following steps:

1) coating the photoresist as described above on the substrate;
2) baking the coated photoresist once to remove the solvent;
3) exposing the photoresist removing the solvent;
4) developing the photoresist after exposing with an organic solvent to obtain a photolithographic pattern.

In another preferred embodiment, the method also comprises the following steps:

5) cleaning the residual photoresist with trifluoroacetic acid, and then neutralizing with alkaline developer to obtain a clean silicon plate.

In the thirteenth aspect of the invention, it provides an application method for the cross-linked negative photoresist of the tenth aspect of the invention comprising the following steps:

1) coating the photoresist as described above on the substrate;
2) baking the coated photoresist once to remove the solvent;
3) exposing the photoresist removing the solvent;
4) developing the photoresist after exposing with an organic solvent to obtain a photolithographic pattern.

In another preferred embodiment, the method also comprises the following steps:

5) cleaning the residual photoresist with trifluoroacetic acid, and then neutralizing with alkaline developer to obtain a clean silicon plate.

It should be noted that within the scope of this invention, the technical features of the invention described above and specially described in the following (Embodiments) could be combined to form a new or preferred technical solution. Due to limited space of this invention, they will not be enumerated in details herein.

FIGURES

FIG. 19, FIG. 20, FIG. 21, FIG. 22, FIG. 23, FIG. 24, FIG. 25 and FIG. 26 respectively show the optical microscope photographs of the stripe patterns obtained on the silicon wafer, as described in Example 13.

Figure 27:
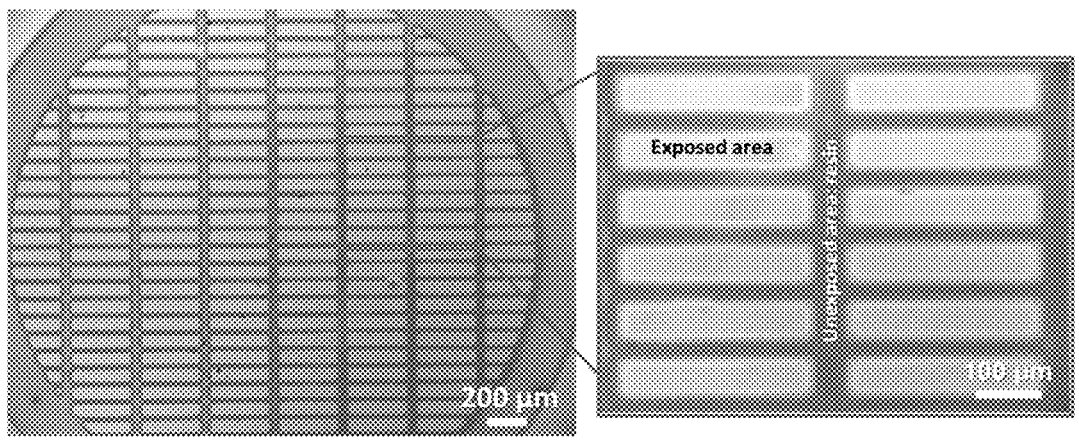
Figure 28:
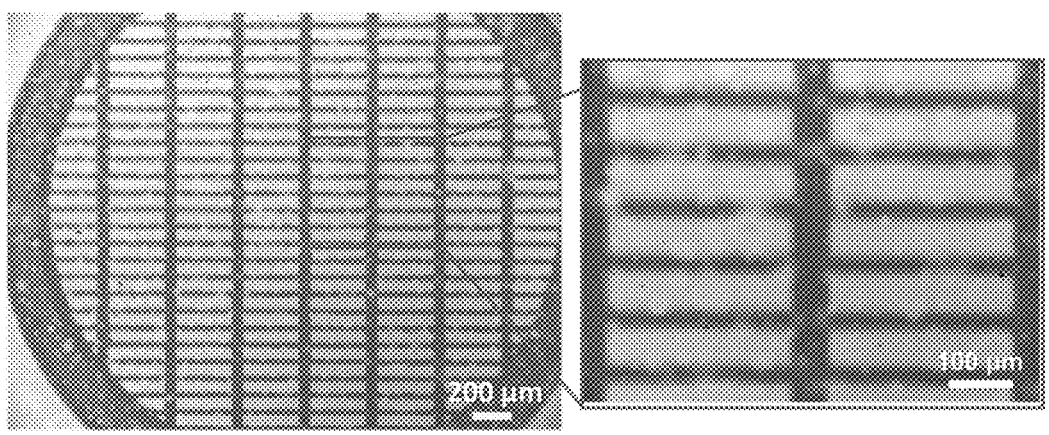

FIG. 27 and FIG. 28 are the optical microscopic photographs of the stripe patterns obtained on the silicon wafer in Contrast 3.

Figure 29:
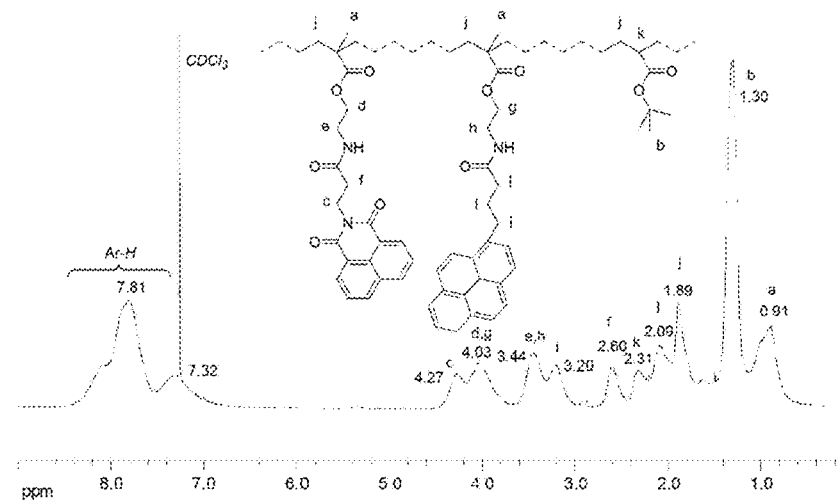

FIG. 29 shows the $^1$H NMR spectrum of the terpolymer 1.

Figure 30:
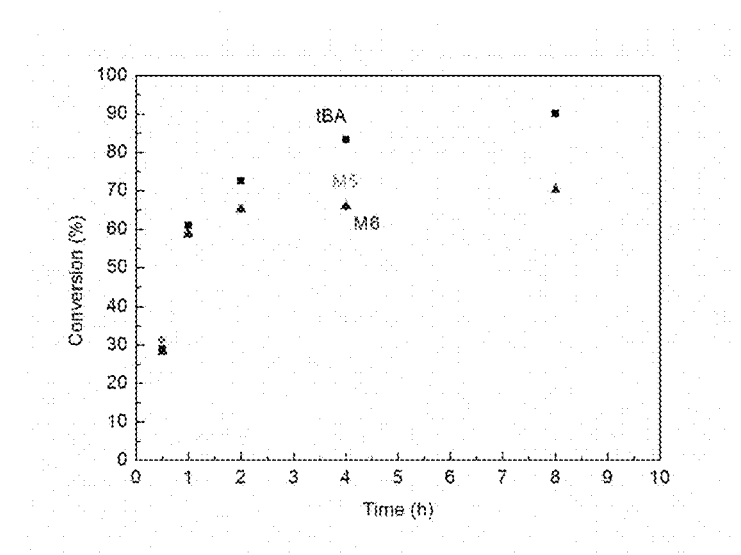

FIG. 30 shows the conversion rates of the carbon-carbon double bonds in each co-monomer of terpolymer 1 at different polymerization times, where M5 is the monomer 1 synthesized in Examples 1-2, M6 is the monomer 2 synthesized in Examples 1-3 and tBA is the third monomer, tert-butyl acrylate.

Figure 31:
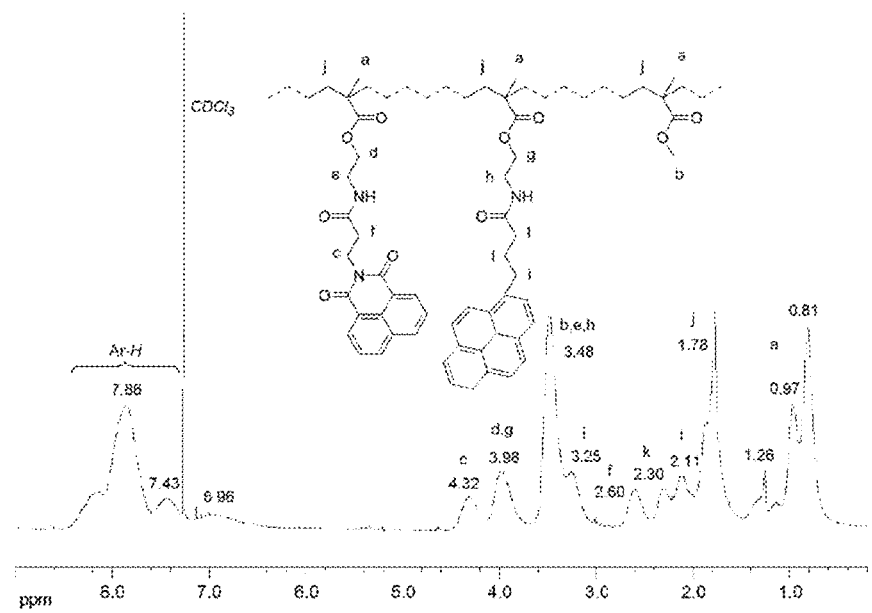

FIG. 31 shows the $^1$H NMR spectrum of the terpolymer 2.

Figure 32:
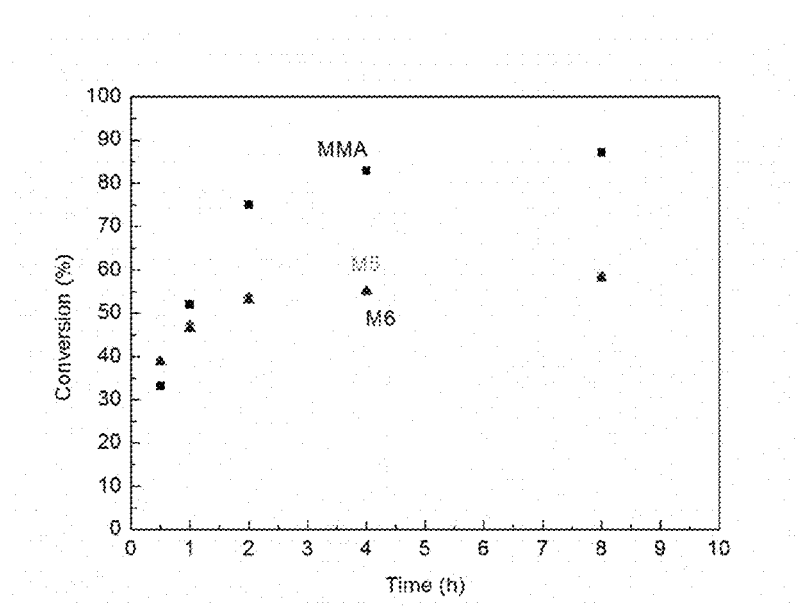

FIG. 32 shows the conversion rates of the carbon-carbon double bonds in each co-monomer of terpolymer 2 at different polymerization times, where M5 is the monomer 1 synthesized in Examples 1-2, M6 is the monomer 2 synthesized in Examples 1-3 and MMA is the third monomer, methyl methacrylate.

Figure 33:
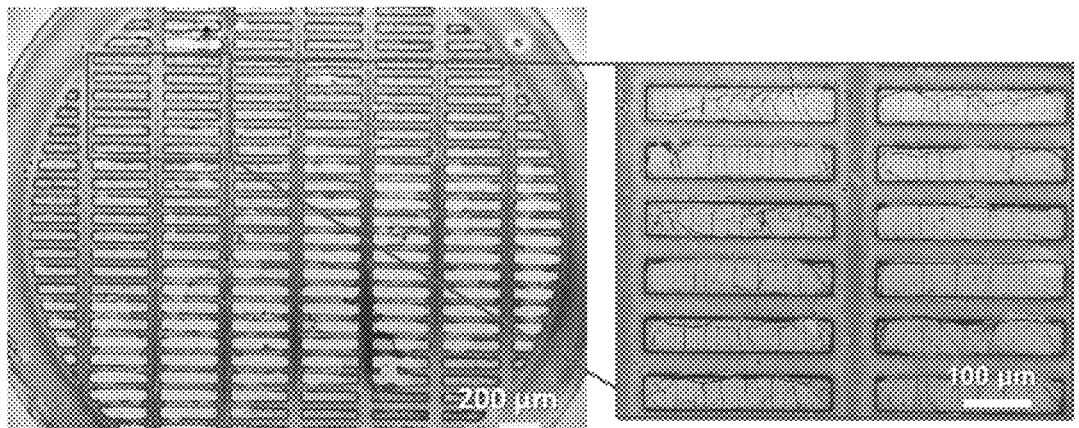
Figure 34:
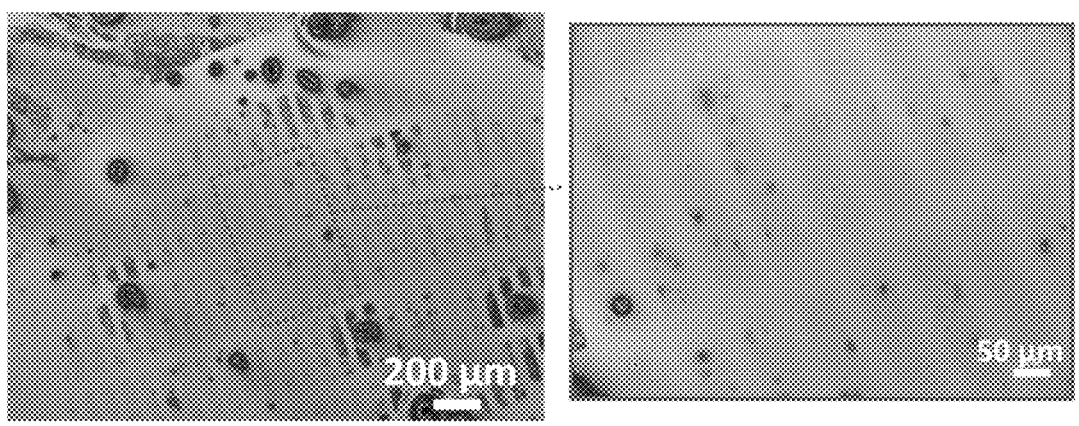

FIG. 33 and FIG. 34 are the optical microscopic photographs of the stripe patterns obtained on the silicon wafer in Contrast 4.

Figure 35:
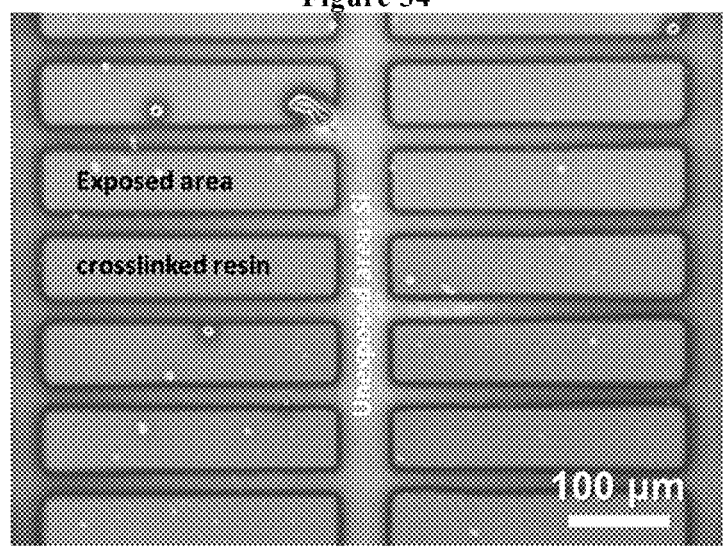
Figure 36:
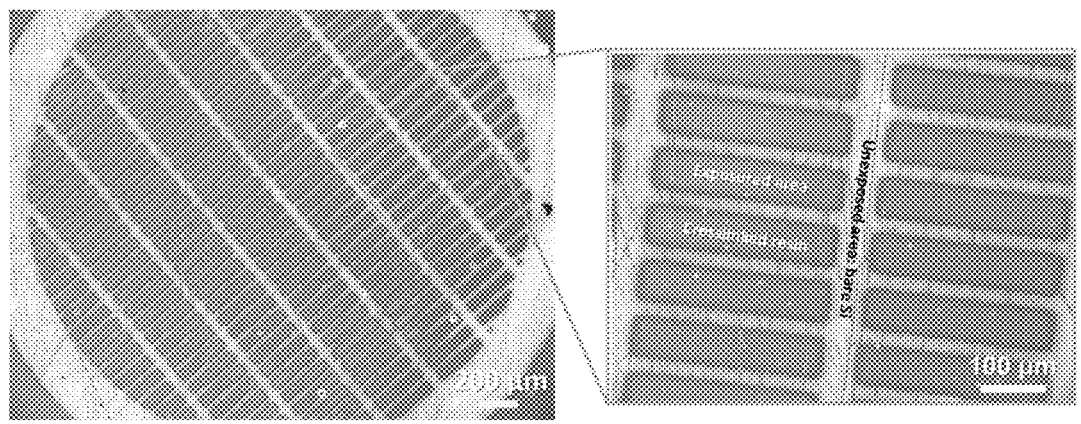

FIG. 35 and FIG. 36 are the optical microscopic photographs of the stripe patterns obtained on the silicon wafer in Example 15.

Figure 37:
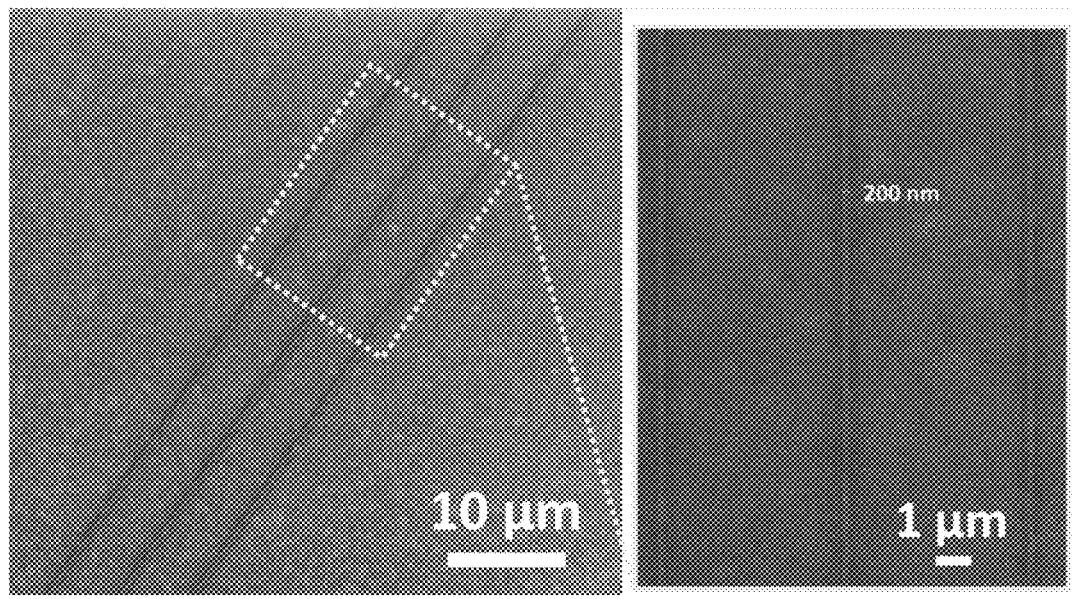

FIG. 37 is the scanning electron microscope photograph of the line pattern obtained on the silicon wafer in Example 15.

Figure 38:
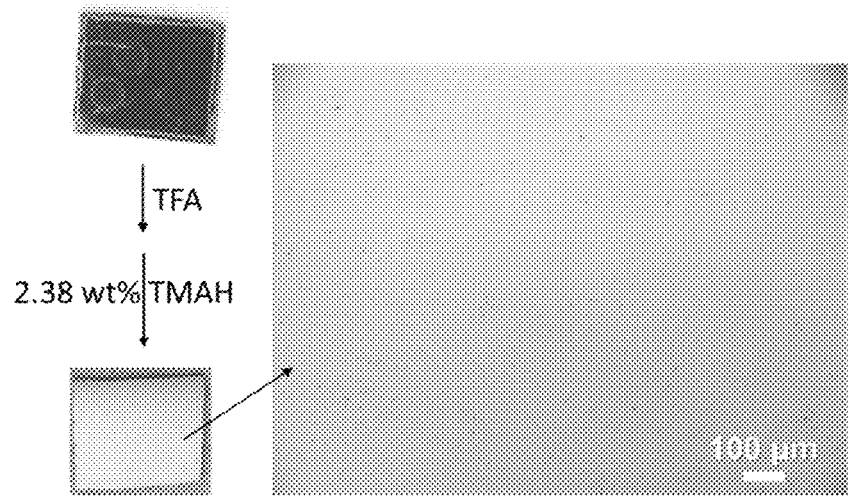

FIG. 38 is the optical microscopic photograph of the silicon wafer after stripping, as described in Example 16.

DETAILED DESCRIPTION OF THE INVENTION

Through long and in-depth study, the inventor accidentally prepared a type of photoresist with novel structure through structural selection and optimization. The photoresist based on the resin shows high-etching resistance. Specifically, the photoresist shows high sensitivity, resolution, contrast and etching resistance. On this basis, the inventor completes the invention.

Terms

In the present invention, unless specifically indicated, the terms used have the general meaning well known to those skilled in the art.

In the present invention, the term "halogen" refers to F, Cl, Br or I.

In this invention, the term "C1-C6 alkyl" refers to linear or branched alkyl containing 1-6 carbon atoms, e.g., methyl, ethyl, propyl, isopropyl, butyl, isobutyl, tert-butyl, neopentyl, tert-amyl or similar groups.

In this invention, the term "C2-C6 alkenyl" refers to linear or branched alkenyl with 2-6 carbon atoms containing one carbon-carbon double bond, including but not limited to vinyl, propylene, butenyl, isobutenyl, pentenyl, hexenyl, etc.

In this invention, the term "C2-C6 alkynyl" refers to linear or branched alkynyl with 2-6 carbon atoms containing one carbon-carbon triple bond, including but not limited to ethynyl, propargyl, butynyl, isobutynyl, pentynyl, hexynyl, etc.

In this invention, the term "C3-C8 cycloalkyl" refers to cyclic alkyl with 3-8 carbon atoms on the ring, including but not limited to cyclopropyl, cyclobutyl, cyclopentyl, cyclohexyl, cycloheptyl, cyclooctyl, etc.

In this invention, the term "C1-C6 alkoxy" refers to linear or branched alkoxy groups with 1-6 carbon atoms, including but not limited to methoxy, ethoxy, propoxy, isopropoxy, butoxy, etc. C1-C4 alkoxy is preferred.

In this invention, the terms "aryl ring" or "aryl" have the same meaning, "C6-C10 aryl" is preferred. The term "C6-C10 aryl" refers to aromatic ring groups with 6-10 carbon atoms, such as phenyl, naphthalene, etc., which do not contain heteroatoms on the ring.

In this invention, the term "halogenated" refers to being substituted by a halogen atom.

In this invention, the term "substituted" refers to the replacement of one or several hydrogen atoms in a specific group by specific substituents. Specific substituents are those described as previously mentioned or those presented in each embodiment. Unless otherwise specified, a substituted group may have a substituent selected from a particular group at any of the substitutable sites of the group, and the substituents may be the same or different at each location.

Those skilled in the field should understand that the combinations of substituents intended by the invention are stable or chemically achievable. The substituents include but are not limited to halogens, hydroxyl groups, carboxyl groups (—COOH), C1-C6 alkyl groups, C2-C6 alkenyl groups, C3-C8 cycloalkyl groups, 3-12 heterocyclic groups, aryl groups, heteraryl groups, C1-C8 aldehyde groups, C2-C10 acyl groups, C2-C10 ester groups, amino groups, C1-C6 alkoxy groups, C1-C10 sulfonyl groups, etc.

In this invention, the term "1-6" refers to 1, 2, 3, 4, 5, 6. Other similar terms have similar meanings independently of each other. The term "multiple" refers to 2-6, such as 2, 3, 4, 5, 6.

The term "ester group" refers to the group has the following structure: —C(O)—O—R' or R'—C(O)—O—, where R' independently represents hydrogen, C1-C6 alkyl, C3-C6 cycloalkyl, C6-C10 aryl, heteraryl and heterocyclic, as defined above.

The term "amido" refers to the group has the following structure: —CONRR', where R and R' could independently represent hydrogen, alkyl or substituted alkyl, cycloalkyl or substituted cycloalkyl, aryl or substituted aryl, heterocyclic or substituted heterocyclic rings, as defined above. R and R' can be the same or different in dialkyl amine fragments.

The term "carbonyl" has the following structure:

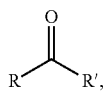

where R and R' could independently represent hydrogen, alkyl or substituted alkyl, cycloalkyl or substituted cycloalkyl, aryl or substituted aryl, heterocyclic or substituted heterocyclic rings, as defined above.

It should be noted that when a group exists at multiple locations in a compound at the same time, its definition at each location is independent of each other and can be the same or different. That is, the term "selected from the group consisting of" has the same meaning as the term "independently selected from the group consisting of".

In this invention, "integer selected from 0-20" refers to integers selected from the group consisting of 1, 2, 3, 4, 5, 6, 7, 8, 9, 10, 11, 12, 13, 14, 15, 16, 17, 18, 19, 20. Similar terms have similar meanings.

This invention discloses the synthesis of a sequenced photoresist resin, and the preparation and application methods of its corresponding positive-tone chemically amplified photoresist and crosslinked negative-tone photoresist, which belongs to the technical field of photoresist materials.

Specially, a type of sequenced dual-tone photoresist resin is obtained in this invention. The described photoresist resin contains hydrophobic olefin-(methyl) acrylate-olefin sequence, which shows positive-tone chemically amplified performance dispensing with the need of conventional acid-labile groups (so-called sequence-sensitized effect). On the other hand, the olefinic double bonds attached as side chains could be crosslinked with crosslinker and photoinitiator, and thus could be used as a crosslinked negative-tone photoresist to yield lithographic patterns with high contrast.

By incorporating conventional photo-acid sensitive monomers, a new type of highly sequenced dual-tone photoresist resin with precisely distributed photoreaction sites (photo-acid sensitive monomers/cross-linked sites) is extended, which can simultaneously possess a variety of excellent properties such as high sensitivity, high contrast and high etching resistance. Bi-functional monomer was polymerized with one or two photo-acid sensitive monomers by free radical polymerization. The amount of incorporated photo-acid sensitive monomers/cross-linked sites is controlled by adjusting the monomer concentration and feed ratio, constructing precisely arranged photoreaction sites on the main chain. Therefore, when this resin is applied as a positive-tone chemically amplified photoresist, it possesses two deprotection sites: "sequence-sensitized" fragment and photo-acid sensitive groups, and thus could be rapidly developed after exposure to form a high-contrast pattern even if the content of photo-acid sensitive monomer is rather low. When this resin is applied as a cross-linked negative-tone photoresist, low roughness and high modulus lithographic patterns can be obtained due to the sequenced arranged cross-linked sites. Besides, the incorporation of Si, metal or several benzene and aliphatic rings with high carbon density into the bridging group L also gives the resin good etching resistance.

By further incorporating polymerizable monomer containing photoacid generator groups, sequenced polymerPAG could be obtained. The polymerPAG shows positive-tone chemically amplified photoresist performance without adding additional PAG agent, yielding lithographic patterns with high contrast and high quality.

The first technical problem to be solved by this invention is to provide a kind of highly sequenced, high-sensitive and high-contrast dual-tone photoresist resin with precisely arranged photoreaction sites (photo-acid sensitive sites/cross-linked sites).

The second technical problem to be solved by this invention is to provide a chemically amplified photoresist (positive-tone) and cross-linked negative-tone photoresist composed of the above mentioned dual-tone resin.

The third technical problem to be solved by this invention is to provide a preparation method of the chemically amplified photoresist and the cross-linked negative-tone photoresist.

The fourth technical problem to be solved by the invention is to provide an application method of the chemically amplified photoresist and the cross-linked negative-tone photoresist and a stripping method of the cross-linked negative-tone photoresist.

To solve the first technical problem, the technical solution of the invention is: a kind of highly sequenced, high-sensitive and high-contrast dual-tone photoresist resin with precisely arranged photoreaction sites (photo-acid sensitive sites/cross-linked sites). The described resist A could be bi-, ter- or tetra-polymers.

By pulling the olefin and (meth)-acrylate monomers closer using the covalent bridge or non-covalent force, part of olefin monomers could be incorporated into the polymer main chain in pair with the (meth)-acrylate monomer, and the rest remained unreacted and attached as side chains in the free radical polymerization. The amount of incorporated olefin monomers/reacted olefinic double bonds could be adjusted by controlling the monomer concentration, constructing highly sequenced bi-polymer with precisely arranged photoreaction sites on the main chain. The described bi-polymer contains multi-block structure, including the paired cyclic structure (a1) and the unreacted olefinic double bonds (a2), which appear alternately, as is shown in formula C1:

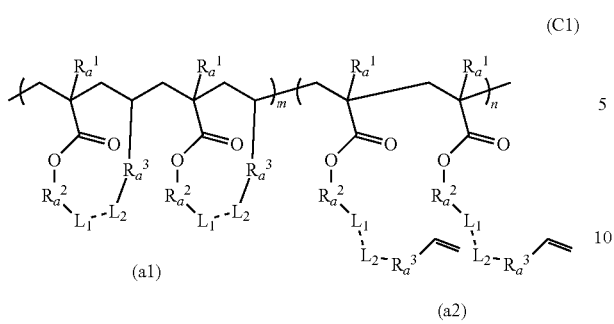

(a1)

(a2)

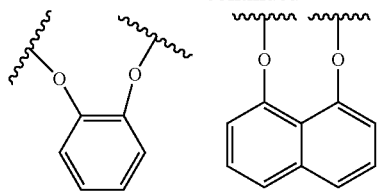

wherein,
the number of structure a1 is m, m is selected from the group consisting of 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5 and 20;
the number of structure a2 is n, n is an integer selected from 1 to 20;
each $R_a^1$ is independently selected from the group consisting of H, C1-C6 alkyl and halogenated C1-C6 alkyl;
each $R_a^2$ is independently selected from the group consisting of C1-C6 alkylene and C3-C8 cycloalkylene;
each $R_a^3$ is independently selected from the group consisting of C1-C6 alkylene;
each $L_1$—$L_2$ is independently selected from the group consisting of:

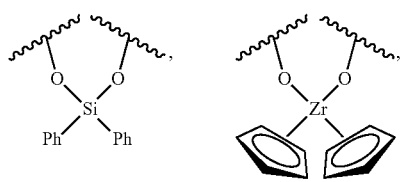

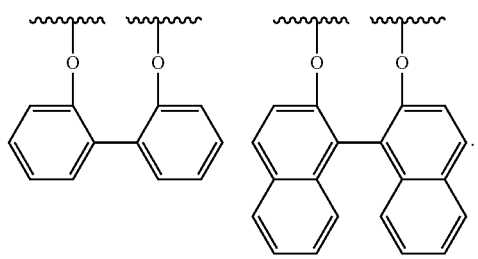

In another preferred embodiment, m is selected from the group consisting of 1, 1.5, 2, 2.5, 3, 3.5, 4, 4.5, 5.

In another preferred embodiment, n is selected from the group consisting of 0.5, 1, 1.5, 2, 2.5, 3, 3.5, 4, 4.5, 5, 5.5, 6, 6.5, 7, 7.5, 8, 8.5, 9, 9.5, 10.

In another preferred embodiment, the described copolymer is the copolymer prepared in the example.

By adding one or more photo-acid sensitive monomers (b1) into the radical copolymerization with the above bi-functional monomer, the conventional acid-labile groups are incorporated into the blocks of unreacted olefinic double bonds (a2) in bi-polymer C1, yielding copolymer C2 comprising three or more components:

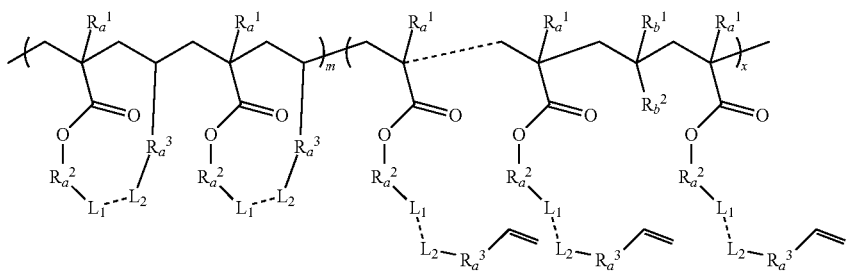

In the general formula (C2), $R_a^1$, $R_a^2$ and $R_a^3$, $R_b^1$ and $R_b^2$ represent hydrogen atoms or substituents independently.
wherein,
m is selected from the group consisting of 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5 and 20;
x is an integer selected from 1 to 15;
$R_a^1$ and $R_b^1$ are each independently selected from the group consisting of H, C1-C6 alkyl, and halogenated C1-C6 alkyl;
each $R_a^2$ is independently selected from the group consisting of C1-C6 alkylene and C3-C8 cycloalkylene;

each $R_a^3$ is independently selected from the group consisting of C1-C6 alkylene;

each $R_b^2$ is independently selected from the group consisting of:

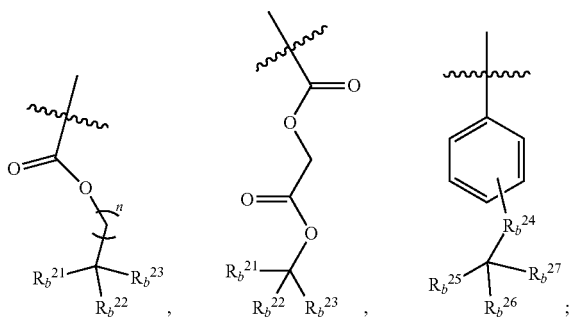

$R_b^{21}$, $R_b^{22}$, and $R_b^{23}$ are each independently selected from the group consisting of none, H, C1-C6 alkyl, adamantyl, OH-substituted adamantyl, and C3-C8 cycloalkyl, or $R_b^{21}$, $R_b^{22}$ and $R_b^{23}$ together form a structure selected from the group consisting of

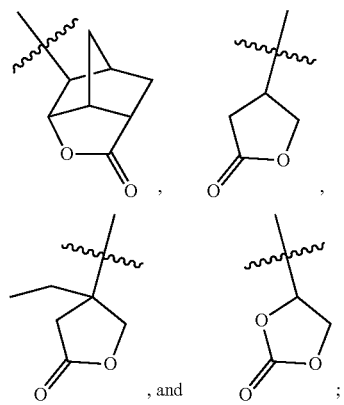

$R_b^{24}$ is selected from the group consisting of —O— and —(C=O)—;

$R_b^{25}$, $R_b^{26}$, and $R_b^{27}$ are each independently selected from the group consisting of none, hydrogen, =O, C1-C6 alkyl, C1-C6 alkoxy, —(C=O)—O—C(C1-C6 alkyl)$_2$-adamantyl, —O—(C3-C8 cycloalkyl), —O—(C1-C6 alkylene)-(C6-C10 aryl), C6-C10 aryl, and —O—(C1-C6 alkylene)-O—(C=O)—(C6-C10 aryl);

each $L_1$—$L_2$ is independently selected from the group consisting of:

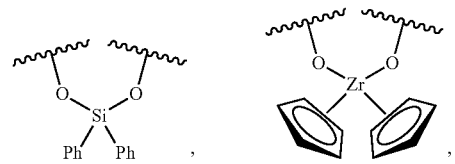

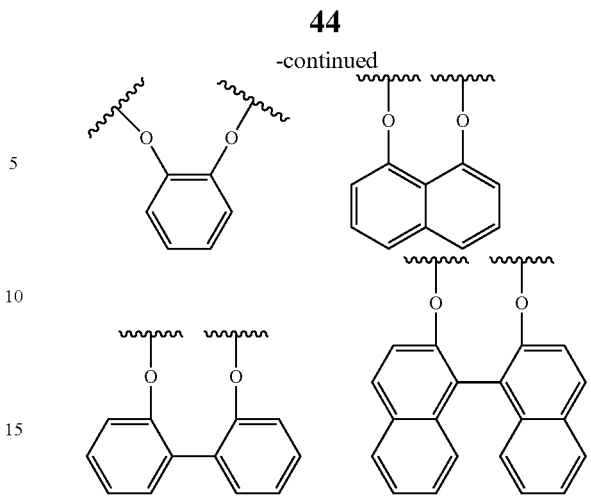

Specifically, $R_b^2$ and $R_b^4$ refer to ArF monomer, such as methacrylate or acrylate monomers with an aliphatic ring and/or lactone structure containing multiple carbons such as adamantane; or to KrF monomer, such as styrene monomers meta-substituted or para-substituted with 4-tertbutoxycarbonyl (tBOC) group and/or acetal group and other protected phenolic hydroxyl groups. The specific structure includes but is not limited as follows:

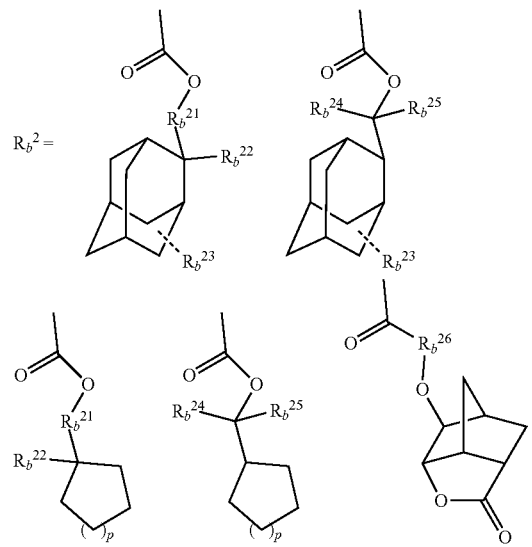

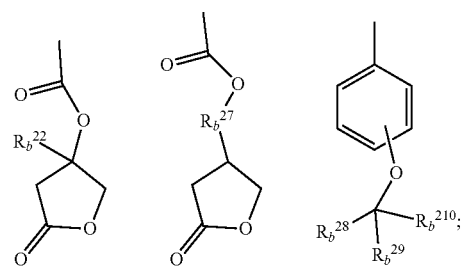

$R_b^{21}$ includes: none, -coo-; $R_b^{22}$, $R_b^{24}$, $R_b^{25}$ represent hydrogen, $C_1$-$C_{10}$ linear or branched alkyl, $C_1$-$C_{10}$ alkoxy, $C_3$-$C_{30}$ cyclic alkyl; $R_b^{23}$ includes hydrogen and $C_1$-$C_{10}$ linear or branched alkyl, $C_1$-$C_{10}$ alkoxy, $C_3$-$C_{30}$ cyclic alkyl, —OH; $R_a^{26}$ includes: none, -coo-, and $C_1$-$C_{10}$ alkoxy; $R_b^{27}$ includes: none, $C_1$-$C_{10}$ linear or branched alkyl, $C_1$-$C_{10}$ alkoxy; $R_b^{28}$, $R_b^{29}$, $R_b^{210}$ independently represent zero, hydrogen, —COO—, =O, and $C_1$-$C_{10}$ linear or branched alkyl, $C_1$-$C_{10}$ alkoxy, $C_3$-$C_{30}$ cyclic alkyl, $C_3$-$C_{30}$ aryl, $C_3$-$C_{30}$ aryl alkyl, $C_3$-$C_{30}$ alkoxy substituted aromatic ring or an aromatic ester ring. P is an integer between 1 and 4. The structure of $R_b^2$ and $R_b^4$ is different.

Specifically, the photoresist resin C2 contains one or more of the following repeating units, includes but is not limited to the follows:

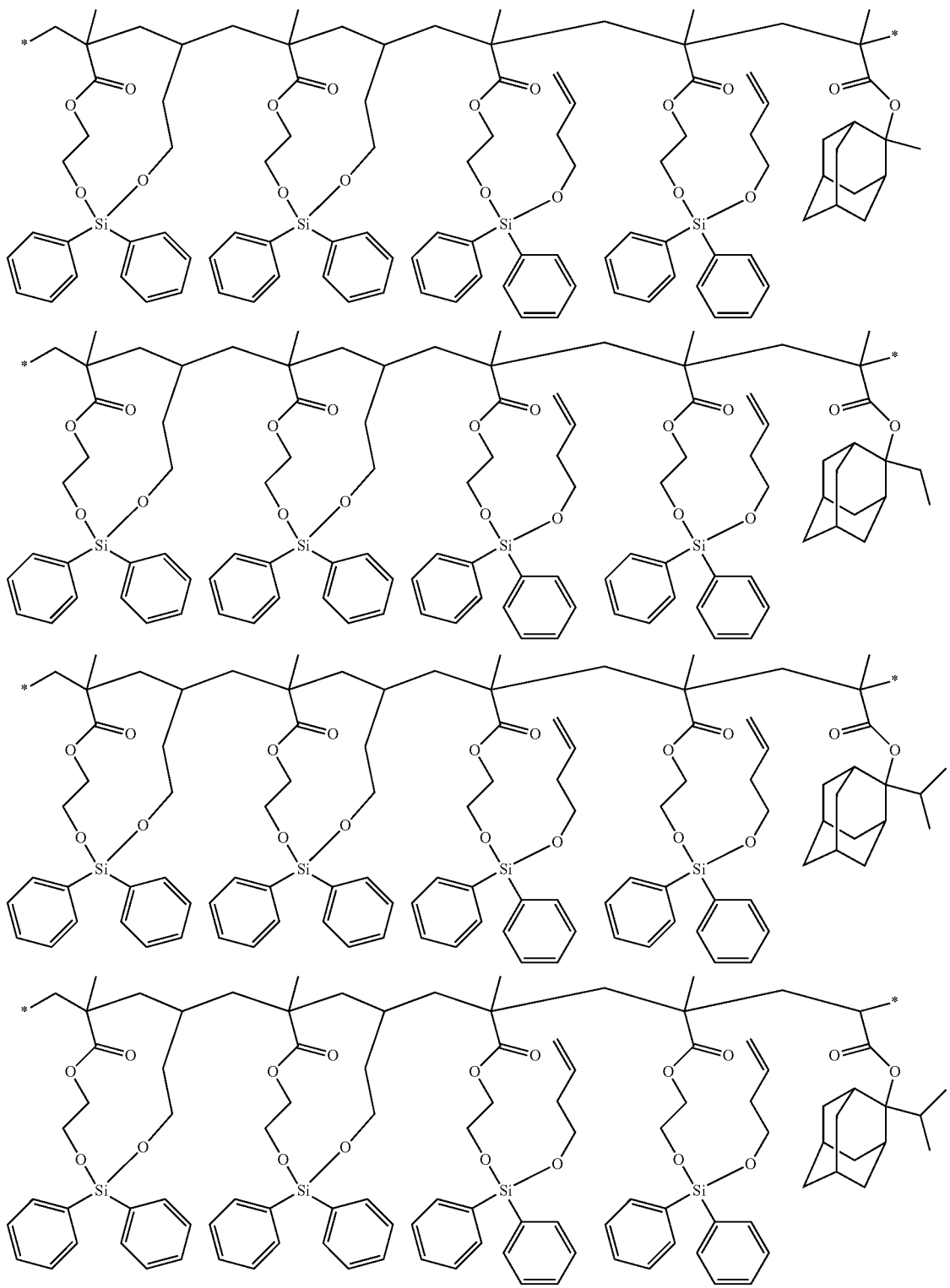

47 48
-continued
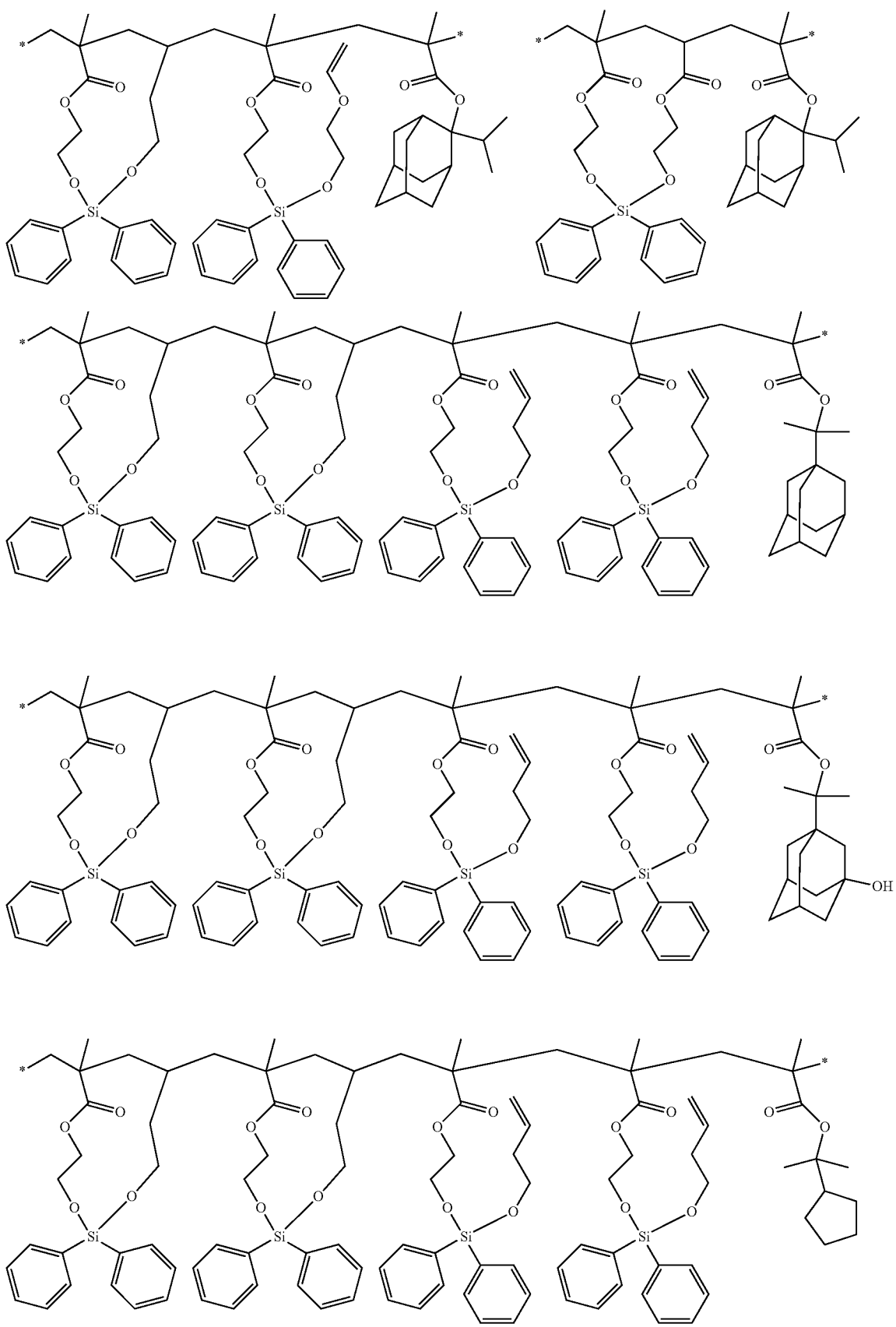

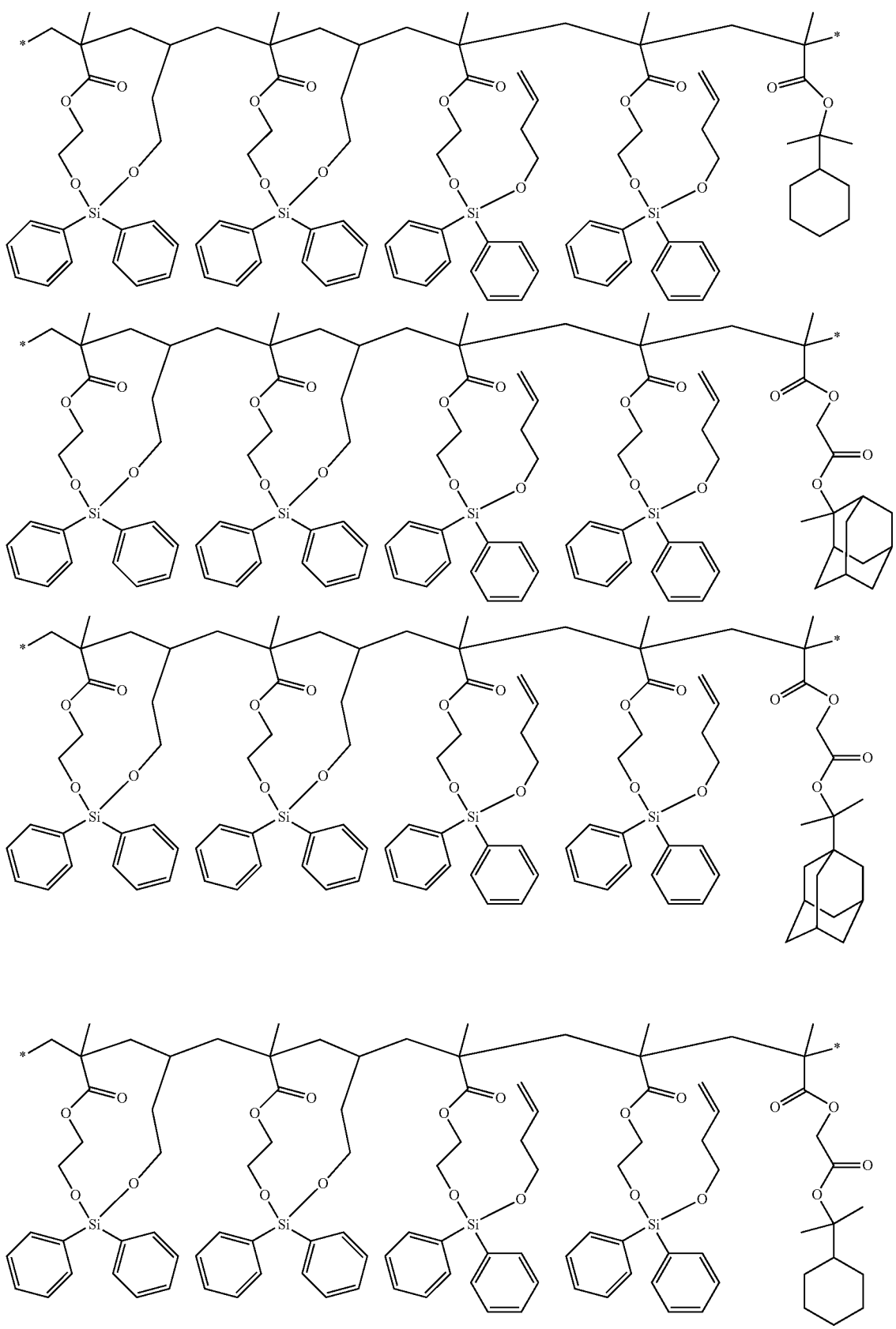

-continued
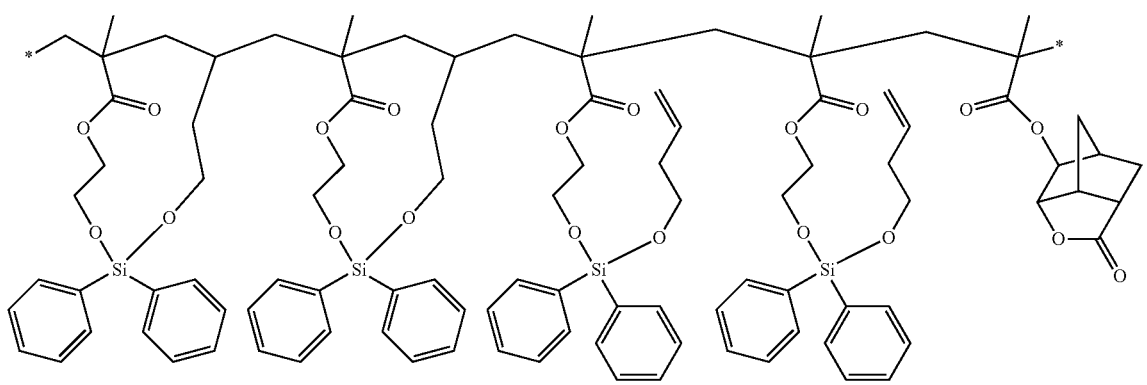
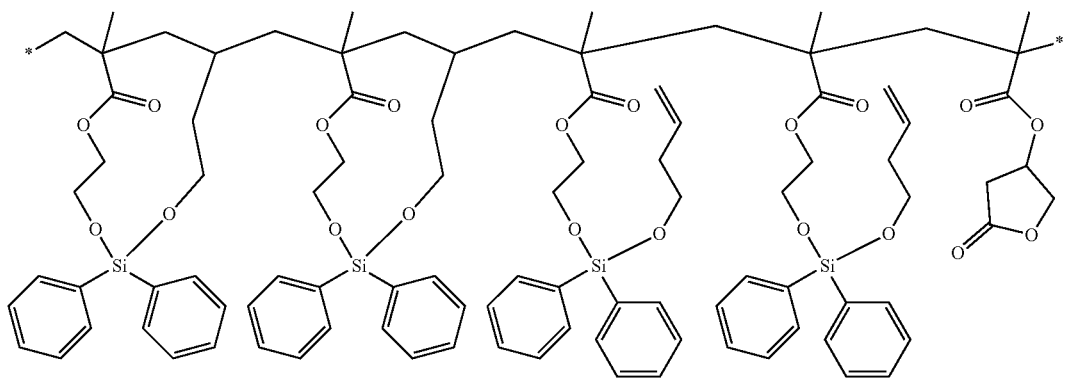
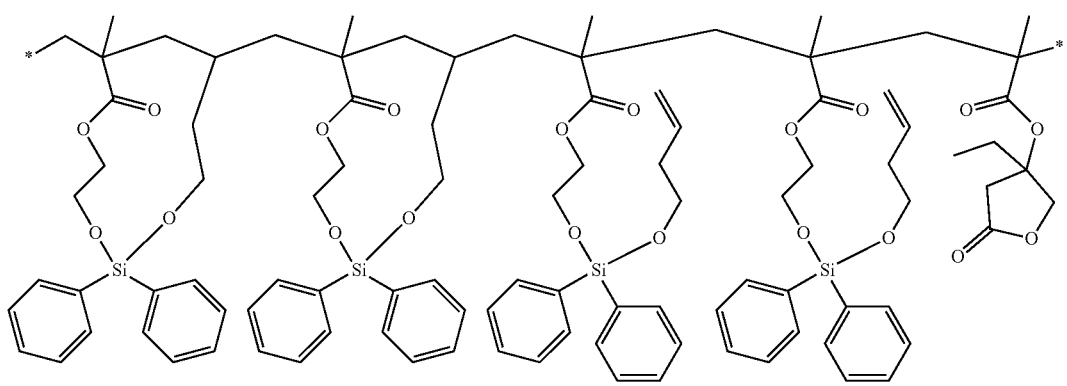
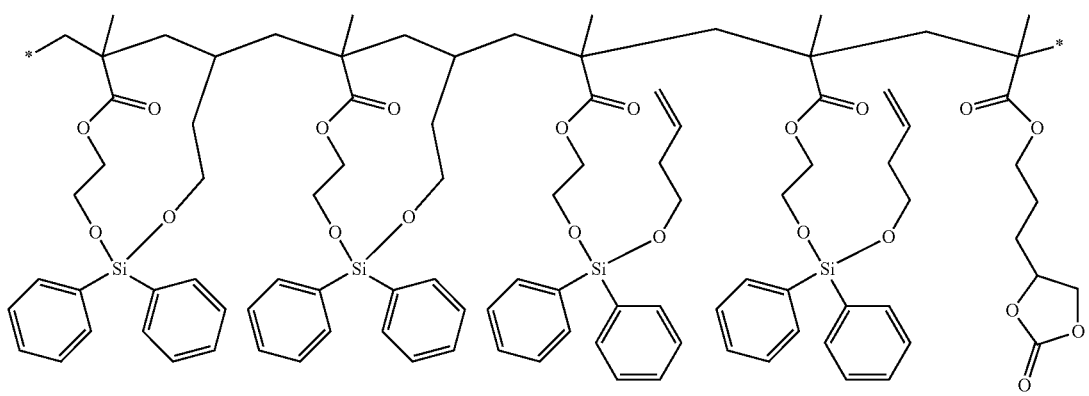

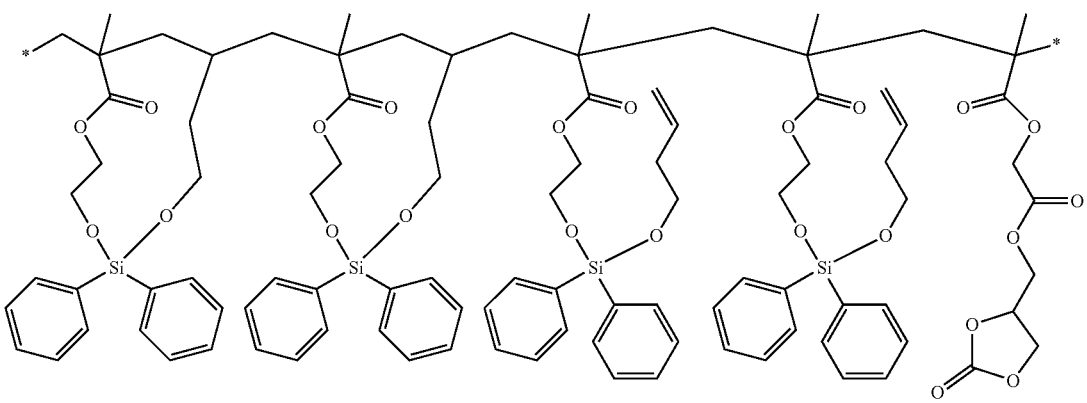
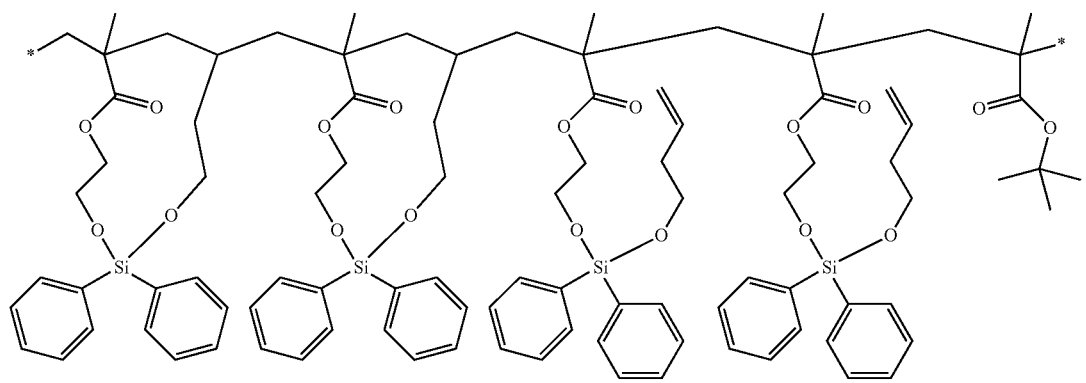
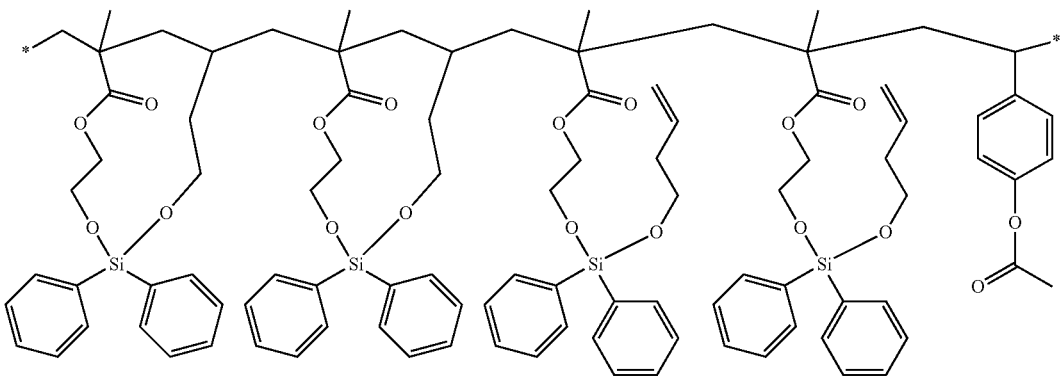
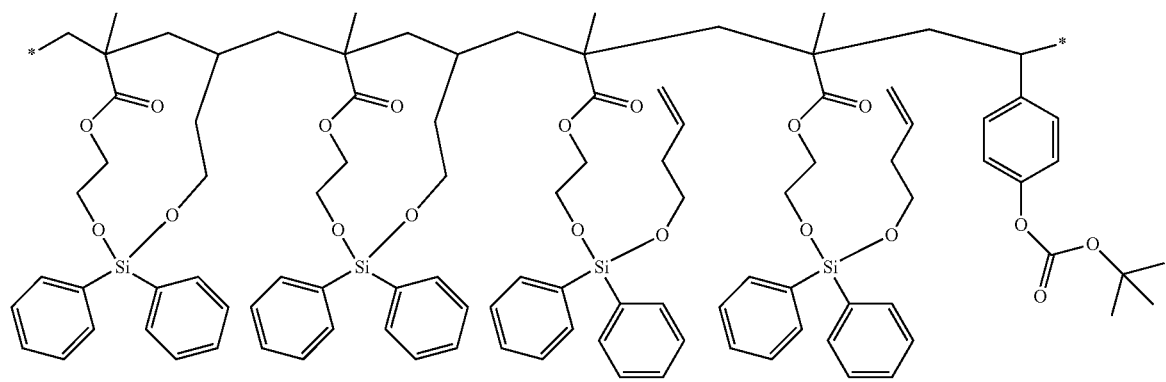

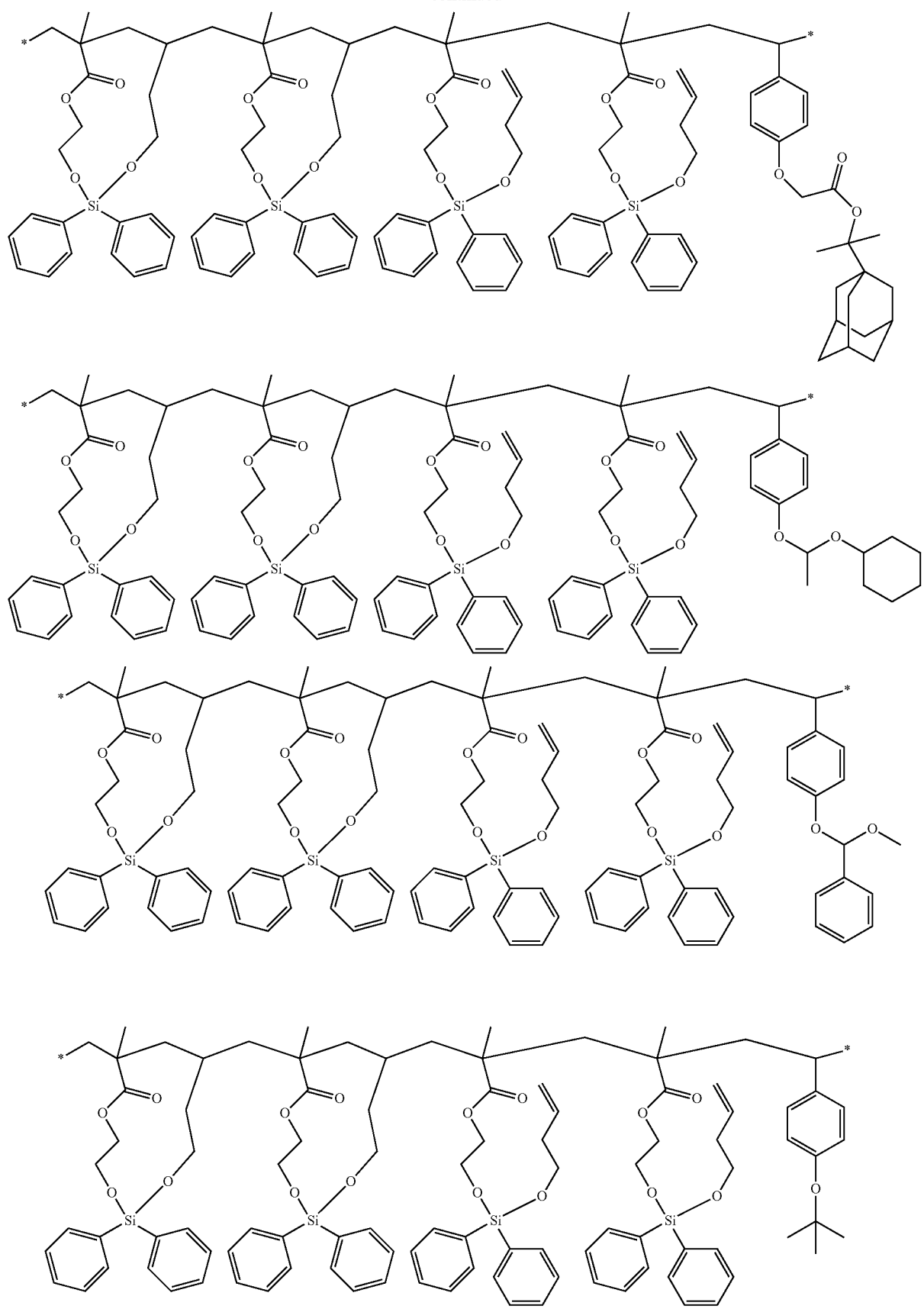

-continued

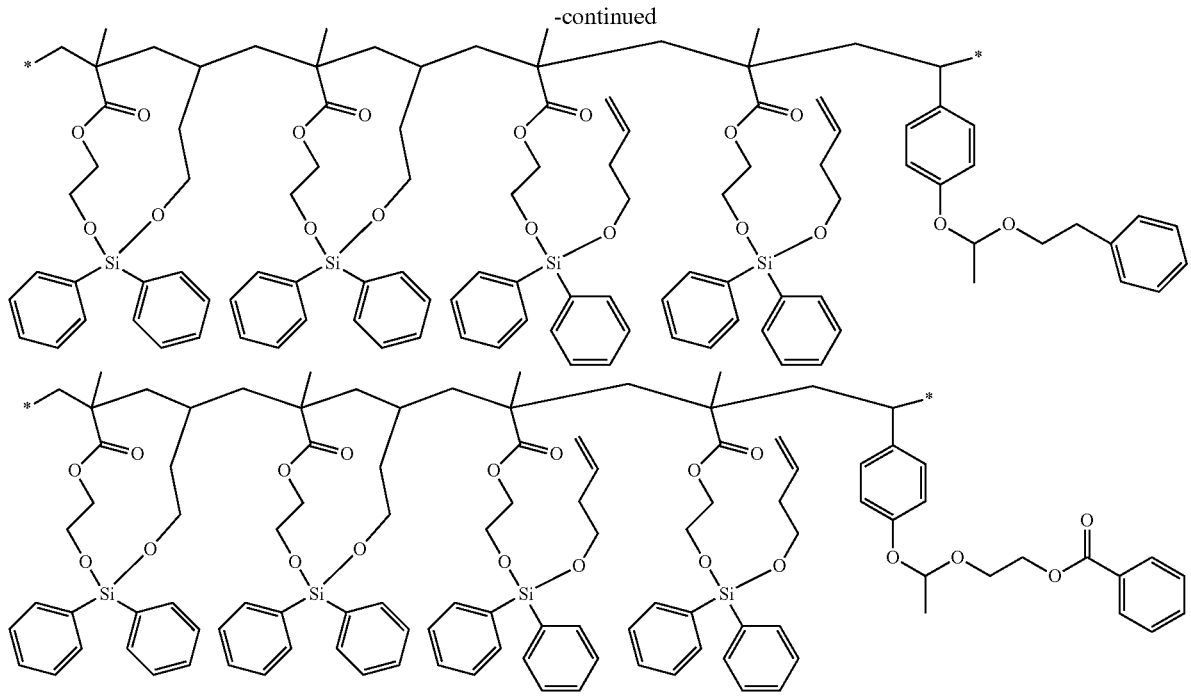

The highly sequenced, high-sensitive and high-contrast photoresist resin has one or more of the following properties:
1) polymer dispersion index (PDI)≤1.80;
2) The molecular weight is 3000~12000;
3) Glass transition temperature $T_g$ is 0~150° C.

In another preferred embodiment, the described copolymer is the copolymer prepared in the example.

By adding one or more photo-acid sensitive monomers (b1) and a polymerizable monomer containing photo-acid generator groups (b2) into the radical copolymerization with the above bi-functional monomer, the conventional acid-labile groups and PAG unit are incorporated into the blocks of unreacted olefinic double bonds (a2) in bi-polymer C1, yielding copolymer C3 comprising three or more components:

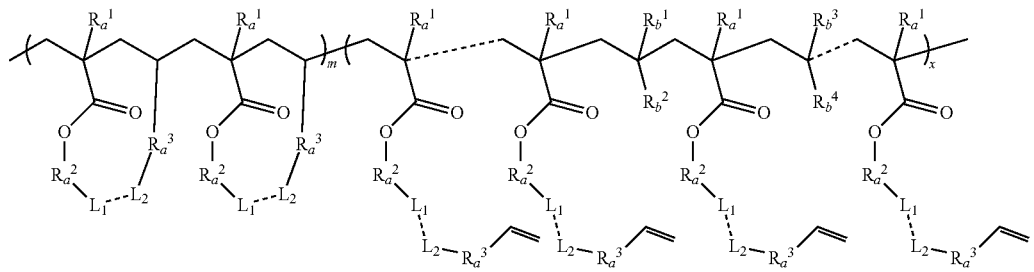

(C3)

wherein,
m is selected from the group consisting of 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5 and 20;
x is an integer selected from 1 to 15;
$R_a^1$, $R_b^1$ and $R_b^3$ are each independently selected from the group consisting of H, C1-C6 alkyl, and halogenated C1-C6 alkyl;
each $R_a^2$ is independently selected from the group consisting of C1-C6 alkylene and C3-C8 cycloalkylene;
each $R_a^3$ is independently selected from the group consisting of C1-C6 alkylene;
each $R_b^2$ is independently selected from the group consisting of:

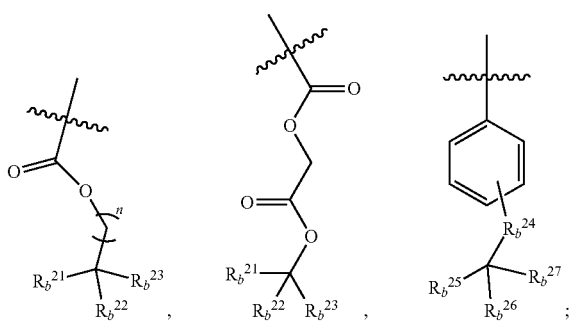

$R_b^{21}$, $R_b^{22}$, and $R_b^{23}$ are each independently selected from the group consisting of none, H, C1-C6 alkyl, adamantyl, OH-substituted adamantyl, and C3-C8 cycloalkyl, or $R_b^{21}$, $R_b^{22}$, and $R_b^{23}$ together form a structure selected from the group consisting of

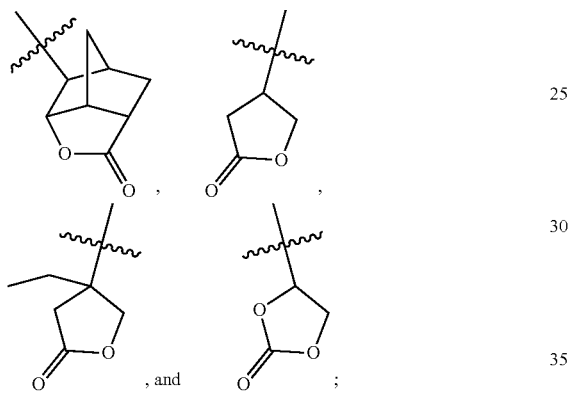

$R_b^{24}$ is selected from the group consisting of —O— and —(C=O)—;

$R_b^{25}$, $R_b^{26}$, and $R_b^{27}$ are each independently selected from the group consisting of none, hydrogen, =O, C1-C6 alkyl, C1-C6 alkoxy, —(C=O)—O—C(C1-C6 alkyl)$_2$-adamantyl, —O—(C3-C8 cycloalkyl), —O—(C1-C6 alkylene)-(C6-C10 aryl), C6-C10 aryl, and —O—(C1-C6 alkylene)-O—(C=O)—(C6-C10 aryl);

$R_b^4$ is a combination of anions and cations, where the anion is selected from the group consisting of:

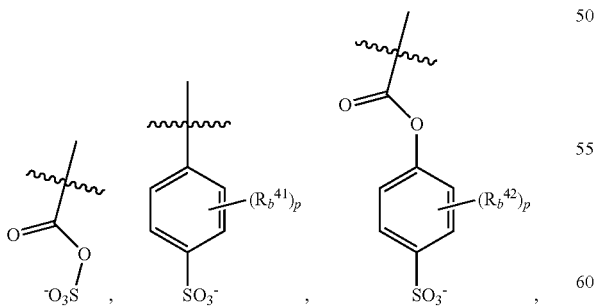

$R_b^{41}$, $R_b^{42}$ are each independently selected from the group consisting of hydrogen, halogenated or unsubstituted $C_1$-$C_{15}$ linear or branched alkyl, substituted or unsubstituted $C_1$-$C_{15}$ linear or branched alkoxy; the substituted means being substituted by a substituent selected from the group consisting of halogen, hydroxyl, carbonyl, amino, amide, ether bonded oxygen atom, and lactone structure; p is an integer from 0 to 5;

the cation is selected from the group consisting of iodonium salts (B1) and sulfonium salts (B2) shown as follows:

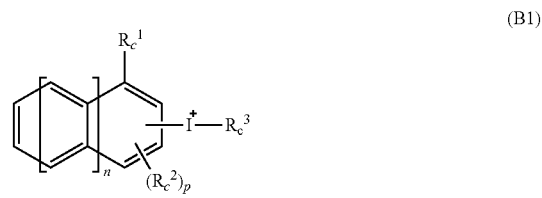

(B1)

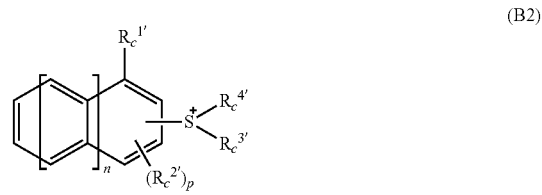

(B2)

in formulas (B1) and (B2), $R_c^1$, $R_c^2$, $R_c^3$, $R_c^{1'}$, $R_c^{2'}$, $R_c^{3'}$, and $R_c^{4'}$ each independently represent substituents;

$R_c^1$, $R_c^{1'}$ are selected from the group consisting of hydrogen, halogen, unsubstituted or hydroxyl or halogen substituted $C_1$-$C_{10}$ straight or branched alkyl, unsubstituted or hydroxyl or halogen substituted $C_1$-$C_{10}$ straight or branched alkoxy, unsubstituted or hydroxyl or halogen substituted $C_1$-$C_{10}$ straight or branched alkoxy carbonyl; the halogen is selected from the group consisting of fluorine, chlorine, bromine and iodine;

$R_c^2$ and $R_c^{2'}$ are selected from the group consisting of hydrogen, halogenated or unsubstituted $C_1$-$C_{15}$ linear or branched alkyl, substituted or unsubstituted $C_1$-$C_{15}$ linear or branched alkoxy; the substituted means being substituted by a substituent selected from the group consisting of halogen, hydroxyl, carbonyl, amino, amide, ether bonded oxygen atom, and lactone structure;

$R_c^3$, $R_c^{3'}$, and $R_c^{4'}$ are selected from the group consisting of substituted or unsubstituted $C_1$-$C_{11}$ linear or branched alkyl, substituted or unsubstituted phenyl, and substituted or unsubstituted naphthyl; the substituted means being substituted by a substituent selected from the group consisting of halogen, hydroxyl, carbonyl, amino, amide, and lactone structure; $R_c^{3'}$ and $R_c^{4'}$ are optionally combined to form a divalent group;

n is 0, 1, 2 or 3;

p is 0, 1, 2, 3, 4 or 5;

each $L_1$—$L_2$ is independently selected from the group consisting of:

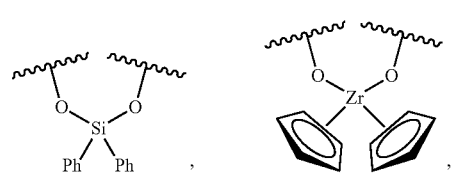

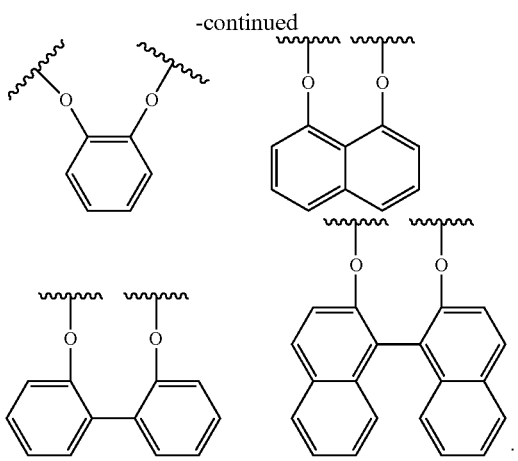

In another preferred embodiment, the described copolymer is the copolymer prepared in the example.

By adding one or more photo-acid sensitive monomers (b1) into the radical copolymerization with the bi-functional monomers comprising vinyl ether and (meth)-acrylate, the conventional acid-labile groups are incorporated into the blocks of unreacted vinyl double bonds (a4) in bi-polymer C1, yielding copolymer C4, or copolymer C5 with directly bonded (a3, paired cyclic structure) and (b1):

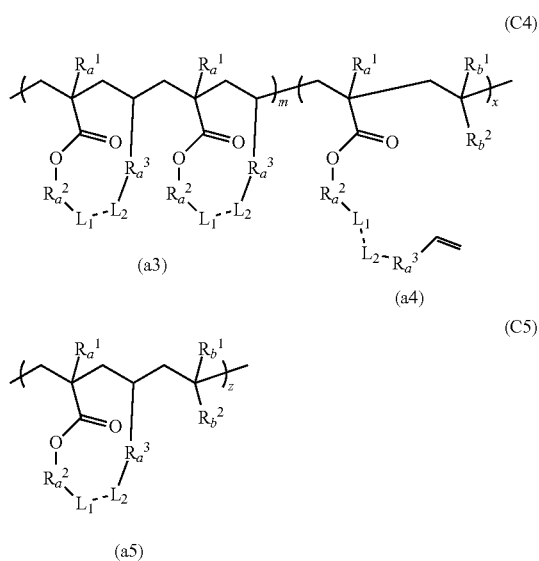

wherein, m is selected from the group consisting of 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5 and 20;

x is an integer selected from 1 to 20;

z is an integer selected from 1 to 50;

$R_a^1$, $R_b^1$ are each independently selected from the group consisting of H, C1-C6 alkyl, and halogenated C1-C6 alkyl;

each $R_a^2$ is independently selected from the group consisting of C1-C6 alkylene and C3-C8 cycloalkylene;

each $R_a^3$ is independently selected from the group consisting of —(C1-C6 alkylene)-O—, and —(C1-C6 alkylene)-O—(C=O)—;

The structure of $R_b^2$ and L1-L2 are the same as above and will not be described again here.

In another preferred embodiment, the described copolymer is the copolymer prepared in the example.

The beneficial effect of this invention is that:

1) A type of sequenced dual-tone photoresist resin is obtained in this invention. The described photoresist resin contains hydrophobic olefin—(methyl) acrylate—olefin sequence, which shows positive-tone chemically amplified performance dispensing with the need of conventional acid-labile groups (so-called sequence-sensitized effect). On the other hand, the olefinic double bonds attached as side chains could be crosslinked with crosslinker and photoinitiator, and thus could be used as a crosslinked negative-tone photoresist to yield lithographic patterns with high contrast.

2) By incorporating conventional photo-acid sensitive monomers, a new type of highly sequenced dual-tone photoresist resin with precisely distributed photoreaction sites (photo-acid sensitive monomers/cross-linked sites) is extended, which can simultaneously possess a variety of excellent properties such as high sensitivity, high contrast and high etching resistance. Bi-functional monomer was polymerized with one or two photo-acid sensitive monomers by free radical polymerization. The amount of incorporated photo-acid sensitive monomers/cross-linked sites is controlled by adjusting the monomer concentration and feed ratio, constructing precisely arranged photoreaction sites on the main chain. Therefore, when this resin is applied as a positive-tone chemically amplified photoresist, it possesses two deprotection sites: "sequence-sensitized" fragment and photo-acid sensitive groups, and thus could be rapidly developed after exposure to form a high-contrast pattern even if the content of photo-acid sensitive monomer is rather low. When this resin is applied as a cross-linked negative-tone photoresist, low roughness and high modulus lithographic patterns can be obtained due to the sequenced arranged cross-linked sites. Besides, the incorporation of Si, metal or several benzene and aliphatic rings with high carbon density into the bridging group L also gives the resin good etching resistance.

3) By further incorporating polymerizable monomer containing photoacid generator groups, sequenced polymerPAG could be obtained. The polymerPAG shows positive-tone chemically amplified photoresist performance without adding additional PAG agent, yielding lithographic patterns with high contrast and high quality.

To solve the second technical problem, the technical solution of the invention is:

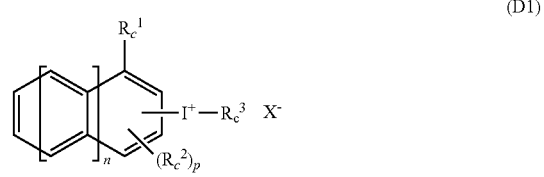

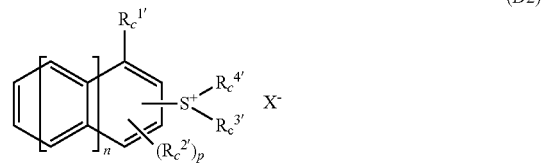

in formulas (D1) and (D2), $R_c^1$, $R_c^2$, $R_c^3$, $R_c^{1'}$, $R_c^{2'}$, $R_c^{3'}$, and $R_c^{4'}$ each independently represent substituents;

$R_c^1$, $R_c^{1'}$ are selected from the group consisting of hydrogen, halogen, unsubstituted or hydroxyl or halogen substituted $C_1$-$C_{10}$ straight or branched alkyl, unsubstituted or hydroxyl or halogen substituted $C_1$-$C_{10}$ straight or branched alkoxy, unsubstituted or hydroxyl or halogen substituted $C_1$-$C_{10}$ straight or branched alkoxy carbonyl; the halogen is selected from the group consisting of fluorine, chlorine, bromine and iodine;

$R_c^2$ and $R_c^{2'}$ are selected from the group consisting of hydrogen, halogenated or unsubstituted $C_1$-$C_{15}$ linear or branched alkyl, substituted or unsubstituted $C_1$-$C_{15}$ linear or branched alkoxy; the substituted means being substituted by a substituent selected from the group consisting of halogen, hydroxyl, carbonyl, amino, amide, ether bonded oxygen atom, and lactone structure;

$R_c^3$, $R_c^{3'}$, and $R_c^{4'}$ are selected from the group consisting of substituted or unsubstituted $C_1$-$C_{11}$ linear or branched alkyl, substituted or unsubstituted phenyl, and substituted or unsubstituted naphthyl; the substituted means being substituted by a substituent selected from the group consisting of halogen, hydroxyl, carbonyl, amino, amide, and lactone structure; $R_c^{3'}$ and $R_c^{4'}$ are optionally combined to form a divalent group;

n is 0, 1, 2 or 3;

p is 0, 1, 2, 3, 4 or 5;

$X^-$ represents a non-nucleophilic anion, which can be sulfonate anion or disulfonyl amide anion and represented by the following formula:

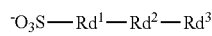

(X1)

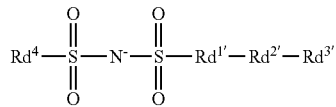

(X2)

In the general formula of (X1) and (X2), $R_d^1$, $R_d^{1'}$ represent substituted (preferably total substitution) $C_1$-$C_6$ linear alkyl and the substitution may be fluorine atom or $C_1$-$C_6$ of fluorinated alkyl, specifically $CF_3$, $C_2F_5$, $C_3F_7$, $C_4F_9$, $C_5F_{11}$, $C_6F_{13}$;

$R_d^2$, $R_d^{2'}$ are linking groups, specifically —COO—, —CO—, —O—, —S—, —SO—, and —SO$_2$—, —CONH—, preferably —CO—, —SO$_2$— and —CONH—;

$R_d^3$, $R_d^{3'}$ are a cyclic groups, including monocyclic aliphatic group, specifically cyclopentyl, cyclohexyl, cycloheptyl and cyclooctyl, or polycyclic aliphatic group, specifically amantadyl, norbornyl, tricyclodecyl, tetracyclodecyl and tetracyclododecyl; or aryl groups, specifically phenyl, naphthalene, phenyl and anthracene, preferably naphthalene;

$R_d^4$ refers to the structurally symmetric substituent of $R_d^{1'}$, $R_d^{2'}$, $R_d^{3'}$.

The component (E) may be one or more of a tertiary amine compound, an amide compound, a quaternary ammonium hydroxide compound and a nitrogen-containing heterocyclic compound.

The component (F) comprises one or more of polysiloxane and/or polyacrylate surfactants, represented by the following formula:

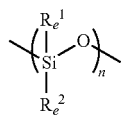

(F1)

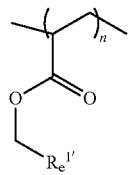

(F2)

In formulas (F1) and (F2), $R_c^1$, $R_c^2$, and $R_c^{1'}$ each independently represent organic groups; wherein $R_c^1$, $R_c^2$ are selected from $C_1$-$C_8$ linear alkyl; $R_c^{1'}$ is selected from substituted or unsubstituted $C_1$-$C_{30}$ linear or branched alkyl, substituted or unsubstituted $C_1$-$C_{30}$ alkoxy and substituted or unsubstituted $C_6$-$C_{30}$ aryl, the substituent in the alkyl, alkoxy or aryl is selected from halogen atoms (preferably fluorine atom).

n represents the molecular number average polymerization degree and is selected from an integer of 5-200 (preferably 10-100, more preferably 20-50).

Component (G) may be ketones, including but not limited to cyclohexanone, methyl n-pentanone; Esters, including but not limited to ethyl lactate, propylene glycol methyl ether acetate, propylene glycol ethyl ether acetate, butyl acetate; Ethers, including but not limited to ethylene glycol monomethyl ether, propylene glycol monomethyl ether, diethylene glycol dimethyl ether; Lactones, including, but not limited to, gamma-butylactone. Among them, ethyl lactate, propylene glycol monomethyl ether acetate, propylene glycol monomethyl ether and their mixtures are preferred.

II. The cross-linked negative-tone photoresist includes the following components: (C) the photoresist resin; (H) photoinitiator; (I) cross-linking agent; (G) solvent.

Further, the concentration of the component (C) is 1-20 wt %, the concentration of the component (H) is 0.5-6 wt % of the concentration of the component (C), and the concentration of the component (I) is 5-60 wt % of the concentration of the component (C).

The component (H) can be a Norrish type I photoinitiator, including alpha-hydroxy ketone photoinitiator, benzoyl acid photoinitiator, acetophenone photoinitiator and acyl phosphine oxide photoinitiator, etc. The representative photoinitiator structure is expressed by the following formula:

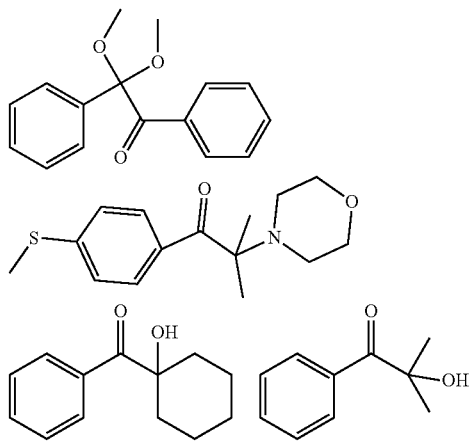

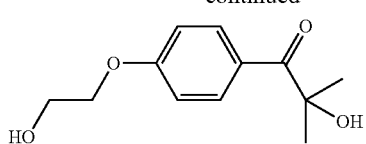
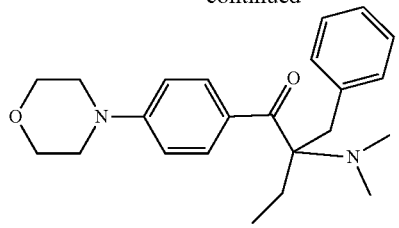
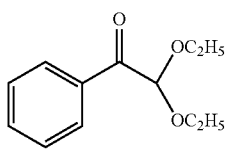
Component (I) is multi-functional thiol cross-linking agent (including bi-, ter- or tetra-functional) or other divinyl compounds. Representative structures of multifunctional thiol and divinyl compounds are expressed by the following formula:
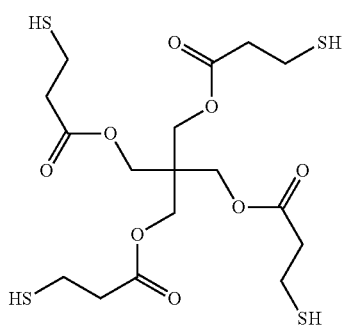 [SMILES: O=C(CCS)OCC(COC(=O)CCS)(COC(=O)CCS)COC(=O)CCS] 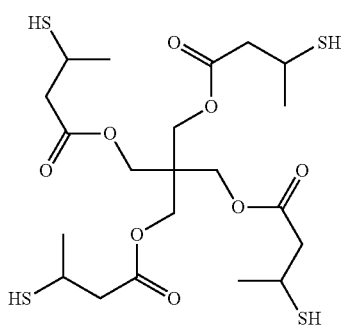 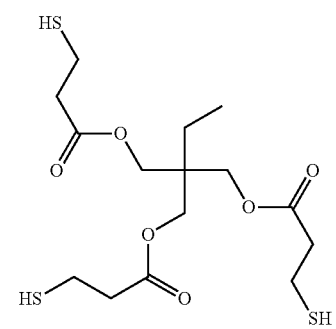
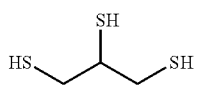 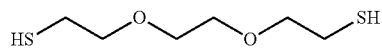 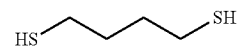
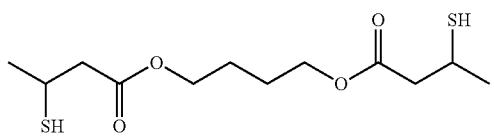
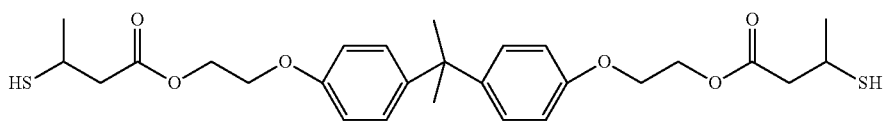
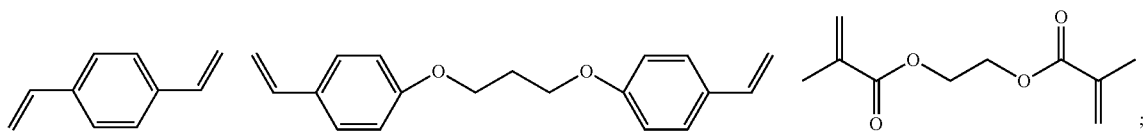

Component (G) may be ketones, including but not limited to cyclohexanone, methyl n-pentanone; Esters, including but not limited to ethyl lactate, propylene glycol methyl ether acetate, propylene glycol ethyl ether acetate, butyl acetate; Ethers, including but not limited to ethylene glycol monomethyl ether, propylene glycol monomethyl ether, diethylene glycol dimethyl ether; Lactones, including, but not limited to gamma-butylactone. Among them, ethyl lactate, propylene glycol monomethyl ether acetate, propylene glycol monomethyl ether and their mixtures are preferred.

The beneficial effects of the invention are as follows: a high-sensitive dual-tone photoresist, which is composed of a highly sequenced resin is prepared. When it is used as a positive-tone chemically amplified photoresist, the resin in the exposed region under ultraviolet irradiation is soluble in an alkaline developer. When it is used as a cross-linked negative-tone photoresist, the resin in the exposed region under ultraviolet light will be cross-linked and turned insoluble in organic developer. Moreover, high contrast images with good etching resistance could be obtained on the photoresist film when it is used in lithography process, which is conducive to the subsequent image transfer. The dual-tone photoresist is suitable for 248 nm (KrF), 193 nm (ArF) and extreme ultraviolet (EUV) lithography processes.

To solve the third technical problem, the technical solution of the invention is:

I. A preparation method of the above chemically amplified photoresist comprising the following steps:
1) adding the photolithographic resin, photoacid generator, acid diffusion terminator and surfactant to the solvent (specially, for resin C3, no additional PAG is needed);
2) mixing and stirred at 15-60° C. for 6-72 h to obtain the chemically amplified photoresist.

II. A method for preparing the cross-linked negative photoresist comprising the following steps:
1) adding the photolithographic resin, the photoinitiator and the cross-linking agent into the solvent;
2) mixing and stirring at 15-50° C. for 6-72 h to obtain the cross-linked negative photoresist.

To solve the fourth technical problem, the technical solution of the invention is:

I. An application method for the chemically amplified photoresist comprising the following steps:
1) coating the chemically amplified photoresist on the substrate;
2) baking the coated photoresist once to remove the solvent;
3) exposing the photoresist removing the solvent;
4) baking the photoresist being exposed again;
5) developing the photoresist after secondary baking with an alkaline developer to obtain a photolithographic film.

II. An application method for the cross-linked negative photoresist of the first aspect of the invention6, including the steps:
1) coating the photoresist as described above on the substrate;
2) baking the coated photoresist once to remove the solvent;
3) exposing the photoresist removing the solvent;
4) developing the photoresist after exposing with an organic solvent to obtain a photolithographic pattern.

In another preferred embodiment, the method also includes the following steps:

5) cleaning the residual photoresist with trifluoroacetic acid, and then neutralizing with alkaline developer to obtain a clean silicon plate.

The purpose of this invention is to provide a kind of bi-functional monomers and their corresponding polymers. On this basis, to further provide a kind of highly sequenced, high-sensitive and high-contrast dual-tone photoresist resin with precisely arranged photoreaction sites (photo-acid sensitive monomers/cross-linked sites). Furthermore, to provide a chemically amplified photoresist (positive-tone) and cross-linked negative-tone photoresist composed of the above mentioned dual-tone resin and their preparation and application method, and the stripping method of cross-linked negative-tone photoresist.

The dual-tone photoresist resin described in this invention is obtained by copolymerizing the bi-functional monomer and photo-acid sensitive monomers by free radical copolymerization method, and (1) methacrylate or acrylate, (2) acrylate or olefin or vinyl ether and (3) photo-acid sensitive monomers were orderly incorporated. As a result, the photoresist resin could rapidly be dissolved in an alkaline developer and form high-contrast lithographic patterns with rather low amount of photo-acid sensitive monomers. At the same time, acrylate or olefin or vinyl ether that was not inserted into resin backbone can be used as ordered cross-linked sites to form cross-linked negative-tone photoresist. Different from traditional photoresist resin, this invention provides a photoresist resin containing sequenced ternary and quaternary repeated units, which realizes the designated introduction of the photo-acid sensitive monomer/cross-linked sites. When it is applied as a positive-tone chemically amplified photoresist, even with rather low photo-acid sensitive monomer content can be soluble in an alkaline developer. When it is applied as a cross-linked negative-tone photoresist, lithographic patterns with low roughness and high modulus can be obtained. Meanwhile, the introduction of Si, metal or several high carbon density benzene rings or aliphatic rings into the bridging group L of the bi-functional monomer can improve the etching resistance of the resulting photoresist resin.

Based on the resins described above, chemically amplified positive-tone photoresist can be obtained by adding a small molecule photo-acid generator, a quencher and a surfactant. A crosslinked negative-tone photoresist can be obtained by adding a cross-linker and a photoinitiator. Such dual-tone photoresist can be applicated in 248 nm (KrF), 193 nm (ArF) and extreme ultraviolet (EUV) lithography. The highly ordered low-molecular weight photoresist resin, with precise and controllable photochemical reaction sites, is expected to reduce the line width roughness (LER) of lithographic patterns, which means it is expected to be used in the next generation lithography process demanding higher resolution. Such resins also process good etching resistance, which is conducive to subsequent pattern transfer.

This invention relates to a resist composition and a resist pattern forming process, and more particularly to a dual-tone resist composition comprising a highly sequenced copolymer containing precisely arranged photoreaction sites. Dual-tone resist refers to chemically amplified resist (positive-tone) and easily strippable cross-linked resist (negative tone). The dual-tone resist composition is sensitive to high-energy radiation such as UV, deep UV, EUV, X-ray, γ-ray, synchrotron radiation and e-beam, and especially suited for use in the exposure step of irradiating high-energy radiation, typically deep-UV, EUV or e-beam to form high-contrast patterns.

Compared with the existing techniques, this invention has the following main advantages:

The resist based on the photoresist resin has excellent lithographic and stripping performance.

In order to explain the technical content, purpose and effect of the invention in detail, the following embodiments are given in combination with instructions and attached figures. It should be noted that these embodiments are only intended to illustrate but not to limit the scope of the invention. If the experimental methods in the following embodiments were not specially noted, then follow the conventional conditions or as recommended by the vendors. Percentage and fraction are calculated by weight unless otherwise stated.

Unless otherwise defined, all professional and scientific terms used herein have the same meaning as those familiar to those skilled in the field. In addition, any method or material similar or same to the content recorded may be applied to the method of the invention. The better implementation methods and materials described in this invention are for demonstration purposes only.

This invention contains ArF and KrF photoresist monomers. The former contains adamantane and other multi-carbon aliphatic ring or lactone structures. Since the following Embodiments cover adamantane, then the other multi-carbon aliphatic ring and lactone structures can be derived. The latter contains tBOC group and/or acetal group and other protected phenolic hydroxyl groups. In the following embodiments, tert-butoxy and phenolic ester groups are covered and the acetal structure can also be derived.

Examples 1-3: Synthesis of Bi-Functional Monomers A1-A3

| Bi-functional monomer | | Structural formula |
| --- | --- | --- |
| Example 1 | A1 | (structure shown) |
| Example 2 | A2 | (structure shown) |
| Example 3 | A3 | (structure shown) |

Synthesis of Bi-functional Monomer A1

2-hydroxyethylmethacrylate (3.6 mL, 30 mmol) was dissolved in 20 mL of DCM under an argon atmosphere, and added dropwise to the solution containing 6.3 mL (30 mmol) diphenyl dichlorosilane, 5 g imidazole (72 mmol) and 40 mL of DCM at 0° C. The resulting solution was slowly warm to room temperature and stirred overnight. Then a solution containing 3.6 mL of 2-hydroxyethyl acrylate (30 mmol) and 20 mL of DCM was added dropwise to the mixture at 0° C., and the resulting solution was again slowly warm to room temperature and stirred overnight. The solution was washed with $NaHCO_3$ solution three times and then NaCl solution. The organic layer was separated and dried over anhydrous $MgSO_4$, concentrated under reduced pressure to give 11.63 g colorless oily liquid with a yield of 91%.

Figure 1:
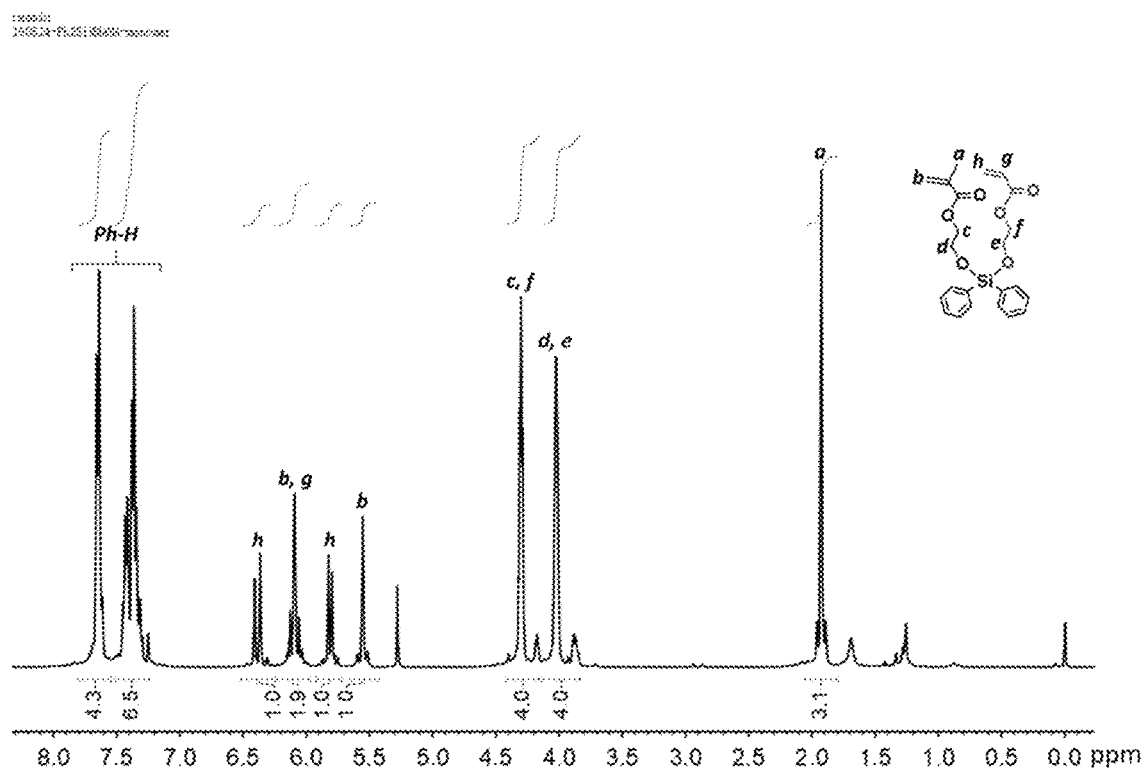
FIG. 1 shows the $^1$H NMR spectrum of the bi-functional monomer A1 obtained in Example 1.

FIG. 1 shows the $^1$H NMR spectrum of bi-functional monomer A1 obtained in Example 1.

$^1$H NMR ($CDCl_3$, 400 MHz, ppm): 7.65 (d, 4H), 7.45-7.30 (m, 6H), 6.39 (d, 1H), 6.10 (t, 1H), 6.09 (s, 1H), 5.81 (d, 1H), 4.32-4.29 (m, 4H), 4.04-4.01 (m, 4H), 1.93 (s, 3H).

Synthesis of Bi-functional Monomer A2

The synthesis method was the same as Example 1, in which the 2-hydroxyethyl acrylate was replaced with ethylene glycol vinyl ether to obtain 6.8 g of the product with yield of 57%.

Figure 2:
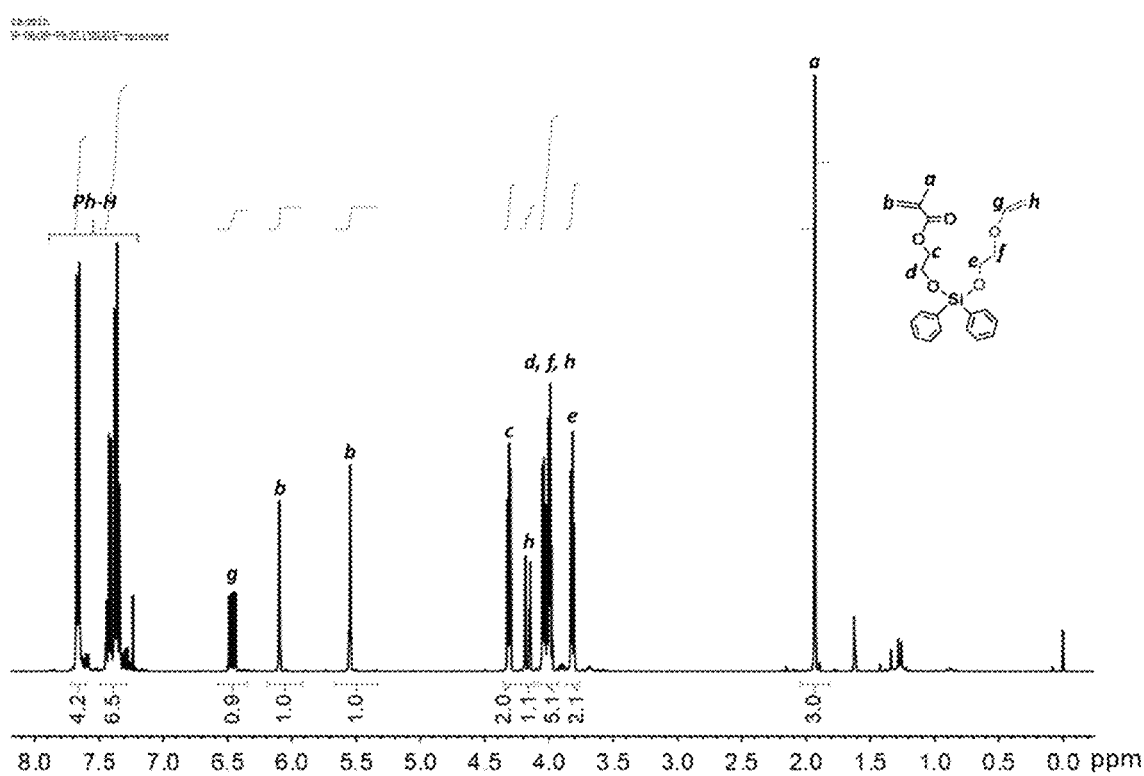
FIG. 2 shows the $^1$H NMR spectrum of the bi-functional monomer A2 obtained in Example 2.

FIG. 2 shows the $^1$H NMR spectrum of the bi-functional monomer A2 obtained in Example 2.

$^1$H NMR ($CDCl_3$, 400 MHz, ppm): 7.67 (d, 4H), 7.45-7.26 (m, 6H), 6.47 (dd, 1H), 6.10 (s, 1H), 5.55 (s, 1H), 4.31 (t, 2H), 4.18 (m, 1H), 4.14 (m, 1H), 4.05-3.98 (m, 4H), 3.82 (t, 2H), 1.93 (s, 3H).

Synthesis of Bi-functional Monomer A3

The synthesis method was the same as Example 1, by replacing 2-hydroxyethyl acrylate with 3-butene-1-alcohol to obtain 6.1 g of the product with yield of 53%.

Figure 3:
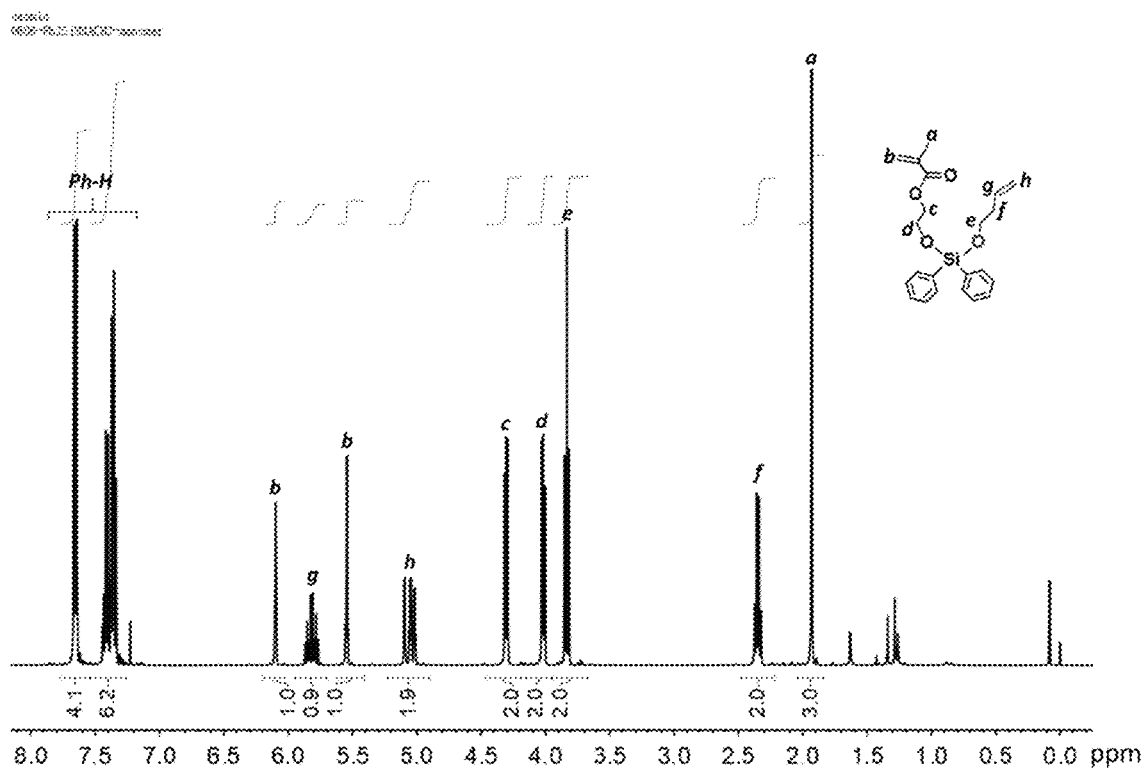
FIG. 3 shows the $^1$H NMR spectrum of the bi-functional monomer A3 obtained in Example 3.

FIG. 3 shows the $^1$H NMR spectrum of the bi-functional monomer A3 obtained in Example 3.

$^1$H NMR ($CDCl_3$, 400 MHz, ppm): 7.65 (d, 4H), 7.44-7.30 (m, 6H), 6.10 (s, 1H), 5.87-5.77 (m, 1H), 5.55 (s, 1H), 5.10-4.95 (m, 1H), 4.31 (t, 2H), 4.02 (t, 2H), 3.83 (t, 2H), 2.35 (q, 2H), 1.93 (s, 3H).

Example 4: Synthesis of a Highly Sequenced Photoresist Resin B3 by Free Radical Polymerization In a reaction tube, 0.38 g monomer A3 synthesized in Example 3 and 6.6 mg azodiisobutyronitrile (AIBN) were dissolved in 20 mL of N, N-dimethylformamide (DMF) under nitrogen atmosphere. The solution was degassed via three freeze-pump-thaw cycles and stirred at 60~90° C. for 8 h. The reaction was quenched by rapid cooling with liquid nitrogen, and the resulting polymer was precipitated into methanol, collected through centrifugation and dried in vacuo for 24 h at 40° C. 0.24 g polymer was obtained. The molecular weight of polymer measured by GPC was 1.3×$10^4$, the molecular weight distribution (PDI) was 1.45.

Figure 4:
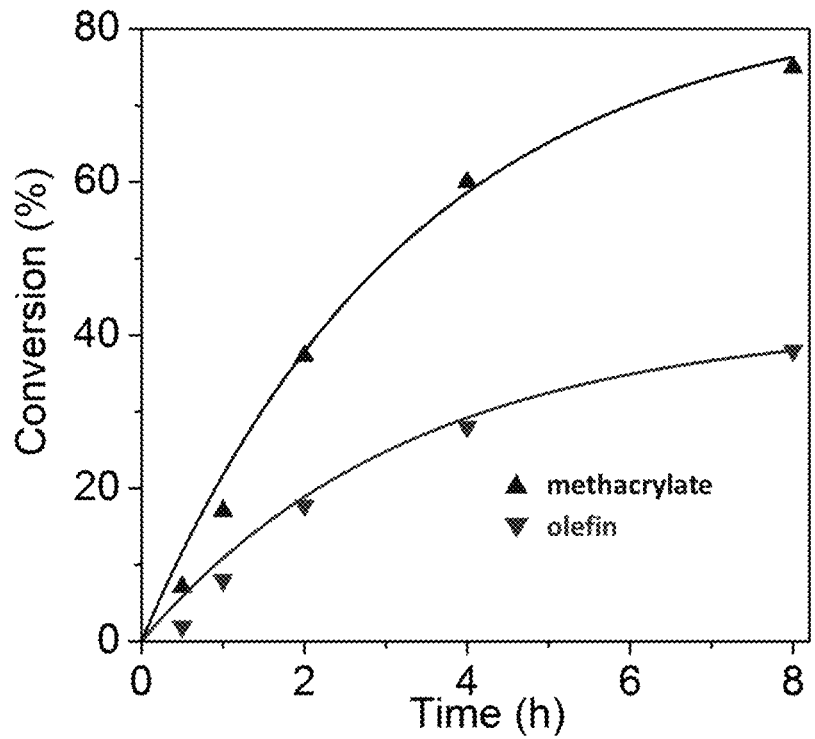
FIG. 4 shows the conversion rates of the two types of carbon-carbon double bonds in bi-functional monomer A3 at different polymerization times in Example 4.

FIG. 4 shows the conversion curves of the two kinds of monomer carbon-carbon double bonds in Example 4.

It can be seen from FIG. 4 that the two kinds of monomers are consumed simultaneously at different polymerization time.

Figure 5:
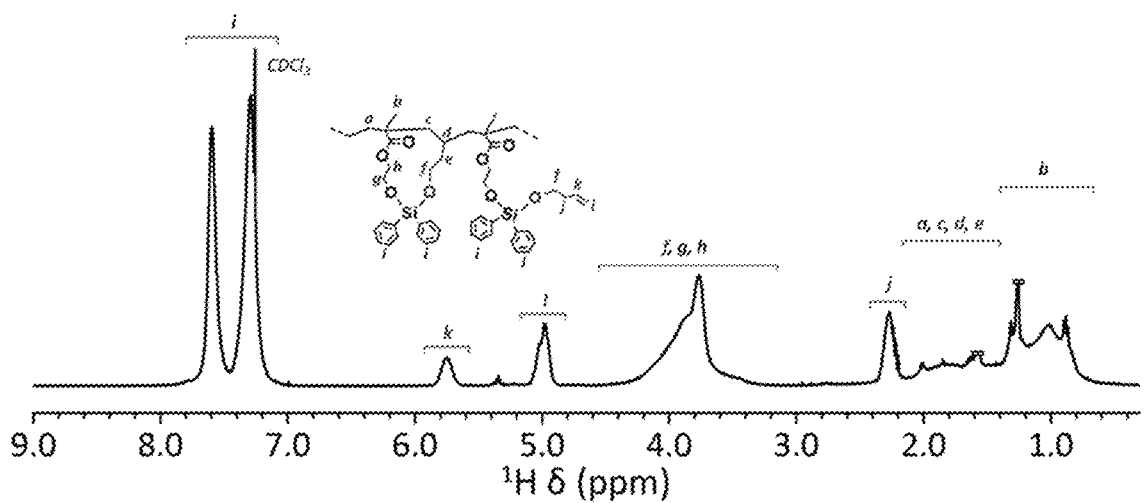
FIG. 5 shows the $^1$H NMR spectrum of the copolymer obtained in Example 4.

FIG. 5 shows the $^1$H NMR spectrum of the copolymer obtained in Example 4.

It can be seen from FIG. 5 that the compositional ratio of methacrylate and olefin monomer in the copolymer is 2:1, which means half of the olefin monomer was polymerized into the polymer main chain while another half remained unreacted and attached as side chains. Copolymer B3 of methacrylate and olefin is expressed by the following formula:

into methanol, collected through centrifugation and dried in vacuo for 24 h at 40° C. to yield a white powder. The molecular weight of the polymer measured by GPC was 1.3×$10^4$, the molecular weight distribution (PDI) was 3.18. The structures of monomer A1 and M1 are as follows:

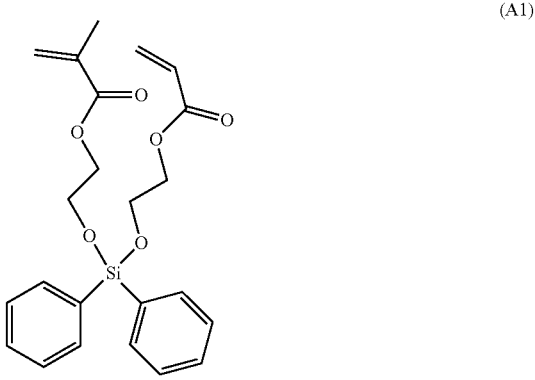

(A1)

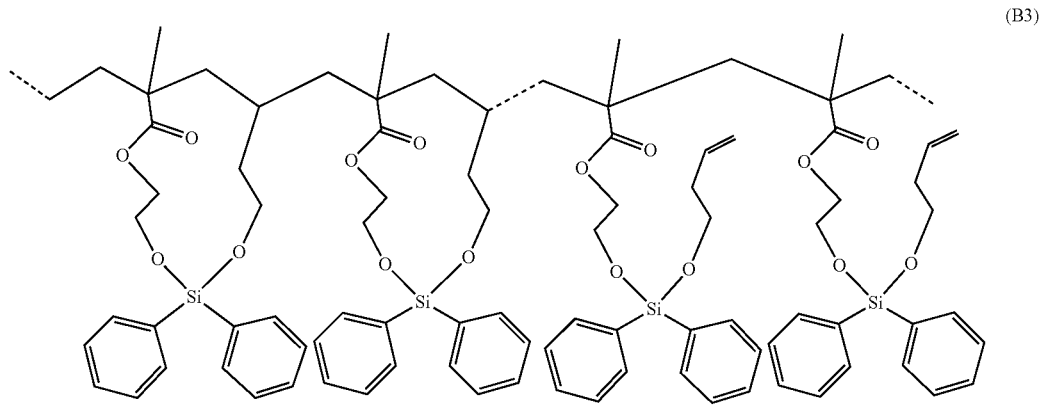

(B3)

Specially, the photoresist resin B3 described above is corresponding to the formula C1 in this invention, where m=8.5, n=17.

Example 5: Synthesis of a Highly Sequenced Photoresist Resin C1 Containing Silicon with High Sensitivity and High Contrast by Free Radical Polymerization In a reaction tube, monomer A1, M1 with protected acidic group and initiator AIBN were dissolved in 10 mL of N, N-dimethylformamide (DMF) at the mole ratio of 25:25:1 under nitrogen atmosphere. The solution was degassed via three freeze-pump-thaw cycles and stirred at 60~90° C. for 24 h. The reaction was quenched by rapid cooling with liquid nitrogen, and the resulting polymer was precipitated -continued

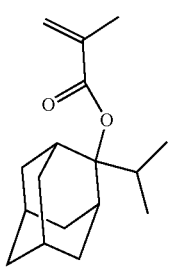

(M1)

Figure 6:
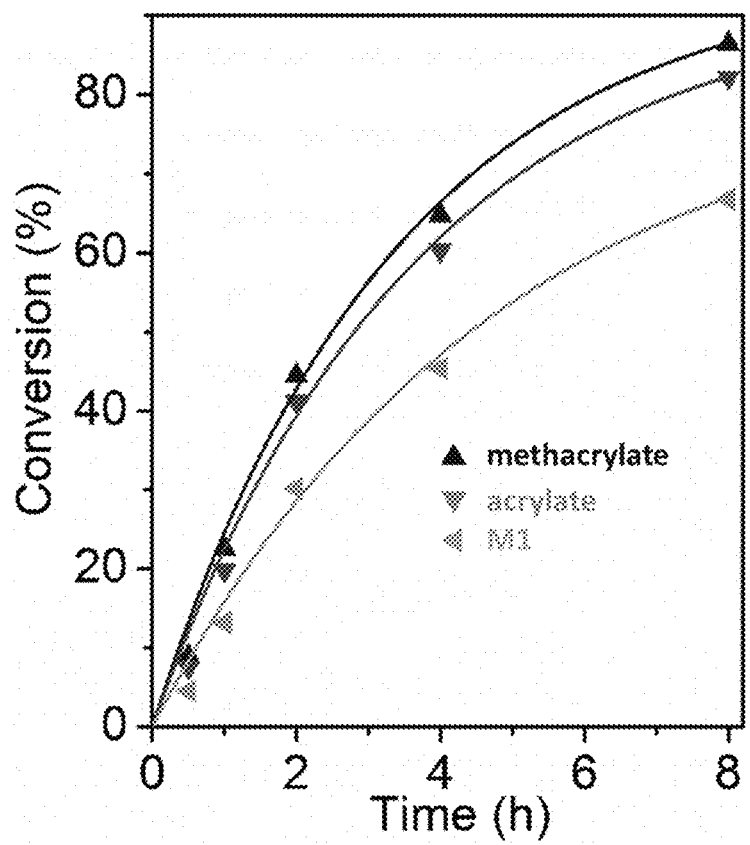
FIG. 6 shows the conversion rates of the three types of carbon-carbon double bonds at different polymerization times in Example 5.

FIG. 6 shows the conversion curves of the three kinds of monomer carbon-carbon double bonds in Example 5. It can be seen from FIG. 6 that the three kinds of monomers are consumed simultaneously at different polymerization time.

Figure 7:
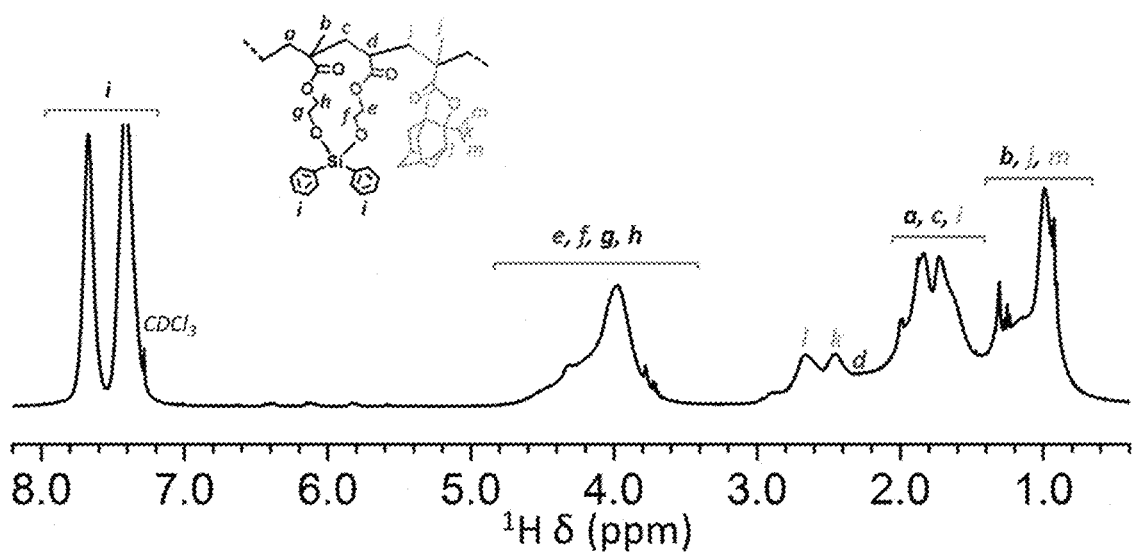
FIG. 7 shows the $^1$H NMR spectrum of the photoresist resin C1 obtained in Example 5.

FIG. 7 shows the $^1$H NMR spectrum of the photoresist resin C1 obtained in Example 5. The peaks at 4.8-3.3 ppm correspond to the hydrogen atoms (8H) of methylene bonded to the ester group in A1. The peaks at 2.60 and 2.28 ppm are from the adamantanyl group (2H) and isopropyl group (1H) in M1, respectively, indicating that both A1 and M1 are incorporated into the copolymer backbone. According to the proportion of the integral of the characteristic peaks in A1 and M1, it can be calculated that the compositional ratio of A1/M1 in C1 is 7:3, in other words, the mole ratio of M1 is 30%.

Since M1 does not homopolymerize under the polymerization conditions, the structure of photoresist resin C1 is as following:

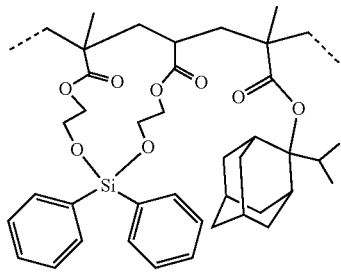

(C1)

Specially, the photoresist resin C1 described above is corresponding to the formula C5 in this invention, where m=9.5, x=19.

Example 6: Synthesis of a Highly Sequenced Photoresist Resin C2 Containing Silicon with High Sensitivity and High Contrast by Free Radical Polymerization In a reaction tube, monomer A2, M1 with protected acidic group and initiator AIBN were dissolved in 10 mL of N, N-dimethylformamide (DMF) at the mole ratio of 25:25:1 under nitrogen atmosphere. The solution was degassed via three freeze-pump-thaw cycles and stirred at 60~90° C. for 24 h. The reaction was quenched by rapid cooling with liquid nitrogen, and the resulting polymer was precipitated into methanol, collected through centrifugation and dried in vacuo for 24 h at 40° C. to yield a white powder. The molecular weight of the polymer measured by GPC was $6.6 \times 10^3$, molecular weight distribution (PDI) was 1.19. The structures of the monomer A2 and M1 are as follows:

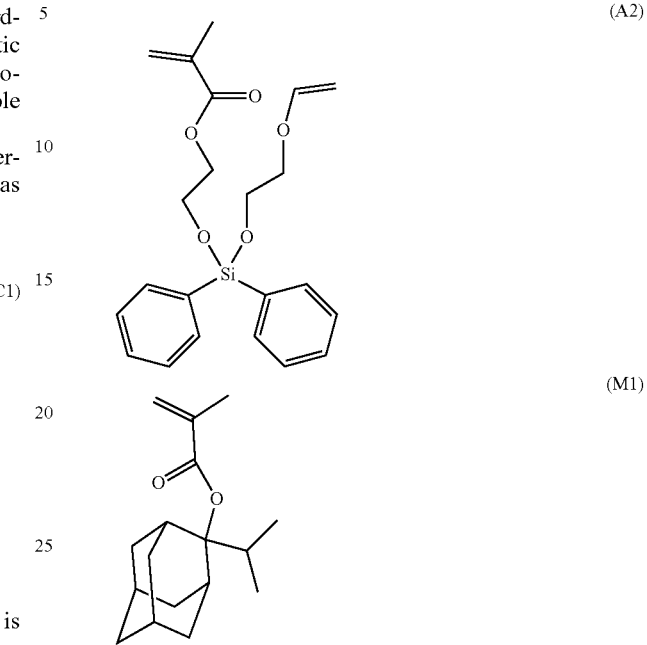

(A2)

(M1)

Figure 8:
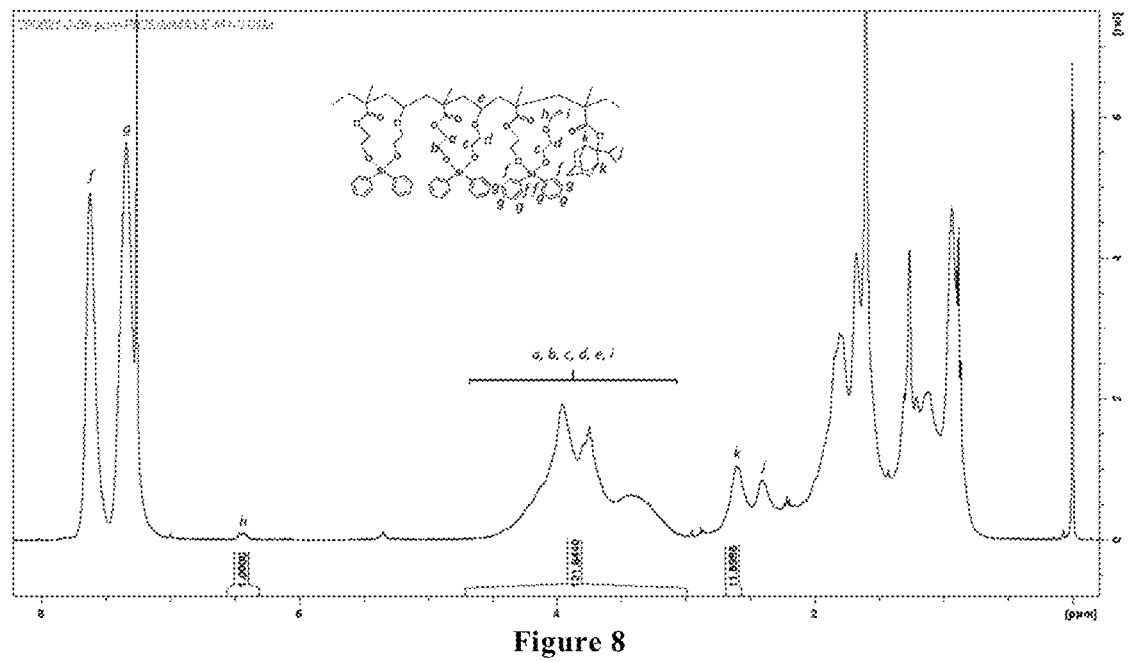
FIG. 8 shows the $^1$H NMR spectrum of the photoresist resin C2 obtained in Example 6.

FIG. 8 shows the $^1$H NMR spectrum of the photoresist resin C2 obtained in Example 6. The peak at 6.44 ppm corresponds to the hydrogen atoms of unreacted carbon-carbon double bonds of vinyl ether on the side chain, and the peaks at 4.71-3.00 ppm are assigned to the hydrogen atoms (9H) of methylene and methine bonded to the oxygen atoms in A2. The peaks at 2.60 and 2.41 ppm are from the adamantanyl group (2H) and isopropyl group (1H) in M1, respectively, indicating that both A2 and M1 are incorporated into the copolymer backbone. According to the proportion of the integral of the characteristic peaks in A2 and M1, it can be calculated that the compositional ratio of A2/M1 in C2 is 5:1, in other words, the mole ratio of M1 is 19%.

Since M1 does not homopolymerize under the polymerization conditions, the structure of photoresist resin C2 is as following:

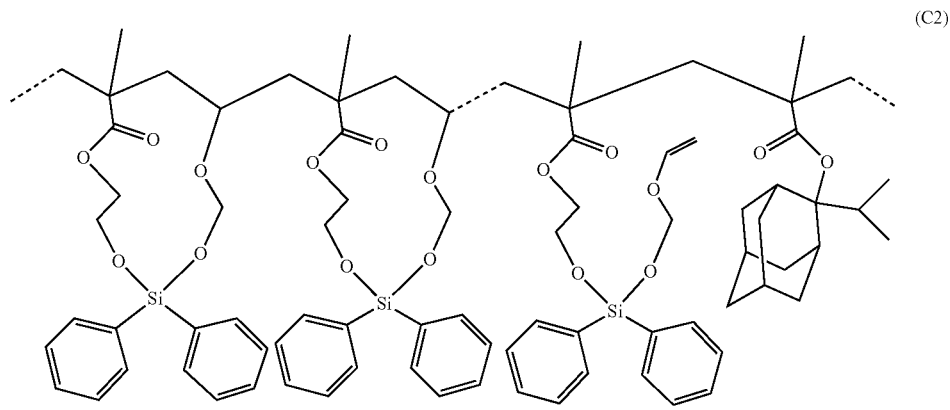

(C2)

Specially, the photoresist resin C2 described above is corresponding to the formula C4 in this invention, where m=6, p=3, x=3.

Example 7: Synthesis of a Highly Sequenced Photoresist Resin C3 Containing Silicon with High Sensitivity and High Contrast by Free Radical Polymerization In a reaction tube, monomer A3, M1 with protected acidic group and initiator AIBN were dissolved in 10 mL of N, N-dimethylformamide (DMF) at the mole ratio of 25:2.5:1 under nitrogen atmosphere. The solution was degassed via three freeze-pump-thaw cycles and stirred at 60~90° C. for 24 h. The reaction was quenched by rapid cooling with liquid nitrogen, and the resulting polymer was precipitated into methanol, collected through centrifugation and dried in vacuo for 24 h at 40° C. to yield a white powder. The molecular weight of polymer measured by GPC was 9.7× $10^3$, molecular weight distribution (PDI) was 1.56. The structures of the monomer A3 and M1 are as follows:

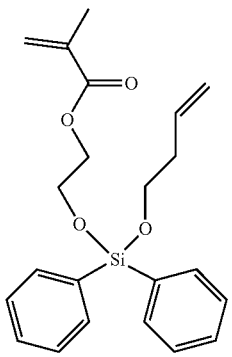

(A3)

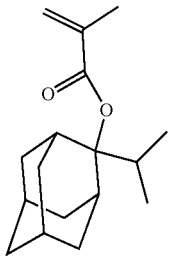

(M1)

Figure 9:
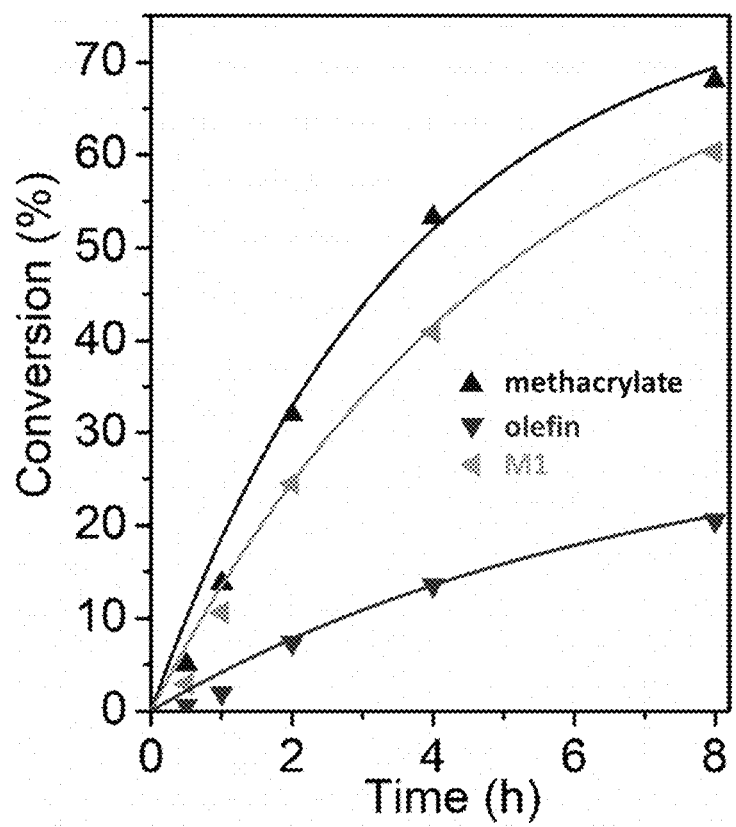
FIG. 9 shows the conversion rates of three types of carbon-carbon double bonds at different polymerization times in Example 7.

FIG. 9 shows the conversion curves of the three kinds of monomer carbon-carbon double bonds in Example 7. It can be seen from FIG. 9 that the three types of monomers are consumed simultaneously at different polymerization time.

Figure 10:
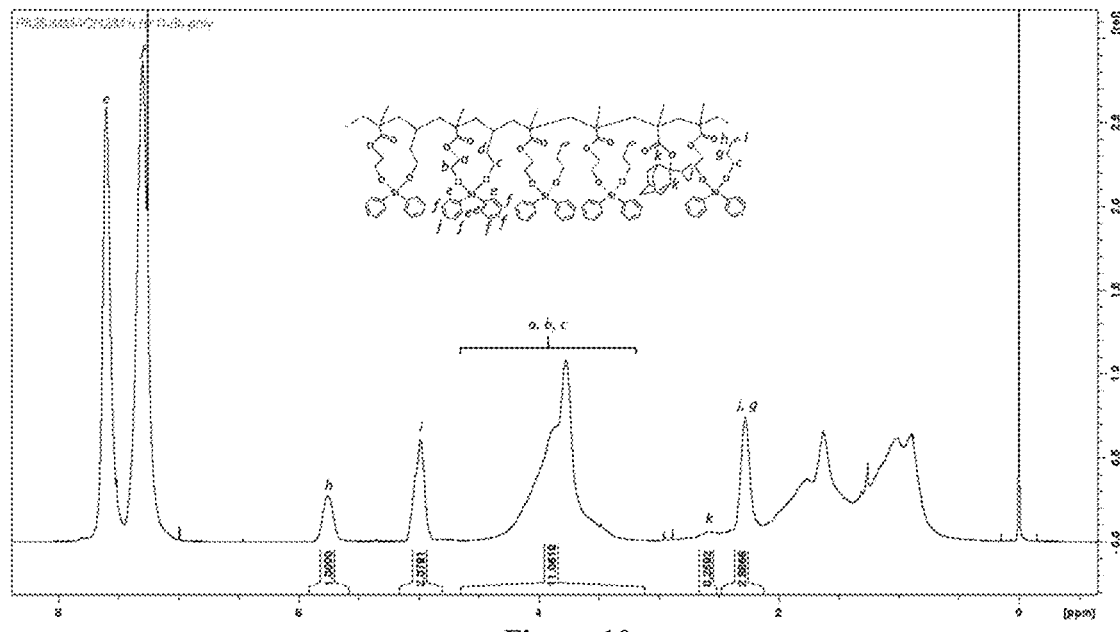
FIG. 10 shows the $^1$H NMR spectrum of the photoresist resin C3 obtained in Example 7.

FIG. 10 shows the $^1$H NMR spectrum of the photoresist resin C3 obtained in Example 9. The peaks at 5.76 and 4.99 ppm correspond to the hydrogen atoms of unreacted carbon-carbon double bonds of olefin on the side chain, and the peaks at 4.65-3.12 ppm are assigned to the hydrogen atoms (6H) of methylene bonded to the oxygen atoms in A3. The peaks at 2.60 and 2.28 ppm are from the adamantanyl group (2H) and isopropyl group (1H) in M1, respectively, indicating that both A3 and M1 are incorporated into the copolymer backbone. According to the proportion of the integral of the characteristic peaks in A3 and M1, it can be calculated that the compositional ratio of A3/M1 in C3 is 94:6, in other words, the mole ratio of M1 is 6%.

Since M1 does not homopolymerize under the polymerization conditions, the structure of photoresist resin C3 is as following:

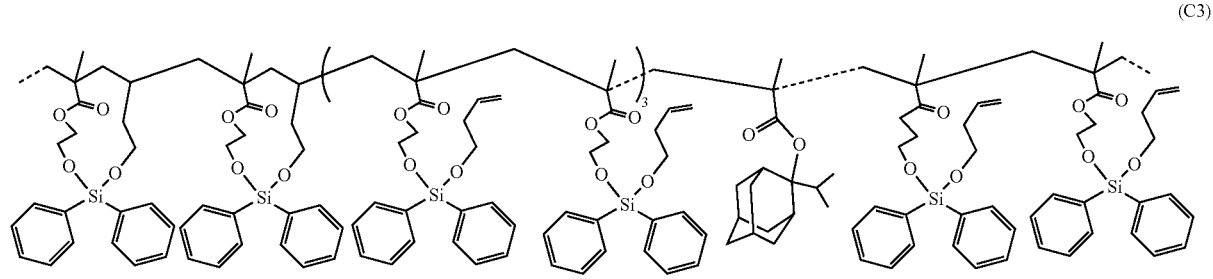

(C3)

Specially, the photoresist resin C3 described above is corresponding to the formula C2 in this invention, where m=4, p=16, x=2.

Example 8: Synthesis of a Highly Sequenced Photoresist Resin C4 Containing Silicon with High Sensitivity and High Contrast by Free Radical Polymerization In a reaction tube, monomer A3, M2 with protected acidic group and initiator AIBN were dissolved in 10 mL of N, N-dimethylformamide (DMF) at the mole ratio of 32:4:1 under nitrogen atmosphere. The solution was degassed via three freeze-pump-thaw cycles and stirred at 60~90° C. for 24 h. The reaction was quenched by rapid cooling with liquid nitrogen, and the resulting polymer was precipitated into methanol, collected through centrifugation and dried in vacuo for 24 h at 40° C. to yield a white powder. The molecular weight of the polymer measured by GPC was 9.5×$10^3$, the molecular weight distribution (PDI) was 1.43. The structures of the monomer A3 and M2 are as follows:

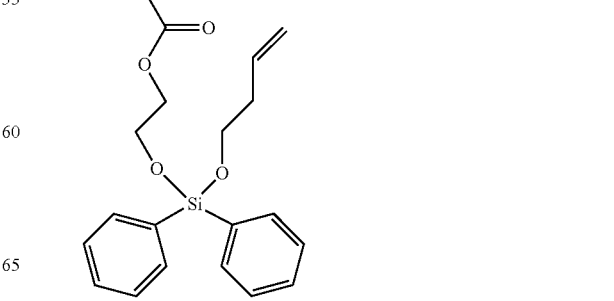

(A3)

-continued

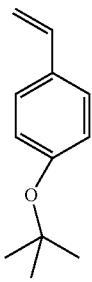
(M2)

Figure 11:
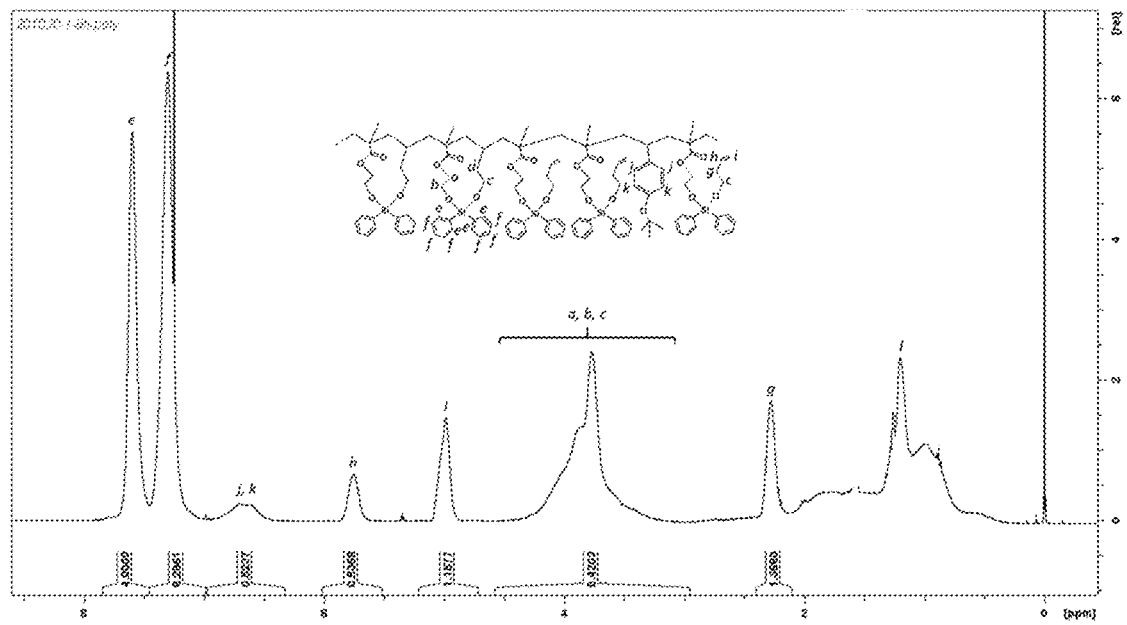
FIG. 11 shows the $^1$H NMR spectrum of the photoresist resin C4 obtained in Example 8.

FIG. 11 shows the ¹H NMR spectrum of the photoresist resin C4 obtained in Example 8. The peaks at 5.76 and 4.99 ppm correspond to the hydrogen atoms of unreacted carbon-carbon double bonds of olefin on the side chain, and the peaks at 7.85-7.46 ppm correspond to the hydrogen atoms of the benzene in the bridging group in A3 (4H). The peaks at 6.98-6.33 ppm are assigned to the hydrogen atoms (4H) of the benzene of M2, indicating that both A3 and M2 are incorporated into the copolymer backbone. According to the proportion of the integral of the characteristic peaks in A3 and M2, it can be calculated that the compositional ratio of A3/M2 in C4 is 88:12, in other words, the mole ratio of M2 is 12%.

Since M2 hardly undergoes homopolymerize under the polymerization conditions, the structure of photoresist resin C4 is as following:

24 h. The reaction was quenched by rapid cooling with liquid nitrogen, and the resulting polymer was precipitated into methanol, collected through centrifugation and dried in vacuo for 24 h at 40° C. to yield a white powder. The molecular weight of the polymer measured by GPC was $1.1 \times 10^4$, molecular weight distribution (PDI) was 1.47. The structures of the monomer A3 and M3 are as follow:

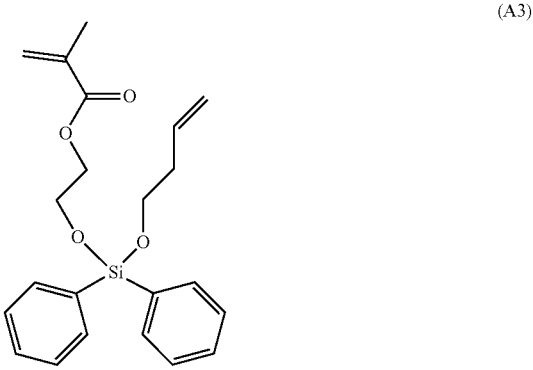
(A3)

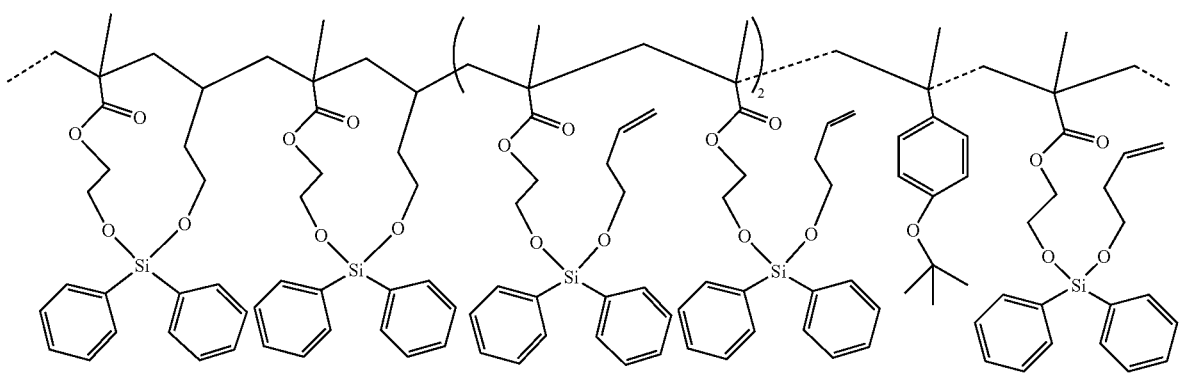
(C4)

Specially, the photoresist resin C3 described above is corresponding to the formula C2 in this invention, where m=4, p=15, x=3.

Example 9: Synthesis of a Highly Sequenced Photoresist Resin C5 Containing Silicon with High Sensitivity and High Contrast by Free Radical Polymerization In a reaction tube, monomer A3, M3 with protected acidic group and initiator AIBN were dissolved in 10 mL of N,N-dimethylformamide (DMF) at the mole ratio of 32:4:1 under nitrogen atmosphere. The solution was degassed via three freeze-pump-thaw cycles and stirred at 60~90° C. for -continued

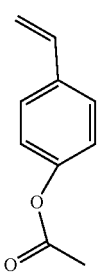
(M3)

Figure 12:
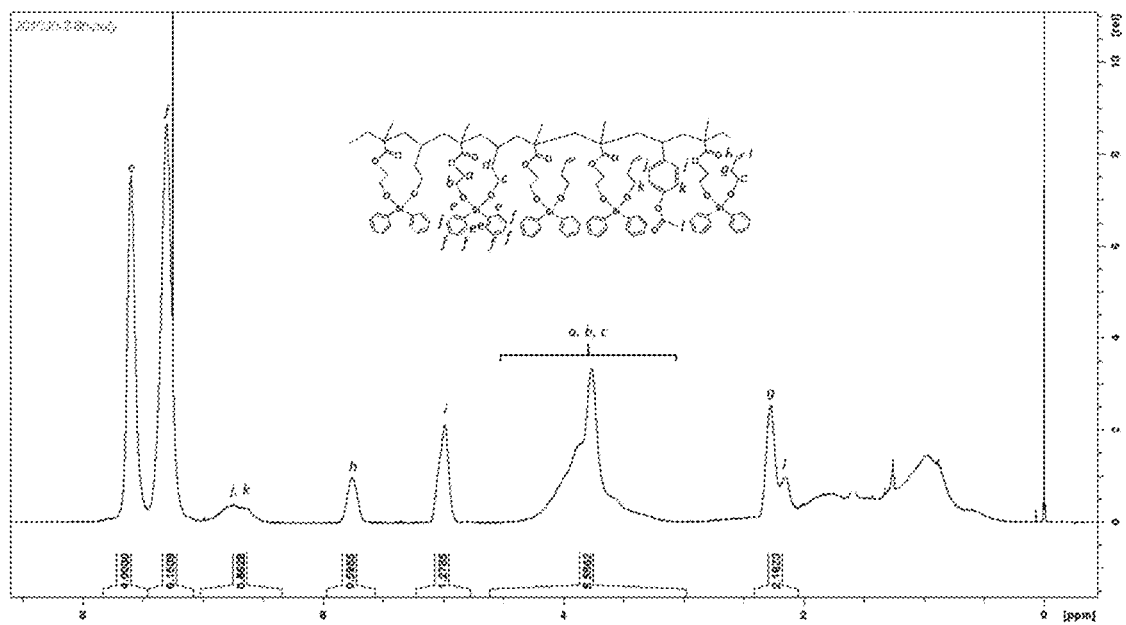
FIG. 12 shows the $^1$H NMR spectrum of the photoresist resin C5 obtained in Example 9.

FIG. 12 shows the ¹H NMR spectrum of the photoresist resin C5 obtained in Example 9. The peaks at 5.76 and 4.99 ppm correspond to the hydrogen atoms of unreacted carbon-carbon double bonds of olefin on the side chain, and the peaks at 7.85-7.46 ppm correspond to the hydrogen atoms of the benzene in the bridging group in A3 (4H). The peaks at 7.03-6.35 ppm are assigned to the hydrogen atoms (4H) of the benzene of M3, indicating that both A3 and M3 are incorporated into the copolymer backbone. According to the proportion of the integral of the characteristic peaks in A3 and M3, it can be calculated that the compositional ratio of A3/M3 in C5 is 86:14, in other words, the mole ratio of M3 is 14%.

Since M3 hardly undergoes homopolymerize under the polymerization conditions, the structure of photoresist resin C5 is as following:

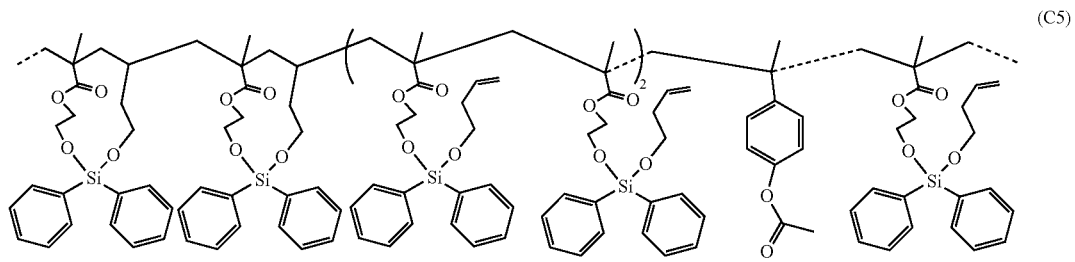

(C5)

Specially, the photoresist resin C3 described above is corresponding to the formula C2 in this invention, where m=4, p=20, x=4.

Example 10: Synthesis of a Highly Sequenced Photoresist Resin C6 Containing Silicon with High Sensitivity and High Contrast by Free Radical Polymerization In a reaction tube, monomer A3, M4 with protected acidic group and initiator AIBN were dissolved in 10 mL of N, N-dimethylformamide (DMF) at the mole ratio of 32:4:1 under nitrogen atmosphere. The solution was degassed via three freeze-pump-thaw cycles and stirred at 60~90° C. for 24 h. The reaction was quenched by rapid cooling with liquid nitrogen, and the resulting polymer was precipitated into methanol, collected through centrifugation and dried in vacuo for 24 h at 40° C. to yield a white powder. The molecular weight of polymer measured by GPC was $9.3 \times 10^3$, molecular weight distribution (PDI) was 1.46. The structures of the monomer A3 and M4 are as follow:

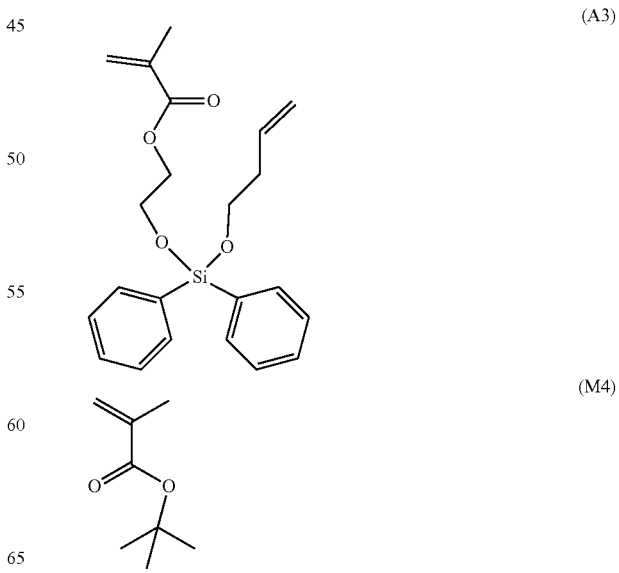

Figure 13:
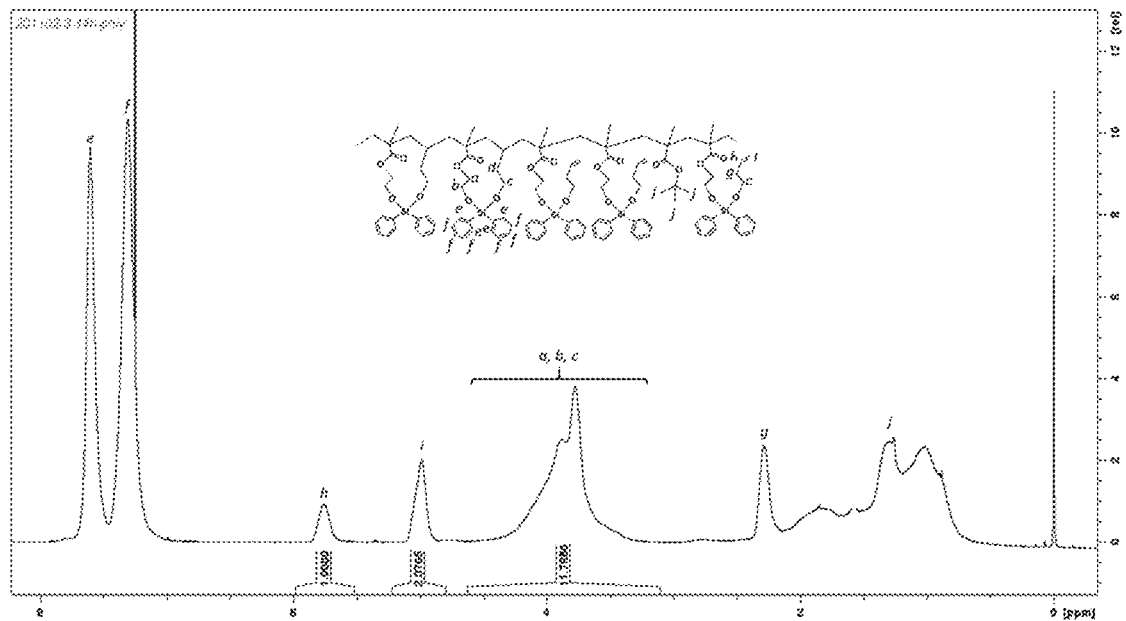
FIG. 13 shows the $^1$H NMR spectrum of the photoresist resin C6 obtained in Example 10.

FIG. 13 shows the $^1$H NMR spectrum of the photoresist resin C6 obtained in Example 10. The peaks at 5.76 and 4.99 ppm correspond to the hydrogen atoms of unreacted carbon-carbon double bonds of olefin on the side chain, and the peaks at 4.63-3.11 ppm are assigned to the hydrogen atoms (6H) of methylene bonded to the oxygen atoms in A3. The peak at 1.32 ppm comes from the tert-butyl group (9H) in M4, indicating that both A3 and M4 are incorporated into the copolymer backbone. Due to the overlap of characteristic peaks, the mole ratio of A3/M4 in C6 can only be quantified by the ratio of monomer conversion of A3 and M4, in other words, the mole ratio of M4 is 9%.

Since M4 hardly undergoes homopolymerize under the polymerization conditions, the structure of photoresist resin C6 is as following:

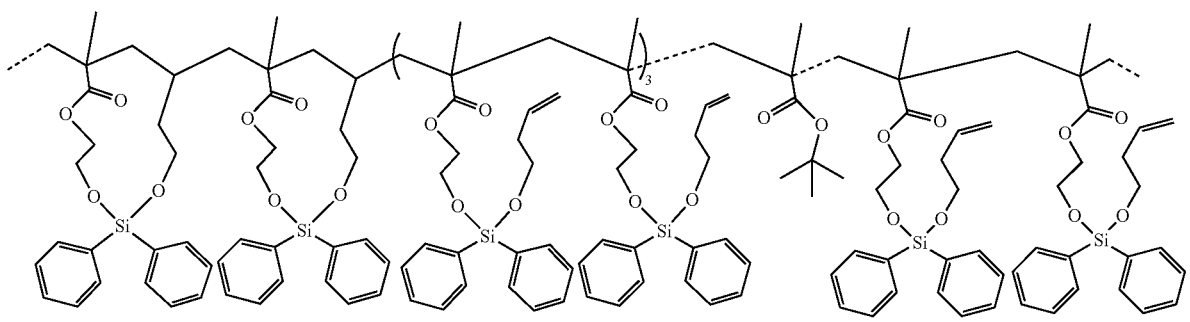

(C6)

Specially, the photoresist resin C3 described above is corresponding to the formula C2 in this invention, where m=4, p=16, x=2.

Example 11: Synthesis of a Highly Sequenced PolymerPAG C7 Containing Silicon with High Sensitivity and High Contrast by Free Radical Polymerization In a reaction tube, monomer A3, M1 with protected acidic group, N1 with photo-acid generator group and initiator AIBN were dissolved in 10 mL of N, N-dimethylformamide (DMF) at the mole ratio of 25:25:2.5:1 under nitrogen atmosphere. The solution was degassed via three freeze-pump-thaw cycles and stirred at 60~90° C. for 24 h. The reaction was quenched by rapid cooling with liquid nitrogen, and the resulting polymer was precipitated into methanol, collected through centrifugation and dried in vacuo for 24 h at 40° C. to yield a white powder. The molecular weight of polymer measured by GPC was 3.4×10$^3$, molecular weight distribution (PDI) was 1.97. The structures of the monomer A3, M1 and N1 are as follow:

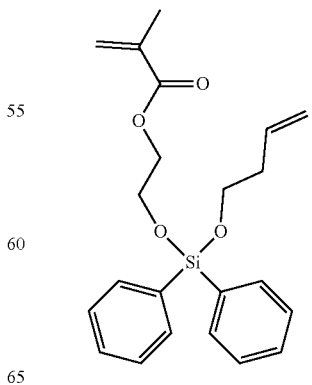

(A3)

-continued

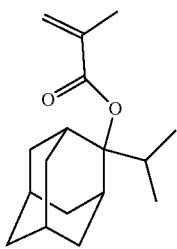
(M1)

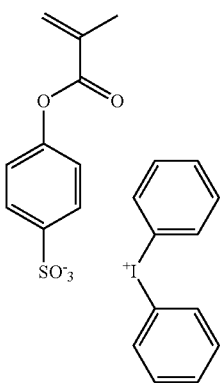
(N1)

Figure 14:
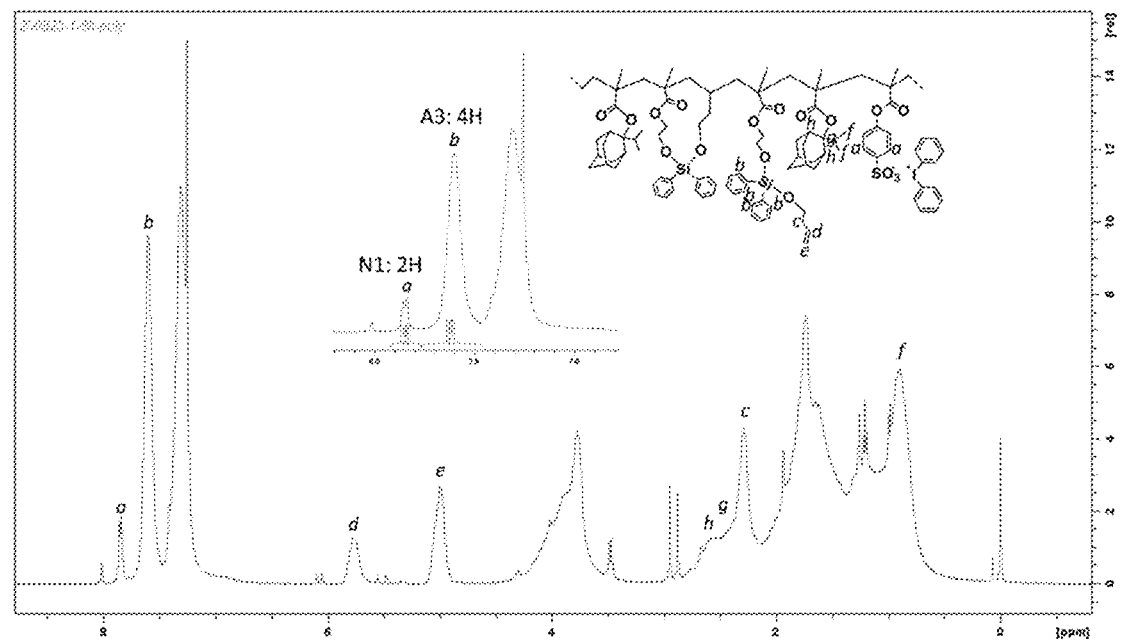
FIG. 14 shows the $^1$H NMR spectrum of the photoresist resin C7 obtained in Example 11.

FIG. 14 shows the ¹H NMR spectrum of the photoresist resin C7 obtained in Example 11. The peaks at 5.76 and 4.99 ppm correspond to the hydrogen atoms of unreacted carbon-carbon double bonds of olefin on the side chain, and the peaks at 4.65-3.12 ppm are assigned to the hydrogen atoms (6H) of methylene bonded to the oxygen atoms in A3. The peaks at 2.60 and 2.28 ppm are from the adamantanyl group (2H) and isopropyl group (1H) in M1, respectively. The peak at 7.85 ppm is from the benzene ring (2H) of benzenesulfonic acid in N1, indicating that A3, M1 and N1 are all incorporated into the copolymer backbone. According to the proportion of the integral of the characteristic peaks in A3, M1 and N1, it can be calculated that the compositional ratio of A3/M1/N1 in C7 is 53:37:10. The structure of photoresist resin C7 is as following:

Specially, the photoresist resin C7 described above is corresponding to the formula C3 in this invention, where m=0.5, p=4, x=4, y=1.

Comparative Example 1: Synthesis of Copolymer B1

In a reaction tube, 0.43 g monomer A1 synthesized in Example 1 and 6.6 mg azodiisobutyronitrile (AIBN) were dissolved in 10 mL of N, N-dimethylformamide (DMF) under nitrogen atmosphere. The solution was degassed via three freeze-pump-thaw cycles and stirred at 60~90° C. for 8 h. The reaction was quenched by rapid cooling with liquid nitrogen, and the resulting polymer was precipitated into methanol, collected through centrifugation and dried in vacuo for 24 h at 40° C. 0.39 g polymer was obtained. The molecular weight of polymer measured by GPC was 1.6× $10^4$, the molecular weight distribution (PDI) was 3.01.

Figure 15:
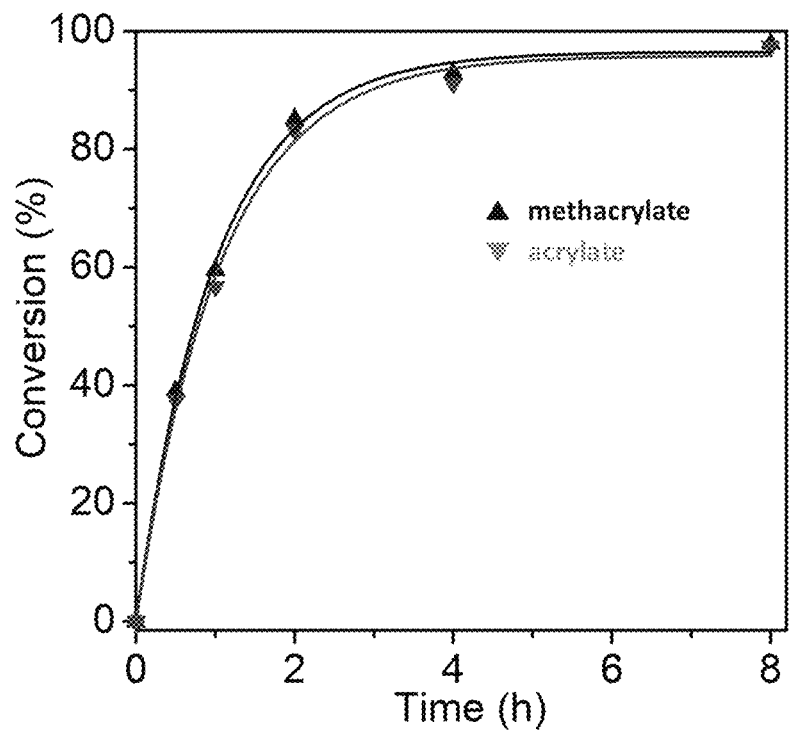
FIG. 15 shows the conversion rates of the two types of carbon-carbon double bonds in bi-functional monomer A1 at different polymerization times in Contrast 1.

FIG. 15 shows the conversion curves of the two kinds of monomer carbon-carbon double bonds in Contrast 1.

It can be seen from FIG. 15 that the conversion rates of the two kinds of monomers are close at different polymerization time.

Figure 16:
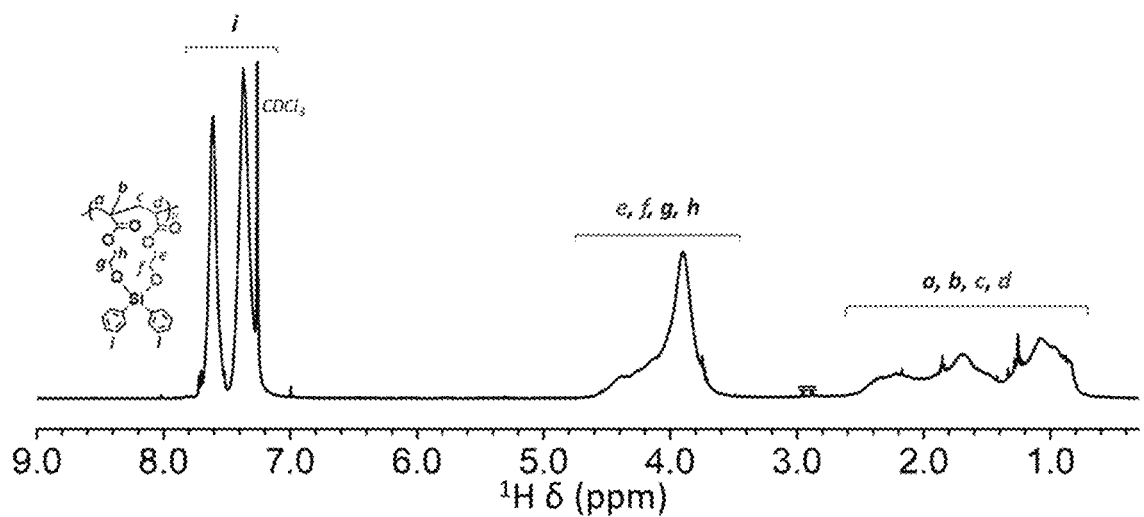
FIG. 16 shows the $^1$H NMR spectrum of the copolymer obtained in Contrast 1.

FIG. 16 shows the ¹H NMR spectrum of the copolymer obtained in Contrast 1. It can be seen from FIG. 16 that the compositional ratio of methacrylate and acrylate monomer in the copolymer is 1:1. According to FIG. 15-16, the obtained alternating copolymer B1 of methacrylate and acrylate is expressed by the following formula:

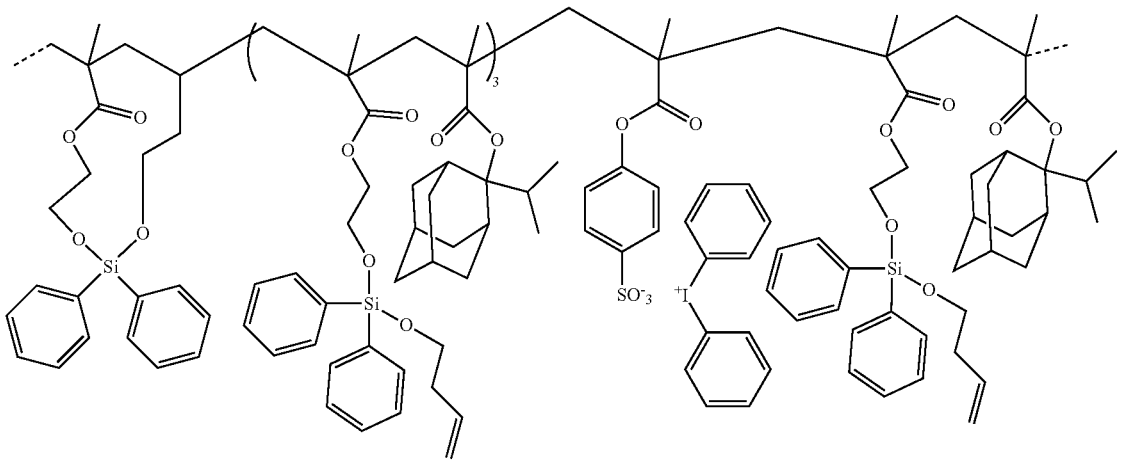
(C7)

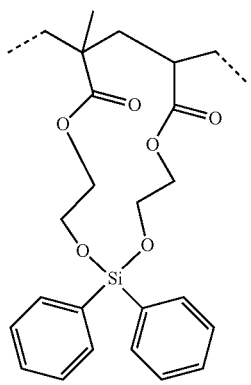

(B1)

Comparative Example 2: Synthesis of Copolymer B2

In a reaction tube, 0.4 g monomer A2 synthesized in Example 2 and 6.6 mg azodiisobutyronitrile (AIBN) were dissolved in 100 mL of N, N-dimethylformamide (DMF) under nitrogen atmosphere. The solution was degassed via three freeze-pump-thaw cycles and stirred at 60~90° C. for 8 h. The reaction was quenched by rapid cooling with liquid nitrogen, and the resulting polymer was precipitated into methanol, collected through centrifugation and dried in vacuo for 24 h at 40° C. 0.26 g polymer was obtained. The molecular weight of polymer measured by GPC was $1.3 \times 10^4$, molecular weight distribution (PDI) was 1.55.

Figure 17:
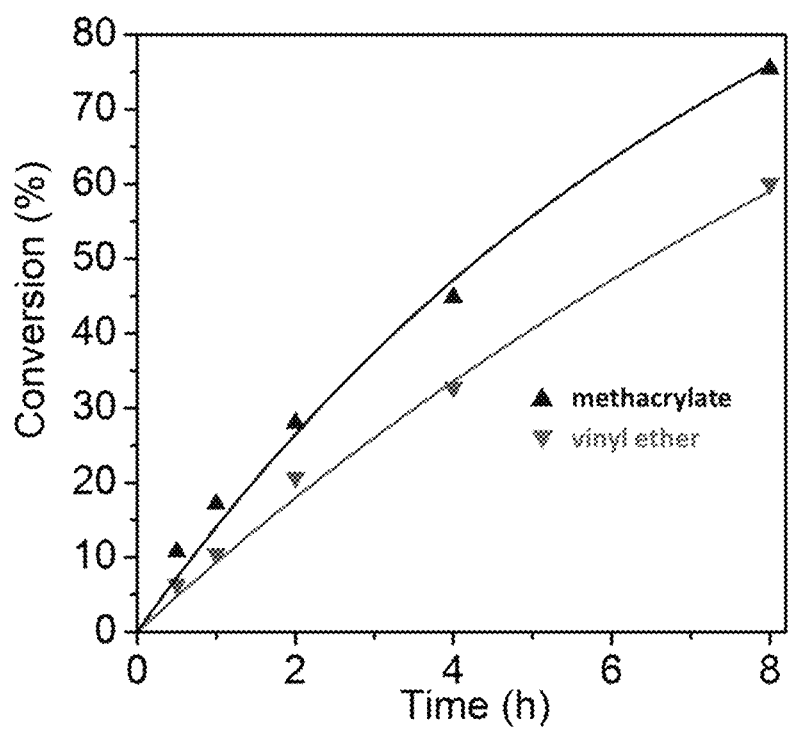
FIG. 17 shows the conversion rates of the two types of carbon-carbon double bonds in bi-functional monomer A2 at different polymerization times in Contrast 2.

FIG. 17 shows the conversion curves of the two kinds of monomer carbon-carbon double bonds in Contrast 2. It can be seen from FIG. 17 that the conversion rates of the two kinds of monomers are close at different polymerization time.

Figure 18:
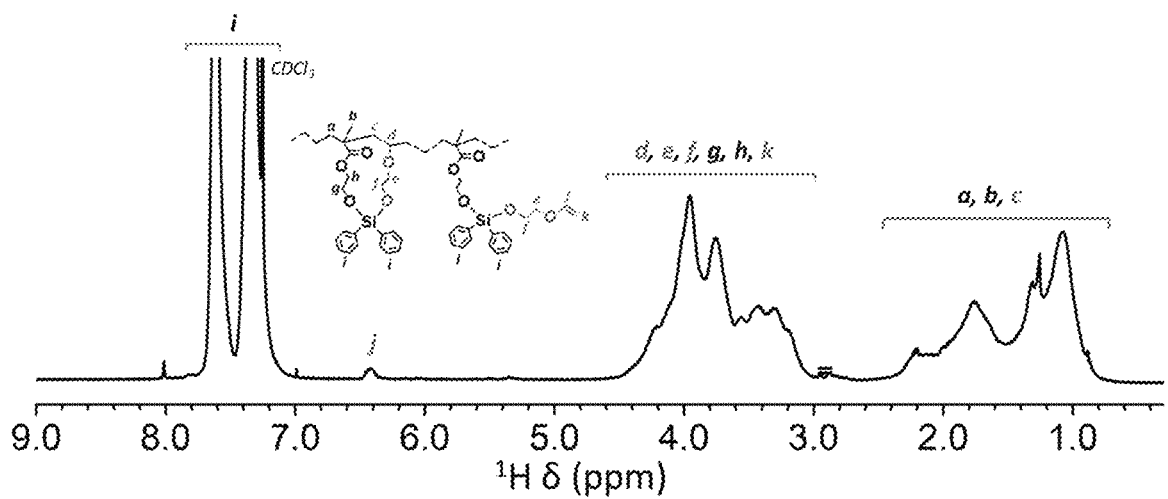
FIG. 18 shows the $^1$H NMR spectrum of the copolymer obtained in Contrast 2.

FIG. 18 shows the $^1$H NMR spectrum of the copolymer obtained in Contrast 2. It can be seen from FIG. 18 that the compositional ratio of methacrylate and vinyl ether monomer in the copolymer is 1.2:1. According to FIG. 17-18, the highly alternating methacrylate-vinyl ether copolymer B2 is expressed by the following formula:

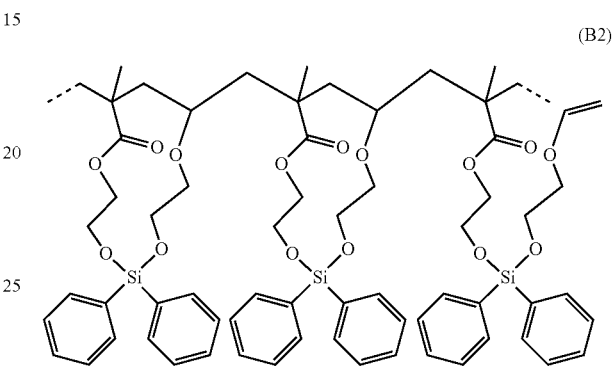

(B2)

The relevant information of Examples 4-11 and Comparative examples 1-2 were listed in Table 1.

TABLE 1

| | Bi-functional monomer | third monomer | fourth monomer | resist | molecular weight of resist | polymer dispersity index (PDI) of resist | molar ratio of the third monomer |
|---|---|---|---|---|---|---|---|
| Example 4 | 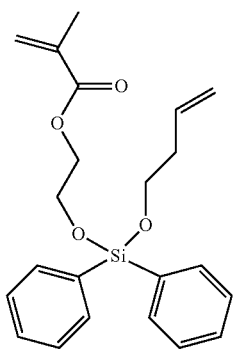 [SMILES: C=CCCO[Si](OCCOC(=O)C(=C)C)(c1ccccc1)c1ccccc1]<br>A3 | — | — | B3 | $1.3 \times 10^4$ | 1.45 | — |
| Example 5 | A1 | M1 | — | C1 | $1.3 \times 10^4$ | 3.18 | 30% |

TABLE 1-continued

| | Bi-functional monomer | third monomer | fourth monomer | resist | molecular weight of resist | polymer dispersity index (PDI) of resist | molar ratio of the third monomer |
|---|---|---|---|---|---|---|---|
| Example 6 | A2 | M1 | | C2 | $6.6 \times 10^3$ | 1.19 | 19% |
| Example 7 | A3 | M1 | | C3 | $9.7 \times 10^3$ | 1.56 | 6% |
| Example 8 | A3 | M2 | | C4 | $9.5 \times 10^3$ | 1.43 | 12% |
| Example 9 | A3 | M3 | | C5 | $1.1 \times 10^4$ | 1.47 | 14% |

TABLE 1-continued
| | Bi-functional monomer | third monomer | fourth monomer | resist | molecular weight of resist | polymer dispersity index (PDI) of resist | molar ratio of the third monomer |
|---|---|---|---|---|---|---|---|
| Example 10 | 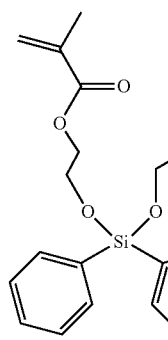<br>A3 | 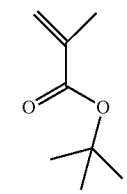<br>M4 | | C6 | 9.3 × 10³ | 1.46 | 9% |
| Example 11 | 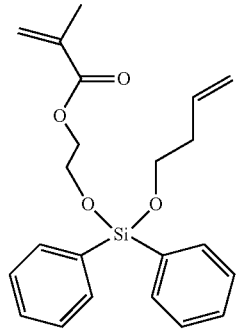 [SMILES: C=CCCO[Si](OCCOC(=O)C(=C)C)(c1ccccc1)c1ccccc1]<br>A3 | M1 | N1 | C7 | 3.4 × 10³ | 1.97 | 37% |
| Comparative example 1 | A1 | — | — | B1 | 1.6 × 10⁴ | 3.01 | — |
| Comparative example 2 | 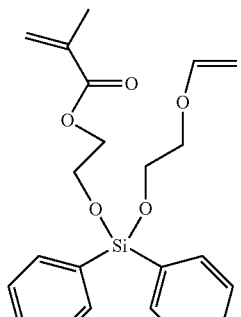<br>A2 | — | — | B2 | 1.3 × 10⁴ | 1.55 | — |

Example 12: A Preparation Method of a Positive-Tone Chemically Amplified Photoresist 1 g of resin B3 described in Example 4 was dissolved in propylene glycol monomethyl ether acetate (PGMEA) to form a solution with the resin concentration of 5 wt % (20 g), then added the PAG (0.06 g, 0.3 wt %) and the quencher Q (8 mg, 0.04 wt %), a PTFE filter with the diameter of 0.45 μm was used to filter the photoresist solution. Surfactant S was a 5 wt % PGMEA solution of single component (5 mg surfactant/20 g solution, 0.025 wt %), and 100 μL of surfactant was added.

The structures of PAG, Q and S are as follows:

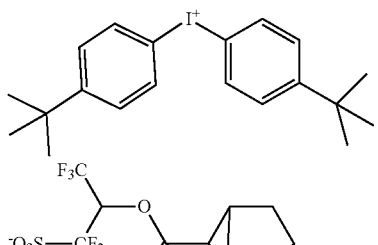

(PAG)

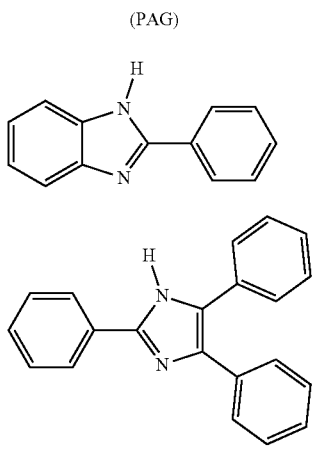

(Q1)

(Q2)

(Q3)

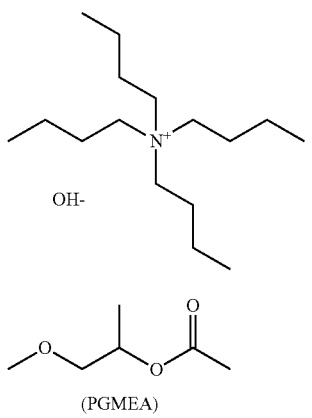

(S)

(PGMEA)

The preparation method of the corresponding chemically amplified photoresist of the resin C1-C6 is the same with that of resin B3 in Example 12, and will not be described again here.

As for polymerPAG C7, no additional PAG is required, that is, 1 g of resin C7 described in Example 11 was dissolved in propylene glycol monomethyl ether acetate (PGMEA) to form a solution with the resin concentration of 5 wt % (20 g), then added the quencher Q (8 mg, 0.04 wt %), a PTFE filter with the diameter of 0.45 μm was used to filter the photoresist solution. Surfactant S was a 5 wt % PGMEA solution of single component (5 mg surfactant/20 g solution, 0.025 wt %), and 100 μL of surfactant was added.

Example 13: An Application Method of a Positive-Tone Chemically Amplified Photoresist Hexamethyldisilazane (HMDS) was spin-coated on a 4-inch silicon plate, and then the chemically amplified photoresist corresponding to the resin C1-C6 in Example 12 was spin-coated on the HMDS films respectively, and the photoresist film was obtained by baking at 120° C. for 60 seconds.

After the photoresist film was obtained, a mask with an array stripe pattern (stripe hole size of 300*75 μm) was used to illuminate the film for 4 h with an 8 Watt UV light box at 254 nm.

After the exposure, the post-exposure bake (PEB) was performed at 120° C. for 60 seconds on a hot plate. The photoresist film was dipped into 2.38 wt % aqueous solution of tetramethylammonium hydroxide (TMAH) for 30 seconds, and then washed with ultra-pure water. In other words, the stripe patterns were transferred from mask onto the silicon wafer.

Figure 19:
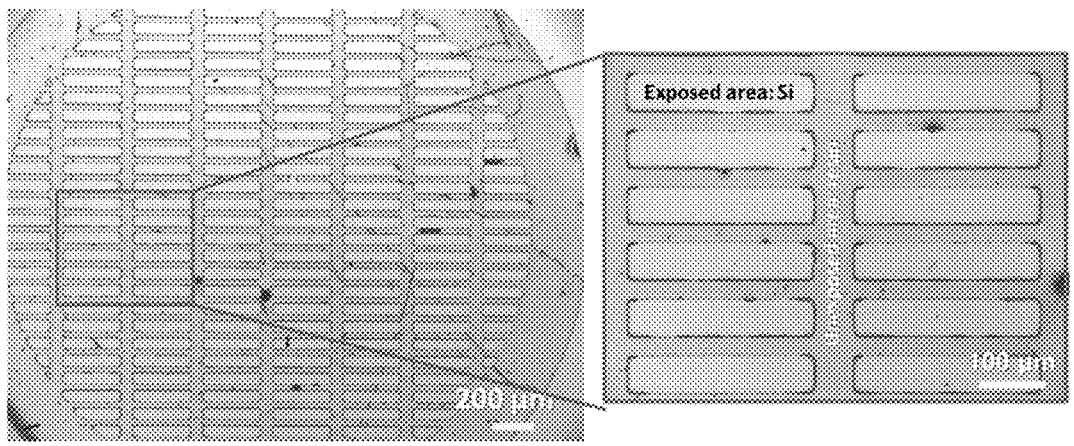
Figure 20:
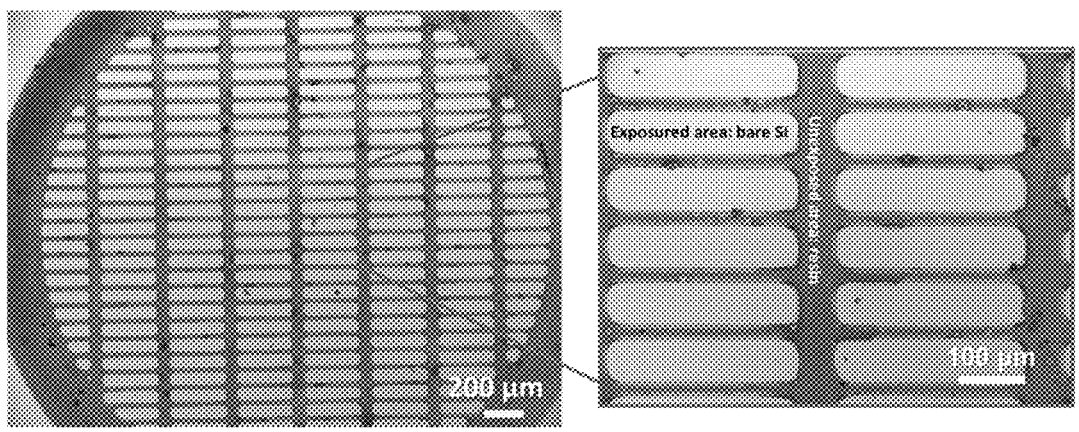
Figure 21:
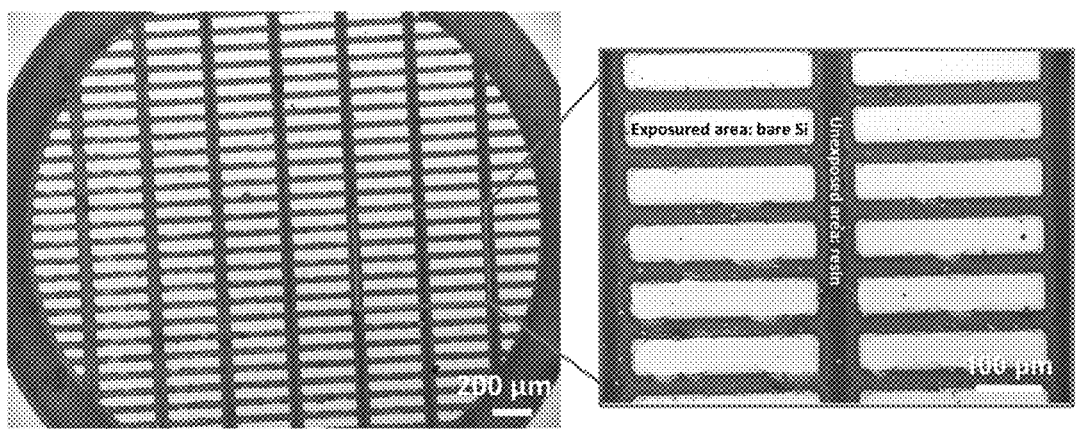
Figure 22:
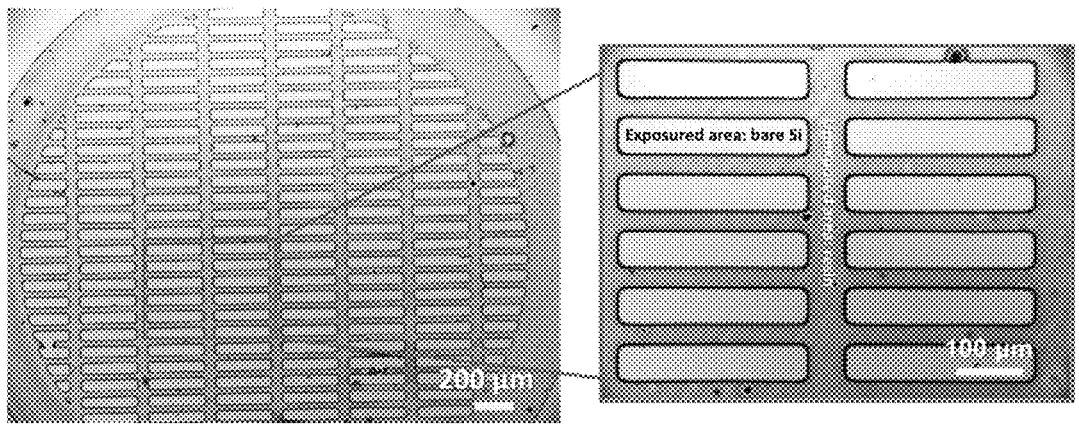
Figure 23:
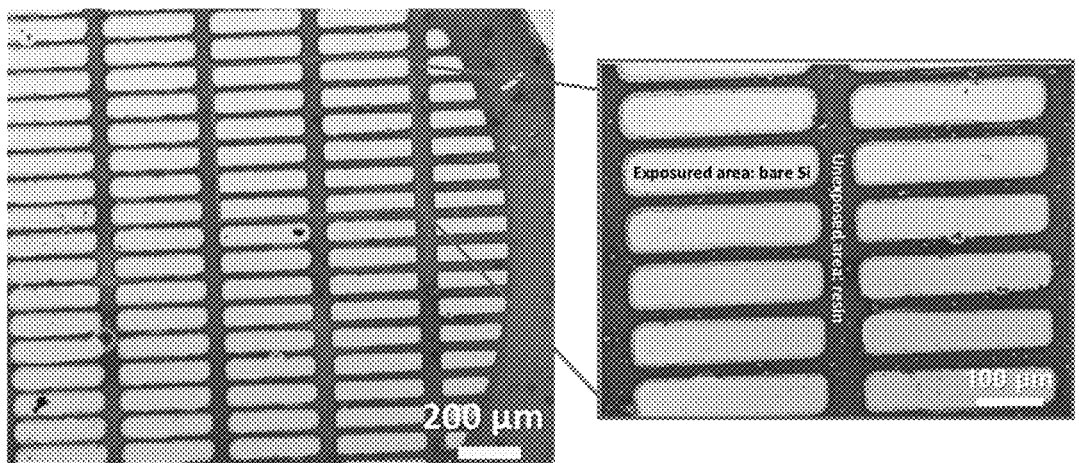
Figure 24:
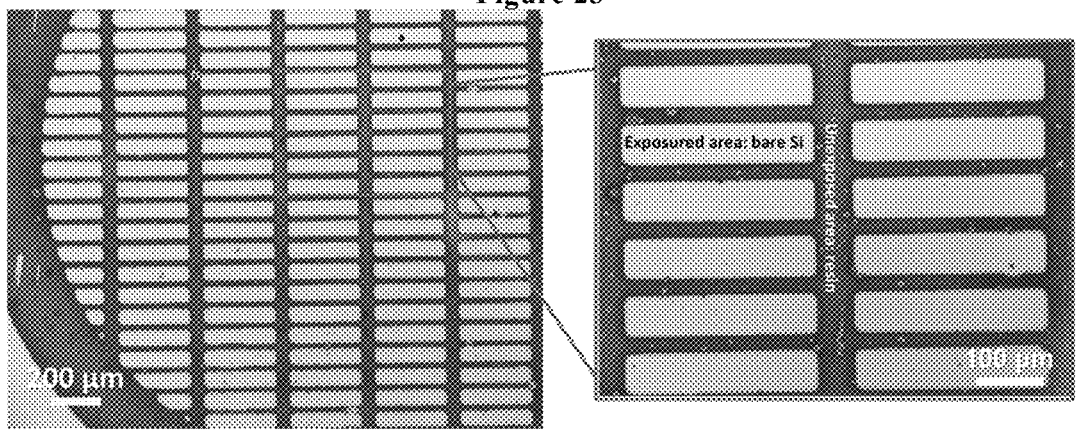
Figure 25:
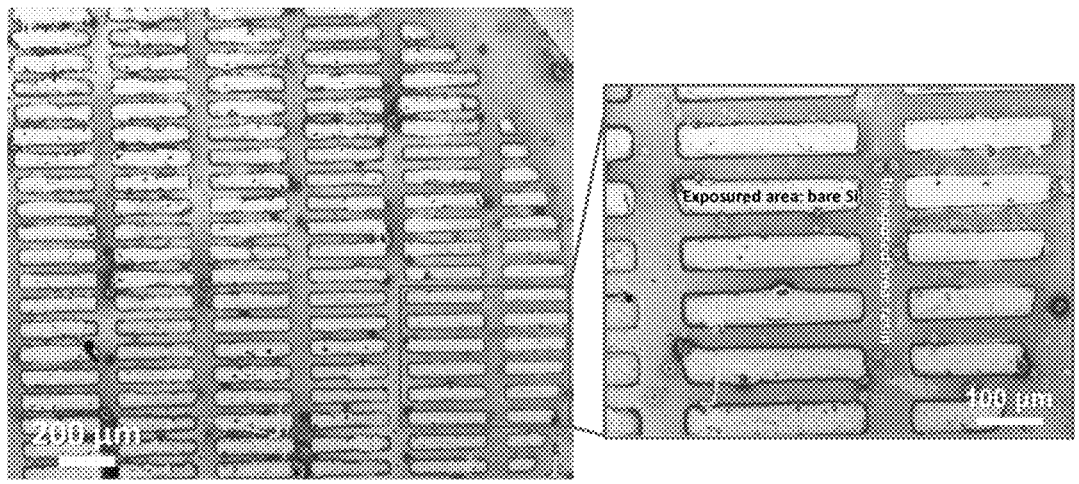
Figure 26:
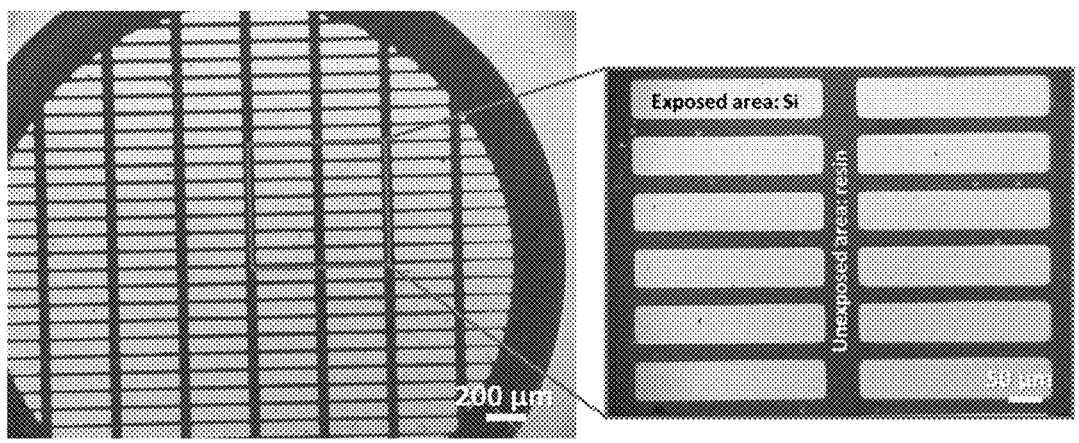

FIG. 19 (corresponding to resist B3), FIG. 20 (C1), FIG. 21 (C2), FIG. 22 (C3), FIG. 23 (C4), FIG. 24 (C5), FIG. 25 (C6) and FIG. 26 (C7) respectively shows the optical microscopic photos of the stripe patterns obtained on the silicon wafer, as described in Example 13. The yellowish part is the silicon wafer substrate (the exposed area), and the dark blue part is the remained photoresist resin (the unexposed area). Over a wide range, the exposed image has smooth edges with no adhesion, and the contrast between the exposed area and the unexposed area is sharp.

Comparative Example 3: A Preparation and Application Method of a Positive-Tone Chemically Amplified Photoresist The preparation of chemically amplified photoresist of the resin B1-B2 in Comparative examples 1-2 and the corresponding photoresist film, and also the exposure and development methods all follow the same conditions described in Examples 12-13. FIG. 27 (corresponding to resist B1) and FIG. 28 (B2) respectively shows the optical microscopic photos of the stripe patterns obtained on the silicon wafer, as described in Comparative example 3. The bright yellow part is the exposed area, and the dark brown part is the remained photoresist resin (the unexposed area). Over a wide range, the resist in the exposure area is not completely developed and distinct residues are observed. The contrast between exposed area and unexposed area is rather low, indicating the poor lithographic performance.

Comparative Example 4

The preparation of chemically amplified photoresist AA, BB and the corresponding photoresist films, and also the exposure and development methods all follow the same conditions described in Examples 12-13. FIG. 33 (corresponding to resist AA) and FIG. 34 (BB) respectively shows the optical microscopic photos of the stripe patterns obtained on the silicon wafer, as described in Comparative example 4. The yellowish part is the silicon wafer substrate (the exposed area), and the dark blue part is the remained photoresist resin (the unexposed area). Over a wide range, for resist AA, the resist in the exposure area is not completely developed and distinct residues are observed. The contrast between exposed area and unexposed area is low. For resist BB, the contrast is even lower, the lithographic performance of which is far from the sequenced resist described in this invention. Meanwhile, these two photoresists do not show high etching resistance due to lack of main-chain ring structure and silicon atoms.

The Preparation and Application Method of the Positive-Tone Chemically Amplified Photoresist AA Example 1-1

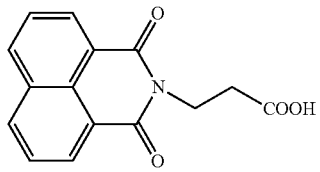 [SMILES: O=C(O)CCN1C(=O)c2cccc3cccc(c23)C1=O]

2.90 g of 1,8-Naphthalic anhydride (15.2 mmol) and 1.63 g 3-Aminopropionic acid (18.2 mmol) were dissolved in 100 mL of N, N-Dimethylformamide (DMF) under a nitrogen atmosphere. The mixture was heated to 140° C. under reflux for 10 h. The resulting solution was then cooled to room temperature and left unperturbed for crystallization at −18° C. after concentration. The product obtained after filtration was washed with methanol and then dried to yield a light-yellow solid (2.78 g, 58.2%).

Example 1-2 Monomer 1

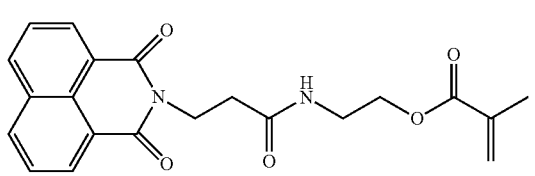

monomer 1

2-Aminoethyl methacrylate hydrochloride (2.57 mmol) and triethylamine (11.6 mmol) were dissolved in 10 mL of DCM at room temperature and stirred for 1 h. The mixture was added to a solution containing 0.69 g of the product obtained in Example 1-1 (2.57 mmol) and 20 mL of DCM and then cooled to 0° C. 0.257 mmol N,N-dimethylamino-pyridine and 5.14 mmol 1-(3-Dimethylaminopropyl)-3-ethylcarbodiimide hydrochloride (EDC) were subsequently added, and the resulting solution was slowly warm to room temperature and stirred for 24 h. The reaction was quenched by adding dilute hydrochloric acid. The organic layer was separated and dried over anhydrous MgSO$_4$, concentrated under reduced pressure to give 0.47 g white solid with a yield of 48.1%.

$^1$H NMR (CDCl$_3$, 400 MHz, ppm): 8.59 (d, 2H, Ar), 8.22 (d, 2H, Ar), 7.75 (t, 2H, Ar), 6.40 (s, 1H, NH), 6.07 (s, 1H, CH$_2$=C), 5.52 (s, 1H, CH$_2$=C), 4.49 (t, 2H, CH$_2$), 4.22 (t, 2H, CH$_2$), 3.58 (q, 2H, CH$_2$), 2.71 (t, 2H, CH$_2$), 1.89 (s, 3H, CH$_3$).

Example 1-3 Monomer 2

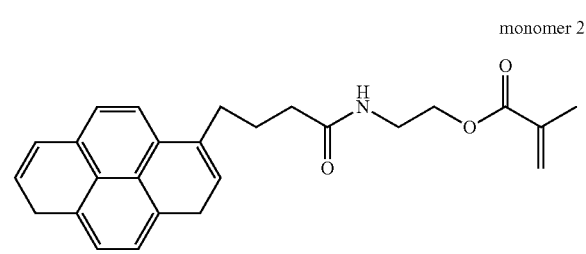 [SMILES: C=C(C)C(=O)OCCNC(=O)CCCC1=CCc2ccc3c4c(ccc1c24)C=CC3]

monomer 2

The synthesis method was the same as Example 1-2, by replacing the product obtained in Example 1-1 with 1-pyrenebutyric acid to obtain 0.68 g white solid with a yield of 48.9%.

$^1$H NMR (CDCl$_3$, 400 MHz, ppm): 8.28 (d, 1H, Ar), 8.17 (s, 1H, Ar), 8.15 (s, 1H, Ar), 8.11 (d, 1H, Ar), 8.09 (s, 1H, Ar), 8.02 (s, 2H, Ar), 7.99 (t, 1H, Ar), 7.84 (d, 1H, Ar), 6.08 (s, 1H, CH$_2$=C), 5.74 (s, 1H, NH), 5.54 (s, 1H, CH$_2$=C), 4.23 (t, 2H, CH$_2$), 3.56 (q, 2H, CH$_2$), 3.38 (t, 2H, CH$_2$), 2.29-2.17 (m, 4H, CH$_2$), 1.90 (s, 3H, CH$_3$).

The synthesis of resist AA:

In a reaction tube, 0.38 g monomer 1 synthesized in Example 1-2, 0.40 g monomer 2 synthesized in Example 1-3, 0.26 g tert-butyl acrylate (third monomer) and 6.6 mg azodiisobutyronitrile (AIBN) were dissolved in 10 mL of N, N-dimethylformamide (DMF) under nitrogen atmosphere. The solution was degassed via three freeze-pump-thaw cycles and stirred at 70° C. for 8 h. The reaction was quenched by rapid cooling with liquid nitrogen, and the resulting polymer was precipitated into methanol, collected through filtration and dried in vacuo for 24 h at 40° C. 0.63 g polymer (terpolymer 1) was obtained. The molecular weight of polymer measured by GPC was $1.1 \times 10^4$, molecular weight distribution (PDI) was 1.33.

FIG. 29 shows the $^1$H NMR spectrum of the terpolymer 1.

It can be seen from FIG. 29 that all the three comonomers are incorporated into the polymer main chain, and the compositional ratio of monomer 1, monomer 2 and tBA in the terpolymer is 20:23:57.

FIG. 30 shows the conversion curves of the three comonomers of terpolymer 1, where M5 is the monomer synthesized in Example 1-2, M6 is the monomer synthesized in Example 1-3, tBA is the third monomer tert-butyl acrylate.

It can be seen from FIG. 30 that the conversion rates of monomer 1 and 2 are the same at different polymerization time. The final conversions of monomer 1, monomer 2 and tBA are 69.7%, 70.3% and 90.1% at 8 h.

The preparation and application methods of resist AA:

Follow Examples 12-13, and use terpolymer 1 (resist AA) as the photoresist resin.

The Preparation and Application Method of the Positive-Tone Chemically Amplified Photoresist BB The synthesis of resist BB:

In a reaction tube, 0.38 g monomer 1 synthesized in Example 1-2, 0.40 g monomer 2 synthesized in Example 1-3, 0.24 g methyl methacrylate (third monomer) and 6.6 mg azodiisobutyronitrile (AIBN) were dissolved in 10 mL of N, N-dimethylformamide (DMF) under nitrogen atmosphere. The solution was degassed via three freeze-pump-thaw cycles and stirred at 70° C. for 8 h. The reaction was quenched by rapid cooling with liquid nitrogen, and the resulting polymer was precipitated into methanol, collected through filtration and dried in vacuo for 24 h at 40° C. 0.75 g polymer (terpolymer 2) was obtained. The molecular weight of polymer measured by GPC was $1.4 \times 10^4$, molecular weight distribution (PDI) was 1.41.

FIG. 31 shows the $^1$H NMR spectrum of the terpolymer 2.

It can be seen from FIG. 31 that all the three comonomers are incorporated into the polymer main chain, and the compositional ratio of monomer 1, monomer 2 and MMA in the terpolymer is 14:16:70.

FIG. 32 shows the conversion curves of the three comonomers of terpolymer 2, where M5 is the monomer synthesized in Example 1-2, M6 is the monomer synthesized in Example 1-3, MMA is the third monomer methyl methacrylate.

It can be seen from FIG. 32 that the conversion rates of monomer 1 and 2 are the same at different polymerization time. The final conversions of monomer 1, monomer 2 and MMA are 58.1%, 58.6% and 87.1% at 8 h.

The preparation and application methods of resist BB: Follow Example 12-13, and use terpolymer 2 (resist BB) as the photoresist resin.

Example 14: A Preparation Method of a Cross-Linked Negative-Tone Photoresist 1 g of resin B3 described in Example 4 was dissolved in propylene glycol monomethyl ether acetate (PGMEA) to form a solution with the resin concentration of 5 wt %, then added the photo initiator (0.05 g, 0.25 wt %) and multi-functional cross-linked agent L (0.2 g, 1 wt %), a PTFE filter with the diameter of 0.45 μm was used to filter the photoresist solution.

The structures of I and L are as follows:

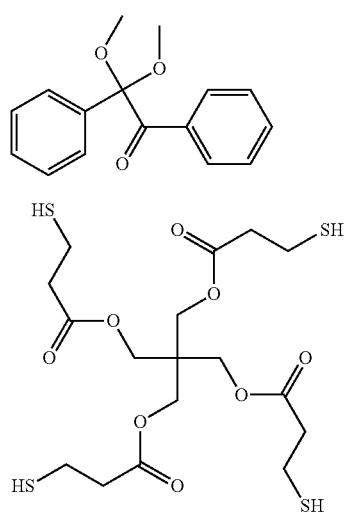

(I)

(L)

The preparation method of the corresponding crosslinked negative-tone photoresist of the resin C3 is the same with that of resin B3 in Example 14, and will not be described again here.

Example 15: An Application Method of a Cross-Linked Negative-Tone Photoresist Hexamethyldisilazane (HMDS) was first spin-coated on a 4-inch silicon wafer, and then resin B3 or C3 described in Example 14 was spin-coated on the above HMDS films, and the corresponding photoresist film was obtained after baking at 120° C. for 60 seconds.

After the photoresist film was obtained, a mask with an array stripe pattern (stripe hole size is 300*75 μm) was used, and an 8 Watt 365 nm UV light was used to illuminate the film for 30 minutes.

Or directly formed through electron beam lithography (20 μC/cm$^2$).

After exposure, the photoresist film was dipped into toluene for 30 seconds, and then rinsed with n-hexane, and thus the stripe patterns were transferred from mask or fabricated through electron beam lithography onto the silicon wafer.

FIG. 35 is a microscopic photograph of the stripe patterns obtained on the silicon wafer in Example 15. The yellowish part is the silicon wafer substrate (the unexposed region), and the dark blue part is the cross-linked resin (the exposed region). Over a wide range, the exposed images have smooth edges with no adhesion, and the contrast between the exposed area and the unexposed area is sharp.

Example 16: A Stripping Method of a Cross-Linked Negative-Tone Photoresist

The silicon wafer with line pattern obtained from resist C3 described in Example 15 was dipped into trifluoroacetic acid (TFA) for 30 seconds, followed by immersed into 2.38 wt % tetramethylammonium hydroxide (TMAH) aqueous solution for 30 seconds.

FIG. 38 (corresponding to resist C3) is an optical microscope photograph of the silicon wafer after stripping, as is described in Example 16. The yellowish part is the silicon substrate. Obviously, the residual cross-linked negative-tone resins can be completely removed.

The characterizations and the parameter information of the instruments used in this invention are as follows:
1. Nuclear Magnetic Resonance Spectroscopy (NMR)

In this invention, 400 MHz Nuclear Magnetic Resonance spectrometer (Brucker, AVANCE III) was used to determine the specific structure of the copolymer, chloroform-d was used as the solvent, and the incorporation of each component in the copolymer is determined by calculating the integral of the characteristic peaks of hydrogen atoms.

2. Gel Permeation Chromatography (GPC)

In this invention, the number-average molecular weight (Mn) and polydispersity index (PDI) can be characterized by gel permeation chromatography in tetrahydrofuran against PS standards with a differential refractive detector.

3. Optical Microscope (OM)

In this invention, an optical microscope (Leica, DM2500P) was used to observe the lithography patterns (bright field, reflection mode) on a silicon wafer.

4. Scanning Electronic Microscope (SEM)

In this invention, a scanning electronic microscope (Zeiss, Ultra 55) was used to observe the line pattern (InLens) on a silicon wafer.

All the raw materials involved in the embodiments of the invention are commercially available.

The above are only embodiments of this invention and does not mean limiting the scope of the patent of the invention. Any equivalent transformation made by using the description of this invention and the attached figures, or directly or indirectly applied to the relevant technical field, shall be similarly included in the scope of patent protection of the invention.

The invention claimed is:

1. An ordered photolithographic resin, wherein the photolithographic resin is a copolymer comprising structure 1 and structure 2,

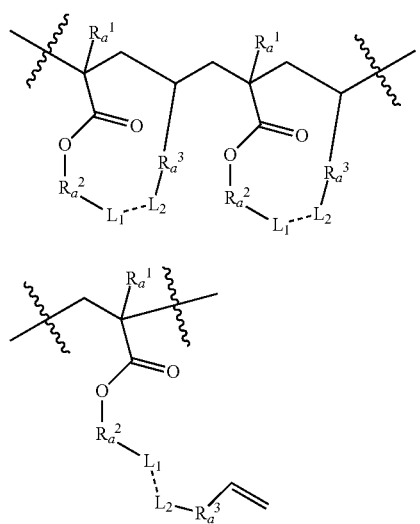

structure 1 structure 2 wherein, the number of structure 1 is m, m is selected from the group consisting of 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5 and 20;

the number of structure 2 is n, n is an integer selected from 1 to 20;

each $R_a^1$ is independently selected from the group consisting of H, C1-C6 alkyl and halogenated C1-C6 alkyl;

each $R_a^2$ is independently selected from the group consisting of C1-C6 alkylene;

each $R_a^3$ is independently selected from the group consisting of C1-C6 alkylene;

each $L_1$—$L_2$ is independently selected from the group consisting of

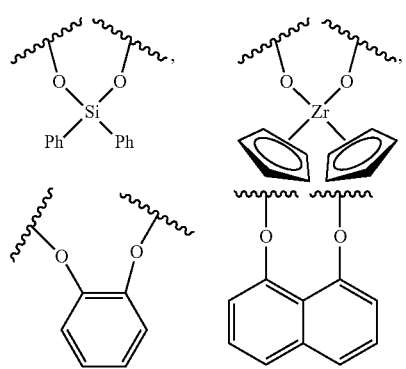

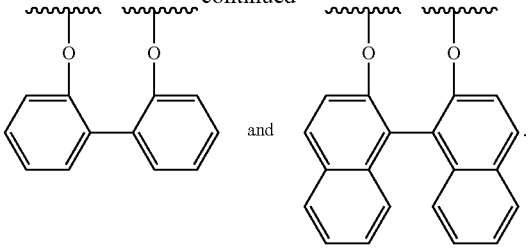

-continued and

2. An ordered photolithographic resin, wherein the photolithographic resin is a copolymer comprising structure 1, structure 2 and structure 3,

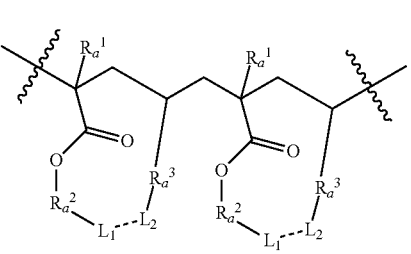

structure 1 structure 2

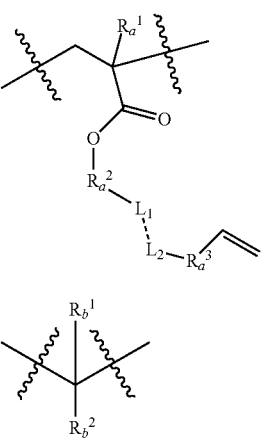

structure 3 wherein, the number of structure 1 is m, m is selected from the group consisting of 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5 and 20;

the number of structure 2 is p, p is an integer selected from 0 to 30;

the number of structure 3 is x, x is an integer selected from 1 to 30;

$R_a^1$ and $R_b^1$ are each independently selected from the group consisting of H, C1-C6 alkyl, and halogenated C1-C6 alkyl;

each $R_a^2$ is independently selected from the group consisting of C1-C6 alkylene;

each $R_a^3$ is independently selected from the group consisting of C1-C6 alkylene, —(C1-C6 alkylene)-O—, and —(C1-C6 alkylene)-O—(C=O)—;

each $R_b^2$ is independently selected from the group consisting of

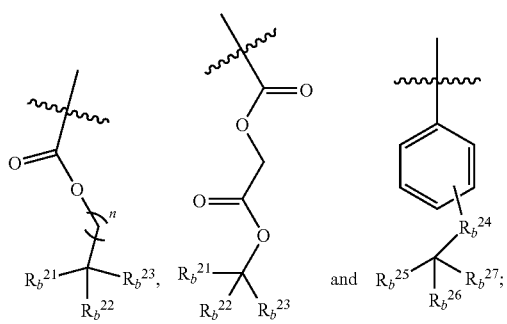

$R_b^{21}$, $R_b^{22}$, and $R_b^{23}$ are each independently selected from the group consisting of, H, C1-C6 alkyl, adamantyl, OH-substituted adamantyl, and C3-C8 cycloalkyl, or $R_b^{21}$, $R_b^{22}$, and $R_b^{23}$ together form a structure selected from the group consisting of

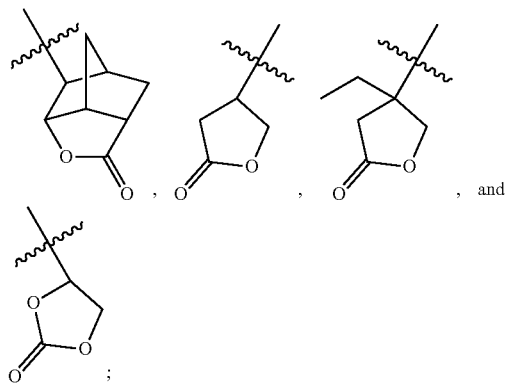

n is 0, 1, 2, 3, 4 or 5;

$R_b^{24}$ is selected from the group consisting of —O— and —(C=O)—;

$R_b^{25}$, $R_b^{26}$, and $R_b^{27}$ are each independently selected from the group consisting of, hydrogen, =O, C1-C6 alkyl, C1-C6 alkoxy, —(C=O)—O—C(C1-C6 alkyl)$_2$-adamantyl, —O—(C3-C8 cycloalkyl), —O—(C1-C6 alkylene)-(C6-C10 aryl), C6-C10 aryl, and —O—(C1-C6 alkylene)-O—(C=O)—(C6-C10 aryl);

each $L_1$—$L_2$ is independently selected from the group consisting of

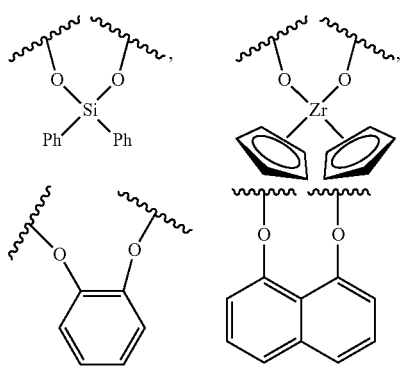

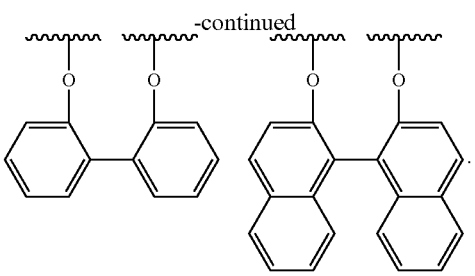

3. An ordered photolithographic resin,
wherein the photolithographic resin is a copolymer comprising structure 1, structure 2, structure 3 and structure 4,

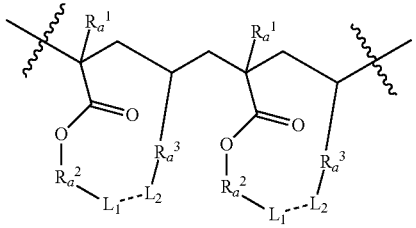

structure 1

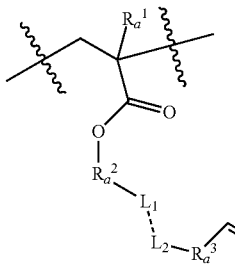

structure 2

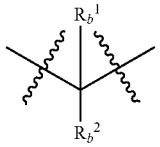

structure 3

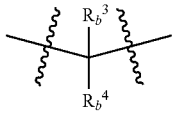

structure 4 wherein,
the number of structure 1 is m, m is selected from the group consisting of 0.5, 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5, and 20;
the number of structure 2 is p, p is an integer selected from 0 to 20;
the number of structure 3 is x, x is an integer selected from 1 to 15;
the number of structure 4 is y, y is an integer selected from 1 to 15;
$R_a^1$, $R_b^1$ and $R_b^3$ are each independently selected from the group consisting of H, C1-C6 alkyl, and halogenated C1-C6 alkyl;
each $R_a^2$ is independently selected from the group consisting of C1-C6 alkylene;

each $R_a^3$ is independently selected from the group consisting of C1-C6 alkylene;

each $R_b^2$ is independently selected from the group consisting of

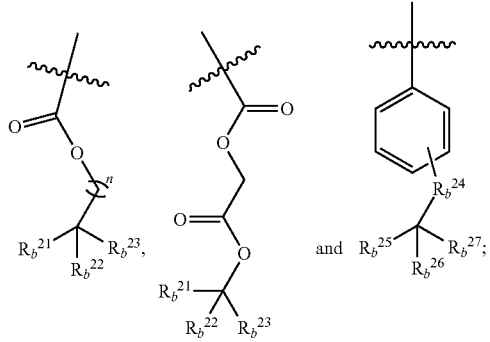

$R_b^{21}$, $R_b^{22}$, and $R_b^{23}$ are each independently selected from the group consisting of, H, C1-C6 alkyl, adamantyl, OH-substituted adamantyl, and C3-C8 cycloalkyl, or $R_b^{21}$, $R_b^{22}$ and $R_b^{23}$ together form a structure selected from the group consisting of

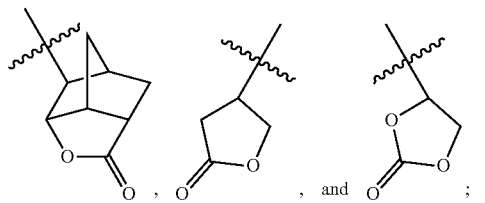

n is 0, 1, 2, 3, 4 or 5;

$R_b^{24}$ is selected from the group consisting of —O— and —(C=O)—;

$R_b^{25}$, $R_b^{26}$, and $R_b^{27}$ are each independently selected from the group consisting of, hydrogen, =O, C1-C6 alkyl, C1-C6 alkoxy, —(C=O)—O—C((C1-C6 alkyl)$_2$-adamantyl, —O—(C3-C8 cycloalkyl), —O—(C1-C6 alkylene)-(C6-C10 aryl), C6-C10 aryl, and —O—(C1-C6 alkylene)-O—(C=O)—(C6-C10 aryl);

$R_b^4$ is a combination of anions and cations, where the anion is selected from the group consisting of

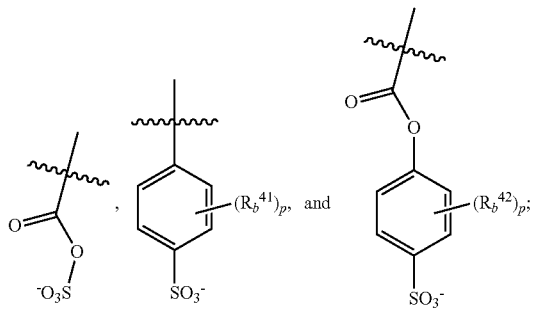

$R_b^{41}$ and $R_b^{42}$ are each independently selected from the group consisting of hydrogen, halogenated or unsubstituted $C_1$-$C_{15}$ straight-chain or branched-chain alkyl, substituted or unsubstituted $C_1$-$C_{15}$ straight-chain or branched-chain alkoxy; the substituted means being substituted by a substituent selected from the group consisting of halogen, hydroxyl, carbonyl, amino, amide, ether bonded oxygen atom, and lactone structure; p is an integer from 0 to 5;

the cation is selected from the group consisting of iodonium salts (B1) and sulfonium salts (B2) shown as follows:

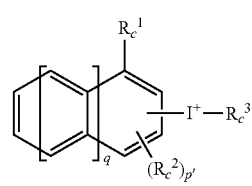

(B1)

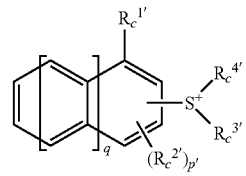

(B2)

in formulas (B1) and (B2), $R_c^1$, $R_c^2$, $R_c^3$, $R_c^{1'}$, $R_c^{2'}$, $R_c^{3'}$, and $R_c^{4'}$ are each independently represent substituents;

$R_c^1$ and $R_c^{1'}$ are selected from the group consisting of hydrogen, halogen, unsubstituted or hydroxyl or halogen substituted $C_1$-$C_{10}$ straight-chain or branched-chain alkyl, unsubstituted or hydroxyl or halogen substituted $C_1$-$C_{10}$ straight-chain or branched-chain alkoxy, unsubstituted or hydroxyl or halogen substituted $C_1$-$C_{10}$ straight-chain or branched-chain alkoxy carbonyl; the halogen is selected from the group consisting of fluorine, chlorine, bromine and iodine;

$R_c^2$ and $R_c^{2'}$ are selected from the group consisting of hydrogen, halogenated or unsubstituted $C_1$-$C_{15}$ straight-chain or branched-chain alkyl, substituted or unsubstituted $C_1$-$C_{15}$ straight-chain or branched-chain alkoxy; the substituted means being substituted by a substituent selected from the group consisting of halogen, hydroxyl, carbonyl, amino, amide, ether bonded oxygen atom, and lactone structure;

$R_c^3$, $R_c^{3'}$, and $R_c^{4'}$ are selected from the group consisting of substituted or unsubstituted $C_1$-$C_{11}$ straight-chain or branched-chain alkyl, substituted or unsubstituted phenyl, and substituted or unsubstituted naphthyl; the substituted means being substituted by a substituent selected from the group consisting of halogen, hydroxyl, carbonyl, amino, amide, and lactone structure; $R_c^{3'}$ and $R_c^{4'}$ are optionally combined to form a divalent group;

q is 0, 1, 2 or 3;

p' is 0, 1, 2, 3, 4 or 5;

each $L_1$—$L_2$ is independently selected from the group consisting of

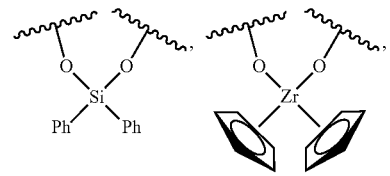

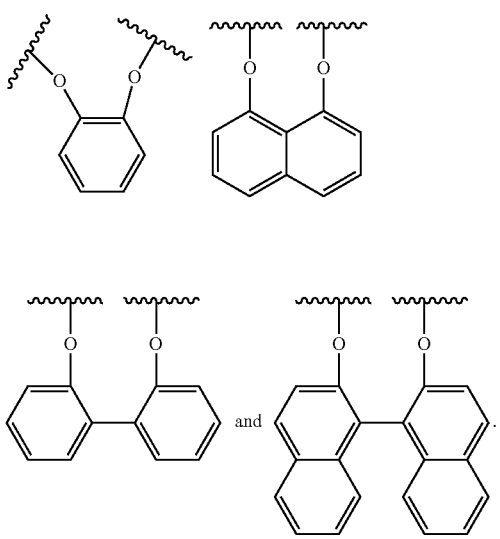

4. The photolithographic resin of claim 1, wherein, each $R_a^1$ is independently selected from the group consisting of H and C1-C3 alkyl;

each $R_a^2$ is independently selected from the group consisting of C1-C3 alkylene;

each $R_a^3$ is independently selected from the group consisting of —(C1-C3 alkylene)-;

each $L_1$—$L_2$ is independently selected from the group consisting of

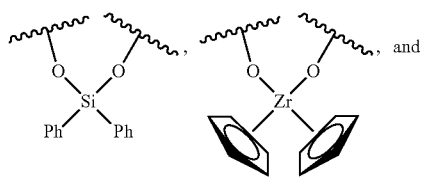

5. The photolithographic resin of claim 2, wherein, $R_a^1$ and $R_b^1$ are each independently selected from the group consisting of H and C1-C3 alkyl;

each $R_a^2$ is independently selected from the group consisting of C1-C3 alkylene;

each $R_a^3$ is independently selected from the group consisting of —(C1-C3 alkylene)-;

each $R_b^2$ is independently selected from the group consisting of

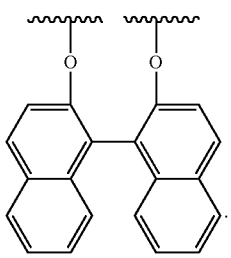

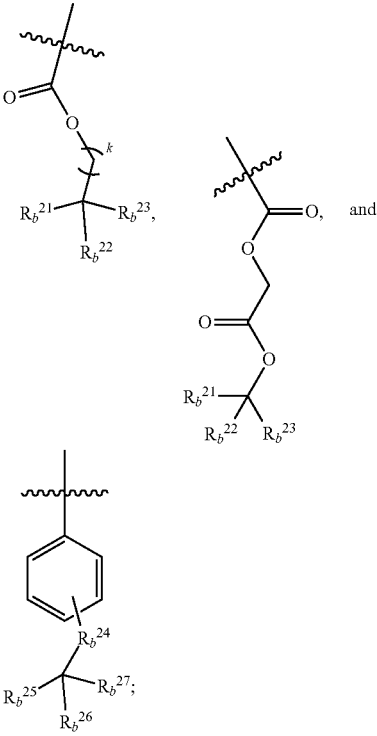

$R_b^{21}$, $R_b^{22}$, and $R_b^{23}$ are each independently selected from the group consisting of, H, C1-C3 alkyl, adamantyl, OH-substituted adamantyl, and C3-C6 cycloalkyl;

or $R_b^{21}$, $R_b^{22}$, and $R_b^{23}$ together form a structure selected from the group consisting of

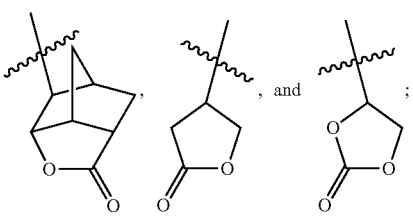

k is 0, 1 or 2;

$R_b^{24}$ is —O—;

$R_b^{25}$, $R_b^{26}$, and $R_b^{27}$ are each independently selected from the group consisting of, hydrogen, =O, C1-C4 alkyl, C1-C3 alkoxy, —(C=O)—O—C(C1-C3 alkyl)$_2$-adamantyl, —O—(C3-C6 cycloalkyl), —O—(C1-C3 alkylene)-phenyl, phenyl, and —O—(C1-C3 alkylene)-O—(C=O)-phenyl;

each $L_1$—$L_2$ is independently selected from the group consisting of

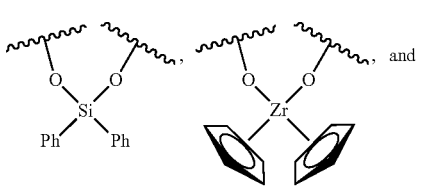

-continued

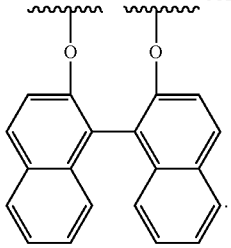

6. The photolithographic resin of claim 3, wherein, $R_a^1$, $R_b^1$ and $R_b^3$ are each independently selected from the group consisting of H and C1-C3 alkyl;

each $R_a^2$ is independently selected from the group consisting of C1-C3 alkylene;

each $R_a^3$ is independently selected from the group consisting of —(C1-C3 alkylene)-;

each $R_b^2$ is independently selected from the group consisting of

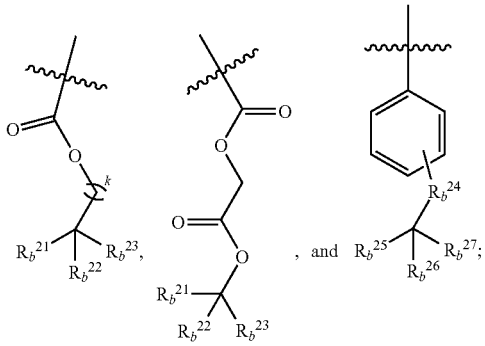

$R_b^{21}$, $R_b^{22}$, and $R_b^{23}$ are each independently selected from the group consisting of, H, C1-C3 alkyl, adamantyl, OH-substituted adamantyl, and C3-C6 cycloalkyl;

or $R_b^{21}$, $R_b^{22}$ and $R_b^{23}$ together form a structure selected from the group consisting of

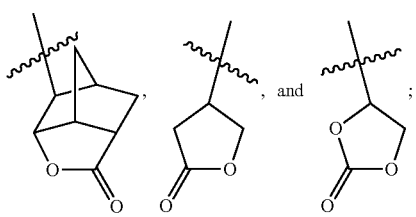

k is 0, 1 or 2;

$R_b^{24}$ is —O—;

$R_b^{25}$, $R_b^{26}$, and $R_b^{27}$ are each independently selected from the group consisting of, hydrogen, =O, C1-C4 alkyl, C1-C3 alkoxy, —(C=O)—O—C(C1-C3 alkyl)$_2$-adamantyl, —O—(C3-C6 cycloalkyl), —O—(C1-C3 alkylene)-phenyl, phenyl, and —O—(C1-C3 alkylene)-O—(C=O)-phenyl;

$R_b^4$ is a combination of anions and cations, wherein the anion is selected from the group consisting of

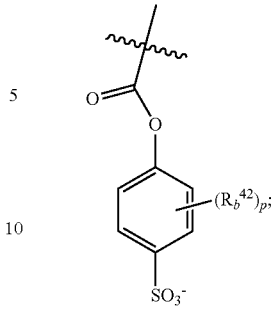

each $R_b^{42}$ is independently selected from the group consisting of hydrogen, halogenated or unsubstituted $C_1$-$C_{15}$ straight-chain or branched-chain alkyl, and substituted or unsubstituted $C_1$-$C_{15}$ straight-chain or branched-chain alkoxy; the substituted means being substituted by a substituent selected from the group consisting of halogen, hydroxyl, carbonyl, amino, amide, ether-bonded oxygen atom, and lactone structure; p is an integer from 0 to 5;

the cation is selected from the iodonium salt (B1) represented by the following formula:

(B1)

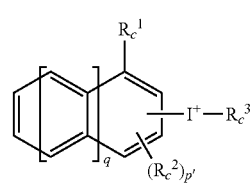

in formula (B1), $R_c^1$, $R_c^2$, and $R_c^3$ each independently represent a substituent;

$R_c^1$ is hydrogen;

$R_c^2$ is hydrogen;

$R_c^3$ is phenyl;

q is 0, 1, 2 or 3;

p' is 0, 1, 2, 3, 4 or 5;

each $L_1$—$L_2$ is independently selected from the group consisting of

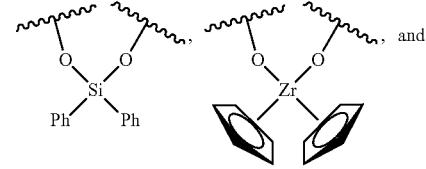

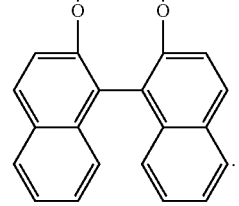

7. The photolithographic resin of claim 1, wherein $L_1$—$L_2$ is

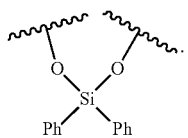 [SMILES: *O[Si](O*)(c1ccccc1)c1ccccc1]

8. The photolithographic resin of claim 2, wherein $L_1$—$L_2$ is

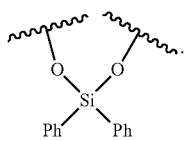 [SMILES: *O[Si](O*)(c1ccccc1)c1ccccc1]

9. The photolithographic resin of claim 3, wherein $L_1$—$L_2$ is

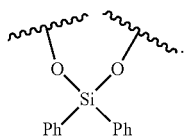

10. A chemically amplified photoresist comprising the photolithographic resin of claim 1, a photo-acid generator, a quencher, a surfactant, and a solvent.

11. A chemically amplified photoresist comprising the photolithographic resin of claim 2, a photo-acid generator, a quencher, a surfactant, and a solvent.

12. A chemically amplified photoresist comprising the photolithographic resin of claim 3, a quencher, a surfactant, and a solvent.

13. A preparation method of the chemically amplified photoresist of claim 10 comprising the following steps:
  1) adding the photolithographic resin, photo-acid generator, quencher and surfactant into the solvent;
  2) mixing and stirring at 15-60° C. for 6-72 h to obtain the chemically amplified photoresist.

14. An application method for the chemically amplified photoresist of claim 10 comprising the following steps:
  1) coating the chemically amplified photoresist on the substrate;
  2) baking the coated photoresist once to remove the solvent;
  3) exposing the photoresist after removing the solvent;
  4) baking the photoresist after being exposed again; and
  5) developing the photoresist after post-exposure baking with an alkaline developer to obtain a photolithographic film.

15. A crosslinkable negative photoresist, wherein the crosslinkable negative photoresist comprises the photolithographic resin of claim 1, a photoinitiator, a cross-linking agent, and a solvent.

16. A crosslinkable negative photoresist, wherein the crosslinkable negative photoresist comprises the photolithographic resin of claim 2, a photoinitiator, a cross-linking agent, and a solvent.

17. A method for preparing the crosslinkable negative photoresist of claim 15 comprising the following steps:
  1) adding the photolithographic resin, the photoinitiator and the cross-linking agent into the solvent; and
  2) mixing and stirring at 15-50° C. for 6-72 h to obtain the crosslinkable negative photoresist.

18. A method for preparing the crosslinkable negative photoresist of claim 16 comprising the following steps:
  1) adding the photolithographic resin, the photoinitiator and the cross-linking agent into the solvent; and
  2) mixing and stirring at 15-50° C. for 6-72 h to obtain the crosslinkable negative photoresist.

19. An application method for the crosslinkable negative photoresist of claim 15 comprising the following steps:
  1) coating the photoresist of claim 15 on the substrate;
  2) baking the coated photoresist once to remove the solvent;
  3) exposing the photoresist after removing the solvent; and
  4) developing the photoresist after exposing with an organic solvent to obtain a photolithographic pattern.

20. An application method for the crosslinkable negative photoresist of claim 16 comprising the following steps:
  1) coating the photoresist of claim 16 on the substrate;
  2) baking the coated photoresist once to remove the solvent;
  3) exposing the photoresist after removing the solvent; and
  4) developing the photoresist after exposing with an organic solvent to obtain a photolithographic pattern.

* * * * *